United States Patent
Kondo et al.

(10) Patent No.: US 8,786,002 B2
(45) Date of Patent: Jul. 22, 2014

(54) SEMICONDUCTOR DEVICE

(75) Inventors: Masao Kondo, Kanagawa (JP); Masatoshi Morikawa, Kanagawa (JP); Satoshi Goto, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 330 days.

(21) Appl. No.: 13/151,306

(22) Filed: Jun. 2, 2011

(65) Prior Publication Data

US 2011/0316062 A1 Dec. 29, 2011

(30) Foreign Application Priority Data

Jun. 29, 2010 (JP) ................. 2010-147714

(51) Int. Cl.
*H01L 27/108* (2006.01)
*H01L 29/94* (2006.01)

(52) U.S. Cl.
USPC ........... 257/312; 257/296; 257/E29.345; 327/390; 327/436; 333/103

(58) Field of Classification Search
USPC .......... 327/390, 436; 257/296, 601, E29.345; 333/103
See application file for complete search history.

(56) References Cited

U.S. PATENT DOCUMENTS

| | | | | |
|---|---|---|---|---|
| 6,094,068 A * | 7/2000 | Nomura et al. | ............ | 326/83 |
| 6,804,502 B2 * | 10/2004 | Burgener et al. | ............ | 455/333 |
| 8,536,636 B2 * | 9/2013 | Englekirk | ............ | 257/303 |
| 2001/0040479 A1 * | 11/2001 | Zhang | ............ | 327/427 |
| 2006/0103448 A1 * | 5/2006 | Nakatsuka et al. | ............ | 327/430 |
| 2006/0261912 A1 * | 11/2006 | Miyagi et al. | ............ | 333/103 |
| 2007/0222489 A1 * | 9/2007 | Kousai | ............ | 327/156 |
| 2009/0140300 A1 * | 6/2009 | Usami | ............ | 257/288 |
| 2009/0181630 A1 * | 7/2009 | Seshita et al. | ............ | 455/191.3 |

FOREIGN PATENT DOCUMENTS

JP 2009-194891 A 8/2009

OTHER PUBLICATIONS

Japanese Office Action received in Japanese Application No. 2010-147714 dated Feb. 4, 2014.

* cited by examiner

*Primary Examiner* — Cheung Lee
*Assistant Examiner* — Jeremy Joy
(74) *Attorney, Agent, or Firm* — Mattingly & Malur, PC

(57) ABSTRACT

In terms of achieving a reduction in the cost of an antenna switch, there is provided a technology capable of minimizing harmonic distortion generated in the antenna switch even when the antenna switch is particularly formed of field effect transistors formed over a silicon substrate. Between the source region and the drain region of each of a plurality of MISFETs coupled in series, a distortion compensating capacitance circuit is coupled which has a voltage dependency such that, in either of the cases where a positive voltage is applied to the drain region based on the potential of the source region and where a negative voltage is applied to the drain region based on the potential of the source region, the capacitance decreases to a value smaller than that in a state where the potential of the source region and the potential of the drain region are at the same level.

2 Claims, 27 Drawing Sheets

CAPC2 : DISTORTION COMPENSATING CAPACITANCE CIRCUIT
$Q_{N1} - Q_{N5}$ : MISFET

SEMICONDUCTOR DEVICE

CROSS-REFERENCE TO RELATED APPLICATIONS

The disclosure of Japanese Patent Application No. 2010-147714 filed on Jun. 29, 2010 including the specification, drawings and abstract is incorporated herein by reference in its entirety.

BACKGROUND

The present invention relates to a semiconductor device, and particularly to a technology which is effective when applied to a semiconductor device including an antenna switch mounted in, e.g., wireless communication equipment.

In Japanese Unexamined Patent Publication No. 2009-194891 (Patent Document 1), it is described that the voltage dependency of a parasitic capacitance, which is the cause of a third harmonic wave generated from an antenna switch, is compensated for by incorporating a capacitance circuit having an opposite voltage dependency in the antenna switch to reduce third harmonic distortion.

RELATED ART DOCUMENT

Patent Document

Patent Document 1

Japanese Unexamined Patent Publication No. 2009-194891

SUMMARY

To recent mobile phones, not only a verbal communication function, but also various application functions have been added. That is, functions other than the verbal communication function, such as viewing and listening of delivered music, moving image transmission, and data transfer each using a mobile phone, have been added to mobile phones. With such multi-functionalization of mobile phones, a large number of frequency bands (such as a GSM (Global System for Mobile communications) band and a PCS (Personal Communication Services) band) and modulation methods (such as GSM, EDGE (Enhanced Data rates for GSM Evolution), and WCDMA (Wideband Code Division Multiplex Access)) are assumedly present in individual countries around the world. Accordingly, a mobile phone needs to be compatible with transmission/reception signals compatible with a plurality of different frequency bands and different modulation methods. Therefore, in a mobile phone, it has been performed to share one antenna for transmitting and receiving the transmission/reception signals, and switch coupling to the antenna using an antenna switch.

For example, in a mobile phone, it is common that the power of a transmission signal increases to exceed, e.g., 1 W, and an antenna switch is required to have performance which ensures a high quality of the high-power transmission signal, and reduces the occurrence of an interfering wave (higher-order harmonic wave) that adversely affects communication in another frequency band. Therefore, when a field effect transistor is used as a switching element which forms the antenna switch, the field effect transistor is required to have not only high breakdown voltage performance but also such performance capable of reducing higher-order harmonic distortion.

For this reason, as the field effect transistor forming the antenna switch, to implement a low loss and low harmonic distortion, a field effect transistor formed over a GaAs substrate or sapphire substrate having a small parasitic capacitance and excellent linearity (e.g., HEMT (High Electron Mobility Transistor)) has been used. However, a compound semiconductor substrate having an excellent RF characteristic is costly, and is not desirable in terms of a reduction in the cost of the antenna switch. To achieve a reduction in the cost of the antenna switch, it is effective to use a field effect transistor formed over a low-cost silicon substrate (SOI (Silicon On Insulator) substrate). However, the low-cost silicon substrate has the problems of the parasitic capacitance higher than that of a high-cost compound semiconductor substrate and the harmonic distortion larger than that of a field effect transistor formed over the compound semiconductor substrate.

An object of the present invention, in terms of achieving a reduction in the cost of an antenna switch, is to provide a technology capable of minimizing harmonic distortion generated in the antenna switch even when the antenna switch is particularly formed of field effect transistors formed over a silicon substrate.

The above and other objects and novel features of the present invention will become apparent from a statement in the present specification and the accompanying drawings.

The following is a brief description of the outline of a representative aspect of the invention disclosed in the present application.

A semiconductor device in a representative embodiment includes: an antenna switch having a transmission terminal, an antenna terminal, and a reception terminal. The foregoing antenna switch has: (a) a plurality of first field effect transistors coupled in series between the foregoing transmission terminal and the foregoing antenna terminal; and (b) a plurality of second field effect transistors coupled in series between the foregoing reception terminal and the foregoing antenna terminal. Here, between a source region and a drain region of each of the foregoing second field effect transistors coupled in series, a capacitance circuit is coupled which has a voltage dependency such that, in either of cases where a positive voltage is applied to the foregoing drain region based on a potential of the foregoing source region and where a negative voltage is applied to the foregoing drain region based on the potential of the foregoing source region, a capacitance decreases to a value smaller than that in a state where the potential of the foregoing source region and a potential of the foregoing drain region are at the same level.

A semiconductor device in another representative embodiment includes: an antenna switch having a transmission terminal, an antenna terminal, and a reception terminal. The foregoing antenna switch has: (a) a plurality of first field effect transistors coupled in series between the foregoing transmission terminal and the foregoing antenna terminal; and (b) a plurality of second field effect transistors coupled in series between the foregoing reception terminal and the foregoing antenna terminal. Here, between a first coupling terminal and a second coupling terminal which are between the foregoing second field effect transistors, a capacitance circuit is coupled which has a voltage dependency such that, in either of cases where a positive voltage is applied to the foregoing second coupling terminal based on a potential of the foregoing first coupling terminal and where a negative voltage is applied to the foregoing second coupling terminal based on the potential of the foregoing first coupling terminal, a capacitance decreases to a value smaller than that in a state where the potential of the foregoing first coupling terminal and a potential of the foregoing second coupling terminal are at the same level.

The following is a brief description of effects achievable by the representative aspect of the invention disclosed in the present application.

In terms of achieving a reduction in the cost of an antenna switch, even when the antenna switch is particularly formed of field effect transistors formed over a silicon substrate, harmonic distortion generated in the antenna switch can be minimized.

DETAILED DESCRIPTION

Figure 1:
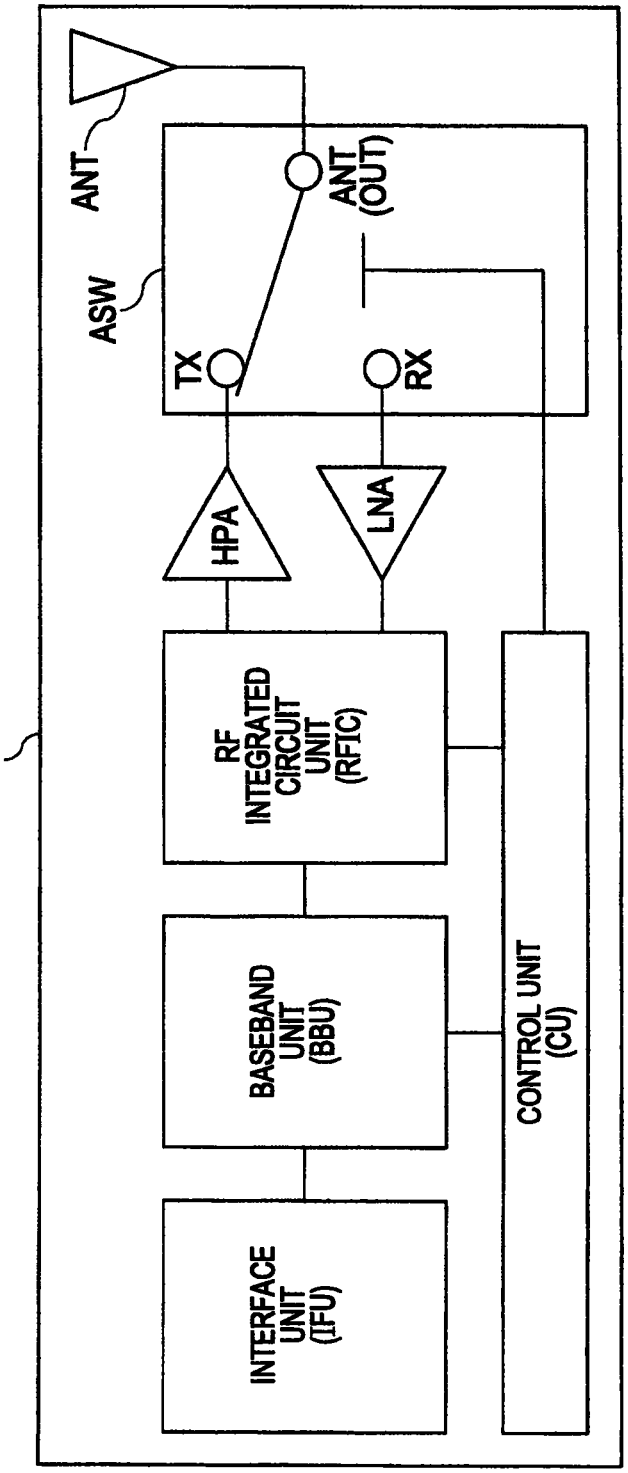
FIG. 1 is a block diagram showing a structure of the transmission/reception unit of a mobile phone in a first embodiment of the present invention.

In each of the following embodiments, if necessary for the sake of convenience, the embodiment will be described by being divided into a plurality of sections or embodiments. However, they are by no means irrelevant to each other unless particularly explicitly described otherwise, and one of the sections or embodiments is variations, details, supplementary explanation, and so forth of part or the whole of the others.

When the number and the like (including the number, numerical value, amount, range, and the like thereof) of elements are referred to in the following embodiments, they are not limited to specific numbers unless particularly explicitly described otherwise or unless they are obviously limited to specific numbers in principle. The number and the like of the elements may be not less than or not more than specific numbers.

It will be appreciated that, in the following embodiments, the components thereof (including also elements, steps, and the like) are not necessarily indispensable unless particularly explicitly described otherwise or unless the components are considered to be obviously indispensable in principle.

Likewise, if the shapes, positional relationships, and the like of the components and the like are referred to in the following embodiments, the shapes and the like are assumed to include those substantially proximate or similar thereto unless particularly explicitly described otherwise or unless it can be considered that they obviously do not in principle. The same shall apply in regard to the foregoing numerical value and range.

Throughout all the drawings for illustrating the embodiments, the same components are designated by the same reference numerals in principle, and a description thereof is omitted. Note that, for clarity of illustration, even a plan view may be hatched.

First Embodiment

Structure and Operation of Mobile Phone

FIG. 1 is a block diagram showing a structure of the transmission/reception unit of a mobile phone. As shown in FIG. 1, a mobile phone 1 has a control unit CU, an interface unit IFU, a baseband unit BBU, an RF integrated circuit unit RFIC, a power amplifier HPA, a low noise amplifier LNA, an antenna switch ASW, and an antenna ANT.

The interface unit IFU has the function of processing an audio signal from a user (caller). That is, the interface unit IFU has the function of providing an interface between the user and the mobile phone. The baseband unit BBU has a CPU as a central control unit embedded therein, and is configured to be capable of, during transmission, digital processing of the audio signal (analog signal) from the user (caller) via an operation unit to generate a baseband signal. The baseband unit BBU is also configured to be capable of, during reception, generation of the audio signal from the baseband signal which is a digital signal. The control unit CU is coupled to the baseband unit BBU, and has the function of controlling signal processing of the baseband signal in the baseband unit BBU.

The RF integrated circuit unit RFIC is configured to be capable of, during transmission, modulation of the baseband signal to generate an RF frequency signal and capable of, during reception, demodulation of a reception signal to generate the baseband signal. At this time, the control unit CU is coupled also to the RF integrated circuit unit RFIC, and has the function of controlling the modulation of the transmission signal and the demodulation of the reception signal in the RF integrated circuit unit RFIC.

The power amplifier HPA is a circuit for newly generating a high-power signal analogous to a weak input signal with power supplied from a power source to output the high-power signal. On the other hand, the low noise amplifier LNA is configured to amplify the reception signal without amplifying noise included in the reception signal.

The antenna switch ASW is for separating the reception signal inputted to the mobile phone 1 from the transmission signal outputted from the mobile phone 1. The antenna ANT is for transmitting/receiving an electric wave. The antenna switch ASW has, e.g., a transmission terminal TX, a reception terminal RX, and an antenna terminal ANT(OUT). The transmission terminal TX is coupled to the power amplifier HPA, while the reception terminal RX is coupled to the low noise amplifier LNA. On the other hand, the antenna terminal ANT (OUT) is electrically coupled to the antenna ANT. The antenna switch ASW is coupled to the control unit CU, and a switch switching operation in the antennal switch ASW is controlled by the control unit CU.

The mobile phone 1 is structured as described above, and an operation thereof will be briefly described hereinbelow. First, a description will be given to the case where a signal is transmitted. When a signal such as an audio signal is inputted to the baseband unit BBU via the interface unit IFU, the baseband unit BBU performs digital processing of the analog signal such as the audio signal. The baseband signal generated thereby is inputted to the RF integrated circuit unit RFIC. In the RF integrated circuit unit RFIC, the inputted baseband signal is converted to a radio frequency (RF) signal using a modulation signal source and a mixer. The signal converted to the RF frequency signal is outputted from the RF integrated circuit unit RFIC to the power amplifier (RF module) HPA. The RF frequency signal inputted to the power amplifier HPA is amplified by the power amplifier HPA, and then transmitted from the antenna ANT via the antenna switch ASW. Specifically, in the antenna switch ASW, the switch switching operation is performed so as to electrically couple the transmission terminal TX electrically coupled to the power amplifier HPA to the antenna ANT. As a result, the RF frequency signal amplified by the power amplifier HPA is transmitted from the antenna ANT via the antenna switch ASW.

Next, a description will be given to the case where the signal is received. The RF frequency signal (reception signal) received by the antenna ANT is inputted to the low noise amplifier LNA via the antenna switch ASW. Specifically, in the antenna switch ASW, the switch switching operation is performed so as to electrically couple the antenna ANT to the reception terminal RX. As a result, the reception signal received by the antenna ANT is transmitted to the reception terminal RX of the antenna switch ASW. The reception terminal RX of the antenna switch ASW is coupled to the low noise amplifier LNA so that the reception signal is inputted from the reception terminal RX of the antenna switch ASW to the low noise amplifier LNA. Then, the reception signal is amplified by the low noise amplifier LNA, and subsequently inputted to the RF integrated circuit unit RFIC. In the RF integrated circuit unit RFIC, using the modulation signal source and the mixer, frequency conversion is performed. Then, the signal subjected to the frequency conversion is detected, and the baseband signal is extracted. Thereafter, the baseband signal is outputted from the RF integrated circuit unit RFIC to the baseband unit BBU. The baseband signal is processed in the baseband unit BBU, and the audio signal is outputted from the mobile phone 1 via the interface unit IFU. The foregoing is the simple structure of the mobile phone 1 which transmits/receives a single band signal and the operation thereof.

(Circuit Configuration of Antenna Switch)

Figure 2:
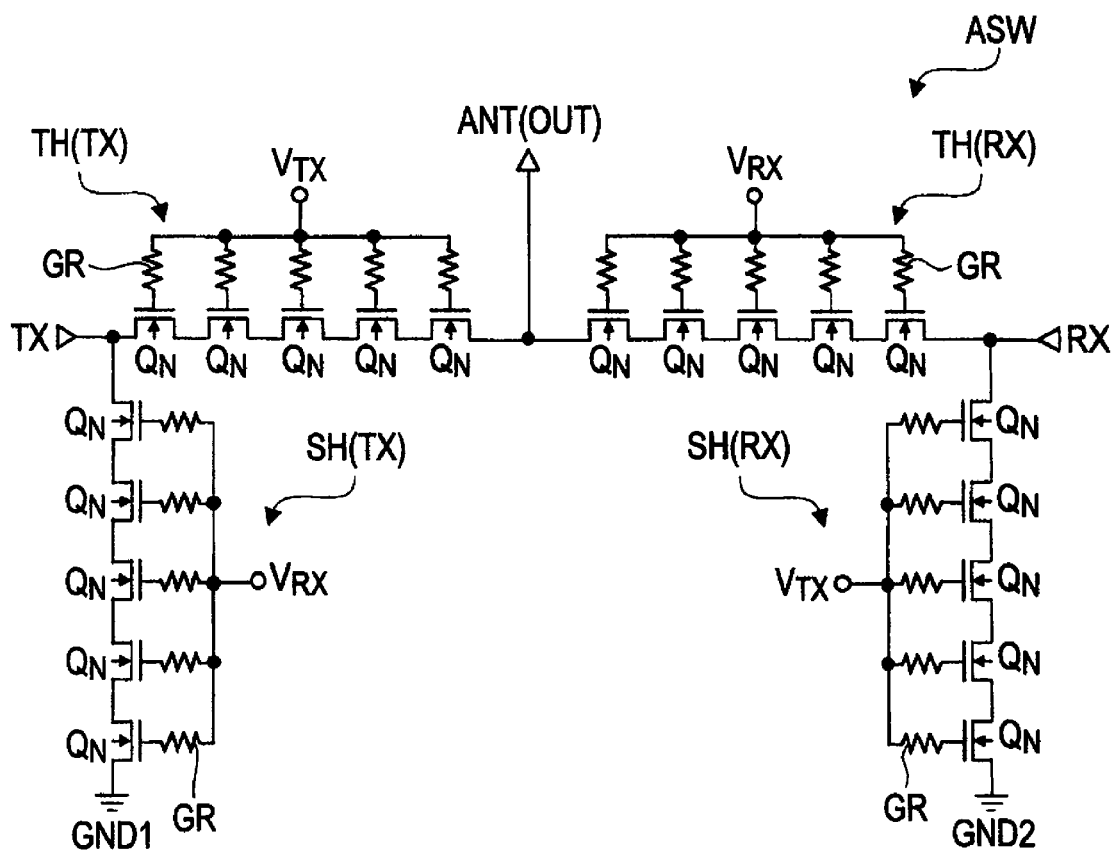
FIG. 2 is a view showing a circuit configuration of an antenna switch.

Next, a description will be given to a circuit configuration of the antenna switch ASW. FIG. 2 is a view showing the circuit configuration of the antenna switch ASW. As shown in FIG. 2, the antenna switch ASW has the transmission terminal TX, the reception terminal RX, and the antenna terminal ANT(OUT). The antennal switch ASW also has a TX through transistor TH(TX) between the transmission terminal TX and the antenna terminal ANT(OUT), and has a RX through transistor TH(RX) between the reception terminal RX and the antenna terminal ANT(OUT). The antenna switch ASW further has a TX shunt transistor SH(TX) between the transmission terminal TX and a GND terminal GND1, and has a RX shunt transistor SH(RX) between the reception terminal RX and a GND terminal GND2.

The TX through transistor TH(TX) provided between the transmission terminal TX and the antenna terminal ANT (OUT) includes, e.g., five series-coupled MISFETs (Metal Insulator semiconductor Field Effect Transistors) $Q_N$. At this time, each of the MISFETs $Q_N$ has a source region, a drain region, and a gate electrode. In the present specification, the source region and the drain region of the MISFET $Q_N$ are symmetrical but, in each of the MISFETs $Q_N$ included in the TX through transistor TH(TX), the region closer to the transmission terminal TX is defined as the drain region, and the region closer to the antenna terminal ANT(OUT) is defined as the source region. The gate electrodes of the MISFETs $Q_N$ are coupled to a control terminal $V_{TX}$ via gate resistances GR. Each of the gate resistances GR is an isolation resistance for preventing an RF signal from leaking into the control terminal $V_{TX}$. In other words, the gate resistance GR has the function of attenuating the RF signal. In the TX through transistor TH(TX) thus configured, by controlling the voltage applied to the control terminal $V_{TX}$, the ON/OFF operation of each of the series-coupled MISFETs $Q_N$ is controlled to electrically couple or cut off the transmission terminal TX to or from the antenna terminal ANT(OUT). That is, the TX through transistor TH(TX) functions as a switch for switching electrical coupling/non-coupling between the transmission terminal TX and the antenna terminal ANT(OUT).

The RX through transistor TH(RX) provided between the reception terminal RX and the antenna terminal ANT(OUT) also includes, e.g., five series-coupled MISFETs $Q_N$, similarly to the TX through transistor TH(TX). At this time, each of the MISFETs ON has a source region, a drain region, and a gate electrode. In the present specification, the source region and the drain region of the MISFET $Q_N$ are symmetrical but, in each of the MISFETs $Q_N$ included in the RX through transistor TH(RX), the region closer to the antenna terminal ANT(OUT) is defined as the drain region, and the region closer to the reception terminal RX is defined as the source region. The gate electrodes of the MISFETs $Q_N$ are coupled to a control terminal $V_{RX}$ via gate resistances GR. Each of the gate resistances GR is an isolation resistance for preventing an RF signal from leaking into the control terminal $V_{RX}$. In other words, the gate resistance GR has the function of attenuating the RF signal. In the RX through transistor TH(RX) thus configured, by controlling the voltage applied to the control terminal $V_{RX}$, the ON/OFF operation of each of the series-coupled MISFETs $Q_N$ is controlled to electrically couple or cut off the reception terminal RX to or from the antenna terminal ANT(OUT). That is, the RX through transistor TH(RX) functions as a switch for switching electrical coupling/non-coupling between the reception terminal RX and the antenna terminal ANT(OUT).

The TX shunt transistor SH(TX) provided between the transmission terminal TX and the GND terminal GND1 includes, e.g., five series-coupled MISFETs $Q_N$. In this case, each of the MISFETs $Q_N$ has a source region, a drain region, and a gate electrode. In the present specification, the source region and the drain region of the MISFET $Q_N$ are symmetrical but, in each of the MISFETs $Q_N$ included in the TX shunt transistor SH(TX), the region closer to the transmission terminal TX is defined as the drain region, and the region closer to the GND terminal GND1 is defined as the source region. The gate electrodes of the MISFETs $Q_N$ are coupled to the control terminal $V_{RX}$ via gate resistances GR. Each of the gate resistances GR is an isolation resistance for preventing an RF signal from leaking into the control terminal $V_{RX}$. In other words, the gate resistance GR has the function of attenuating the RF signal.

Here, the TX through transistor TH(TX) described above functions as a switch for switching the coupling/non-coupling of a transmission path for transmitting a transmission signal between the transmission terminal TX and the antenna terminal ANT(OUT), and is therefore a component required as the antenna switch ASW. On the other hand, the TX shunt transistor SH(TX) switches the coupling/non-coupling between the transmission terminal TX and the GND terminal GND1 so that a path between the transmission terminal TX and the GND terminal GND1 does not directly transmit the transmission signal. Therefore, whether or not the TX shunt transistor SH(TX) needs to be provided is a question. However, the TX shunt transistor SH(TX) has an important function when the reception signal is received by the antenna.

Hereinbelow, a description will be given to the function of the TX shunt transistor SH(TX). When the reception signal is received from the antenna, the antenna switch ASW turns on the RF through transistor TH(RX) to electrically couple the antenna terminal ANT(OUT) to the reception terminal RX. As a result, the reception signal received by the antenna is transmitted from the antenna terminal ANT(OUT) to a reception circuit via the reception terminal RX. At this time, it is necessary to prevent the reception signal from being transmitted toward the transmission path, and therefore the TX through transistor TH(TX) provided between the antenna terminal ANT(OUT) and the transmission terminal TX is turned off. As a result, the reception signal inputted from the antenna to the antennal terminal ANT(OUT) is not transmitted to the transmission terminal TX. By turning off the TX through transistor TH(TX), the transmission path between the antenna terminal ANT(OUT) and the transmission terminal TX is electrically cut off. Therefore, it can be considered that, ideally, there is no leakage of the reception signal into the transmission path. However, it can be considered that, since the TX through transistor TH(TX) is turned OFF, in an actual situation, an OFF capacitance has been electrically generated between the source region and the drain region of each of the MISFETs $Q_N$ included in the TX through transistor TH(TX). As a result, the reception signal which is an RF signal leaks toward the transmission terminal TX via the OFF capacitance. Since the power of the reception signal is low, it is desirable to efficiently transmit the reception signal from the antenna terminal ANT(OUT) toward the reception terminal RX. That is, it is needed to suppress the leakage of the reception signal toward the transmission terminal TX via the OFF capacitance of the TX through transistor TH(TX). In particular, the gate width of each of the MISFETs $Q_N$ included in the TX through transistor TH(TX) is increased in terms of reducing the ON resistance. It may also be said, in other words, that the increased gate width of the MISFET $Q_N$ results in an increase in OFF capacitance. In the current case, in the TX through transistor TH(TX), the five MISFETs $Q_N$ are coupled in series so that the combined capacitance of the TX through transistor TH(TX) is smaller than the OFF capacitance of one of the MISFETs ON but, nevertheless, the OFF capacitance of the TX through transistor TH(TX) unignorably increases. The increased OFF capacitance of the TX through transistor TH(TX) means that the reception signal which is the RF signal is accordingly more likely to leak. Therefore, with only a configuration in which the TX through transistor TH(TX) is provided between the transmission terminal TX and the antenna terminal ANT(OUT), the leakage of the reception signal cannot be sufficiently suppressed.

For the reason given above, the TX shunt transistor SH(TX) is provided between the transmission terminal TX and the GND terminal GND1. That is, even in the state where the TX through transistor TH(TX) is off, the reception signal leaks toward the transmission terminal TX but, if the reception signal leaked to the transmission terminal TX is allowed to be sufficiently reflected by the transmission terminal TX, the reception signal leaking toward the transmission terminal TX can be suppressed. That is, the TX shunt transistor SH(TX) provided between the transmission terminal TX and the GND terminal GND1 is provided for the purpose of allowing sufficient reflection of the reception signal by the transmission terminal TX.

Sufficient reflection of the reception signal which is the RF signal by the transmission terminal TX can be realized by grounding the transmission terminal TX to GND. In other words, if it is possible to provide a minimal low impedance state between the transmission terminal TX and the GND terminal GND1, it is possible to allow sufficient reflection of the reception signal by the transmission terminal TX. Therefore, during reception, at the transmission terminal TX, the TX through transistor TH(TX) is turned off and the TX shunt transistor SH(TX) is turned on to electrically couple the transmission terminal TX to the GND terminal GND1. As a result, even when the reception signal leaks toward the transmission terminal TX, it is possible to allow sufficient reflection of the reception signal by the transmission terminal TX, and therefore suppress the reception signal leaking toward the transmission terminal TX.

The TX shunt transistor SH(TX) includes, e.g., the five MISFETs $Q_N$. Here, the reason for coupling the plurality of MISFETs $Q_N$ in series is that, since the high-power transmission signal flows to the transmission terminal TX during transmission, a large voltage amplitude is applied between the transmission terminal TX and the GND terminal GND1. That is, by coupling the plurality of MISFETs $Q_N$ in series, even when the large voltage amplitude is applied between the transmission terminal TX and the GND terminal GND1, the voltage amplitude applied to each of the MISFETs $Q_N$ can be adjusted to be not more than the breakdown voltage.

The RX shunt transistor SH(RX) provided between the reception terminal RX and the GND terminal GND2 also includes, e.g., five MISFETs $Q_N$. In this case, each of the MISFETs $Q_N$ has a source region, a drain region, and a gate electrode. In the present specification, the source region and the drain region of the MISFET $Q_N$ are symmetrical but, in each of the MISFETs $Q_N$ included in the RX shunt transistor SH(RX), the region closer to the reception terminal RX is defined as the drain region, and the region closer to the GND terminal GND2 is defined as the source region. The gate electrodes of the MISFETs $Q_N$ are coupled to the control terminal $V_{TX}$ via gate resistances GR. Each of the gate resistances GR is an isolation resistance for preventing an RF signal from leaking into the control terminal $V_{TX}$. In other words, the gate resistance GR has the function of attenuating the RF signal.

Here, even in the state where the RX through transistor TH(RX) is off during transmission, since there is the OFF capacitance in the RX through transistor TH(RX), the transmission signal leaks toward the reception terminal RX. However, if the transmission signal leaked to the reception terminal RX is allowed to be sufficiently reflected by the reception terminal RX, the transmission signal leaking toward the reception terminal RX can be suppressed. That is, the RX shunt transistor SH(RX) provided between the reception terminal RX and the GND terminal GND2 is provided for the purpose of allowing sufficient reflection of the transmission signal by the reception terminal RX.

Sufficient reflection of the transmission signal which is an RF signal by the reception terminal RX can be realized by grounding the reception terminal RX to GND. In other words, if it is possible to provide a minimal low impedance state between the reception terminal RX and the GND terminal GND2, it is possible to allow sufficient reflection of the transmission signal by the reception terminal RX. Therefore, during transmission, at the reception terminal RX, the RX through transistor TH(RX) is turned off and the RX shunt transistor SH(RX) is turned on to electrically couple the reception terminal RX to the GND terminal GND2. As a result, even when the transmission signal leaks toward the reception terminal RX, it is possible to allow sufficient reflection of the transmission signal by the reception terminal RX, and therefore suppress the transmission signal leaking toward the reception terminal RX.

The antenna switch ASW is configured as described above, and operations thereof will be described hereinbelow. First, a description will be given to the operation during transmission. In FIG. 2, during transmission, the TX through transistor TH(TX) and the RX shunt transistor SH(RX) are turned on, and the TX shunt transistor SH(TX) and the RX through transistor TH(RX) are turned off. This electrically couples the transmission terminal TX to the antenna terminal ANT(OUT), and electrically cuts off the reception terminal RX from the antenna terminal ANT(OUT). As a result, from the transmission terminal TX to the antenna terminal ANT(OUT), the transmission signal is outputted. At this time, the RF through transistor TH(RX) is off but, since there is the OFF capacitance, a part of the transmission signal which is the RF signal leaks out toward the reception terminal RX via the OFF capacitance of the RF through transistor TH(RX). However, since the RX shunt transistor SH(RX) is on, the reception terminal RX is electrically coupled to the GND terminal GND2 so that a low impedance state is provided between the reception terminal RX and the GND terminal GND2. Therefore, the transmission signal leaked out to the reception terminal RX is sufficiently reflected by the reception terminal RX. As a result, the transmission signal leaking to the reception terminal RX is suppressed, and efficiently transmitted from the transmission terminal TX to the antenna terminal ANT(OUT). In this manner, the transmission signal is outputted from the antenna terminal ANT(OUT).

Next, a description will be given to the operation during reception. In FIG. 2, during reception, the RX through transistor TH(RX) and the TX shunt transistor SH(TX) are turned on, and the RX shunt transistor SH(RX) and the TX through transistor (RX) are turned off. This electrically couples the reception terminal RX to the antenna terminal ANT(OUT), and electrically cuts off the transmission terminal TX from the antenna terminal ANT(OUT). As a result, the reception signal is transmitted from the antenna terminal ANT(OUT) toward the reception terminal RX. At this time, the TX through transistor TH(TX) is off but, since there is the OFF capacitance, a part of the reception signal which is the RF signal leaks out toward the transmission terminal TX via the OFF capacitance of the TX through transistor TH(TX). However, since the TX shunt transistor SH(TX) is on, the transmission terminal TX is electrically coupled to the GND terminal GND1 so that a low impedance state is provided between the transmission terminal TX and the GND terminal GND1. Therefore, the reception signal leaked out to the transmission terminal TX is sufficiently reflected by the transmission terminal TX. As a result, the reception signal leaking to the transmission terminal TX is suppressed, and efficiently transmitted from the antenna terminal ANT(OUT) toward the reception terminal RX. In this manner, the reception signal is transmitted from the antenna terminal ANT(OUT) toward the reception terminal RX.

(Structure of Each of Misfets Included in Antenna Switch)

Figure 3:
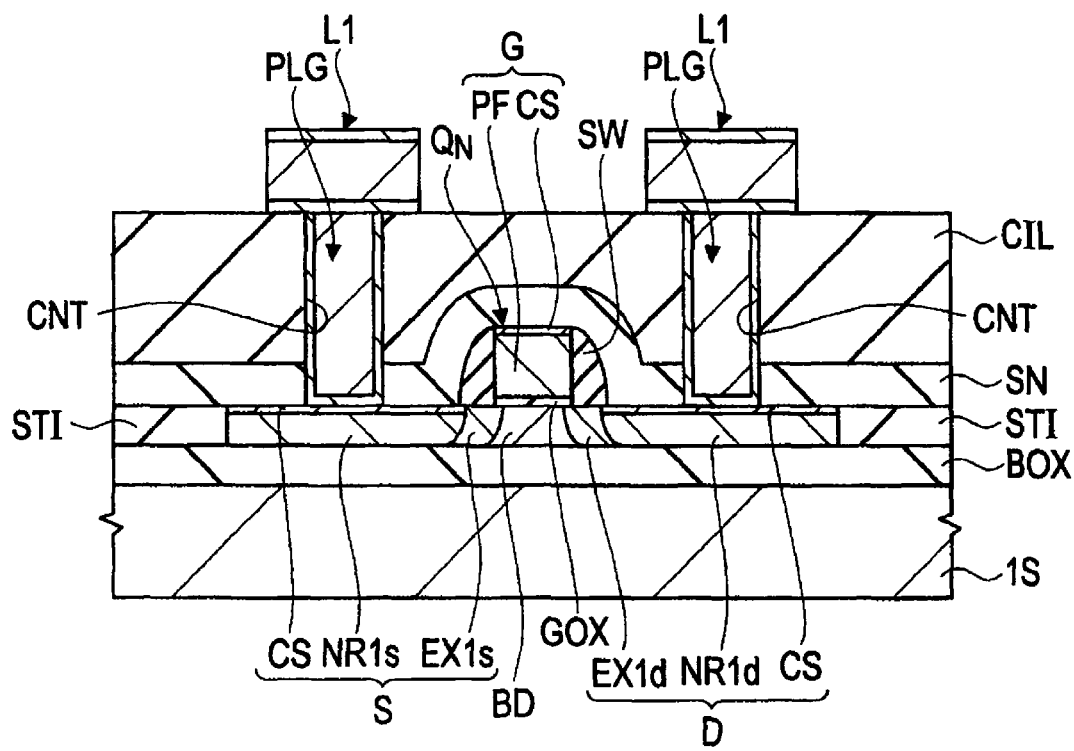
FIG. 3 is a cross-sectional view showing a cross section of a MISFET forming the antenna switch.

Subsequently, a description will be given to a cross-sectional structure of each of the MISFETs $Q_N$ included in the antenna switch ASW. FIG. 3 is a cross-sectional view showing a cross section of the MISFET CW. In FIG. 3, over a semiconductor device (support substrate) 1S, a buried insulating layer BOX is formed. Over the buried insulating layer BOX, a silicon layer is formed. The semiconductor substrate 1S, the buried insulating layer BOX, and the silicon layer form a SOI substrate. Over the SOI substrate, the MISFET $Q_N$ is formed. In the silicon layer of the SOI substrate, a body region BD functioning as a channel region is formed. The body region BD is formed of, e.g., a p-type semiconductor region into which boron as a p-type impurity has been introduced. Over the body region BD, a gate insulating film GOX is formed. Over the gate insulating film GOX, a gate electrode G is formed. The gate insulating film GOX is formed of, e.g., a silicon oxide film. On the other hand, the gate electrode G is formed of a laminate film of a polysilicon film PF and a cobalt silicide film CS. The cobalt silicide film CS forming a part of the gate electrode G is formed so as to reduce the resistance of the gate electrode G. Note that, instead of the cobalt silicide film CS, there may also be used a silicide film such as a nickel silicide film, a platinum silicide film, a nickel platinum silicide film, or a titanium silicide film.

Additionally, sidewalls SW are formed over the both side walls of the gate electrode G. In the silicon layer underlying the sidewalls SW, low-concentration impurity diffusion regions EX1s and EX1d are formed. The low-concentration impurity diffusion regions EX1s and EX1d are formed in alignment with respect to the gate electrode G. Outside the low-concentration impurity diffusion region EX1s, a high-concentration impurity diffusion region NR1s is formed. Outside the low-concentration impurity diffusion region EX1d, a high-concentration impurity diffusion region NR1d is formed. The high-concentration impurity diffusion regions NR1s and NR1d are formed in alignment with respect to the sidewalls SW. Furthermore, in the surfaces of the high-concentration impurity diffusion regions NR1s and NR1d, cobalt silicide films CS are formed. The low-concentration impurity diffusion region EX1s, the high-concentration impurity diffusion region NR1s, and the cobalt silicide film CS form a source region S. The low-concentration impurity diffusion region EX1d, the high-concentration impurity diffusion region NR1d, and the cobalt silicide film CS form a drain region D.

Each of the low-concentration impurity diffusion regions EX1s and EX1d and the high-concentration impurity diffusion regions NR1s and NR1d is a semiconductor region into which an n-type impurity such as, e.g., phosphorus or arsenic has been introduced. The concentration of the impurity introduced in each of the low-concentration impurity diffusion regions EX1s and EX1d is lower than the concentration of the impurity introduced in each of the high-concentration impurity diffusion regions NR1s and NR1d.

The MISFET $Q_N$ in the present first embodiment is structured as described above. Hereinbelow, a description will be given to a wiring structure formed over the MISFET $Q_N$. In FIG. 3, a silicon nitride film SN is formed so as to cover the MISFET $Q_N$ in the present first embodiment. Over the silicon nitride film SN, a contact interlayer insulating film CIL is formed. The contact interlayer insulating film CIL is formed of, e.g., a silicon oxide film. In the contact interlayer insulating film CIL and the silicon nitride film SN, a contact hole CNT reaching the source region S and a contact hole CNT reaching the drain region D are formed. In the contact holes CNT, titanium/titanium nitride films and tungsten films are buried to form plugs PLG. Over the contact interlayer insulating film CIL formed with the plugs PLG, wiring lines L1 are formed. For example, each of the wiring lines L1 is formed of a laminate film of a titanium/titanium nitride film, an aluminum film, and a titanium/titanium nitride film. Further, over the wiring lines L1, multilayer wiring is formed, but omitted in FIG. 3. In this manner, each of the MISFETs $Q_N$ included in the antenna switch ASW is formed.

(Advantage and Disadvantage of Each of MISFETs Formed over SOI Substrate)

For example, in the mobile phone 1 shown in FIG. 1, it is common that the power of a transmission signal increases to exceed, e.g., 1 W, and the antenna switch ASW is required to have performance which ensures a high quality of the high-power transmission signal, and reduces the occurrence of an interfering wave (higher-order harmonic wave) that adversely affects communication in another frequency band. Therefore, when a field effect transistor is used as a switching element which forms the antenna switch ASW, the field effect transistor is required to have not only high breakdown voltage performance but also such performance capable of reducing higher-order harmonic distortion.

For this reason, as the field effect transistor forming the antenna switch, to implement a low loss and low harmonic distortion, a field effect transistor formed over a GaAs substrate or sapphire substrate having a small parasitic capacitance and excellent linearity (e.g., HEMT) has been used. However, a compound semiconductor substrate having an excellent RF characteristic is costly, and is not desirable in terms of a reduction in the cost of the antenna switch. By contrast, when the antenna switch ASW is formed of the MISFETs $Q_N$ formed over the SOI substrate, the SOI substrate is lower in cost than the compound semiconductor substrate, and therefore has the advantage of being capable of achieving a reduction in the cost of the antenna switch ASW. That is, in terms of reducing the cost of the antenna switch ASW, it is effective to use the MISFETs $Q_N$ (field effect transistors) formed over a low-cost silicon substrate (SOI (Silicon On Insulator) substrate).

However, the low-cost SOI substrate has the problems of the parasitic capacitance higher than that of a high-cost compound semiconductor substrate and the harmonic distortion larger than that of a field effect transistor formed over the compound semiconductor substrate. That is, in terms of a cost reduction, it is desirable to form the antenna switch ASW of the MISFETs $Q_N$ formed over the SOI substrate but, in each of the MISFETs $Q_N$ formed over the SOI substrate, the problem of the larger harmonic distortion occurs.

Figure 4:
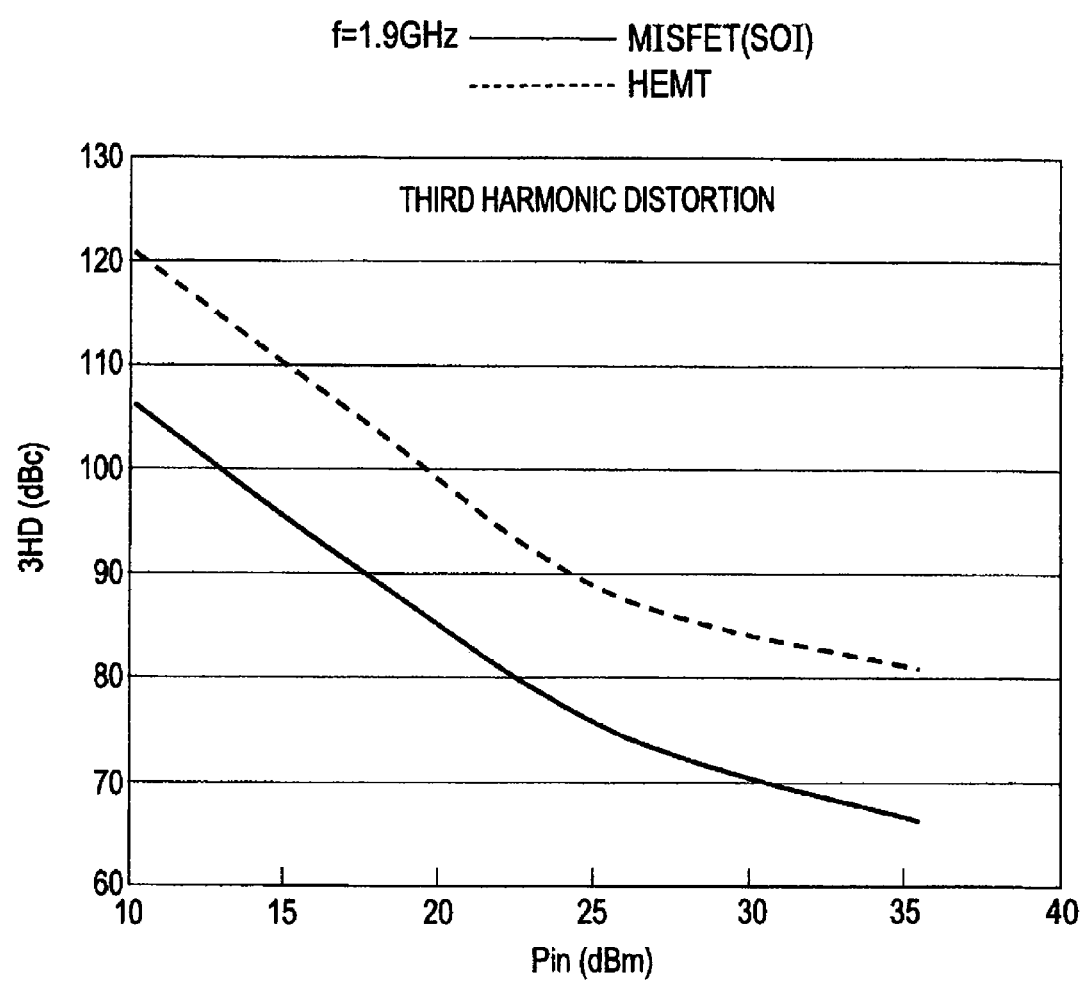
FIG. 4 is a graph showing a relationship between input power and third harmonic distortion at a frequency of 1.9 GHz in each of a MISFET formed over a SOI substrate and a HEMT formed over a compound semiconductor substrate.

For example, FIG. 4 is a graph showing a relationship between input power (Pin) and third harmonic distortion (3HD) at a frequency of 1.9 GHz in each of a MISFET formed over a SOI substrate and a HEMT formed over a compound semiconductor substrate. In FIG. 4, the abscissa axis represents the magnitude of the input power (Pin), and the ordinate axis represents the magnitude of the third harmonic distortion (3HD). Here, the graph indicated by the solid line of FIG. 4 corresponds to the MISFET formed over the SOI substrate, and the graph indicated by the broken line corresponds to the HEMT formed over the compound semiconductor substrate. In FIG. 4, the third harmonic distortion (3HD) is represented in decibels, and the decibel representation shows how much the input power (Pin) has been attenuated by the magnitude of a higher-order harmonic wave. That is, as the decibel representation of the higher-order harmonic wave decreases, the attenuation decreases to show that the magnitude of the higher-order harmonic wave increases. Therefore, from FIG. 4, it can be seen that the third harmonic distortion (3HD) occurred in the MISFET formed over the SOI substrate is larger than that occurred in the HEMT formed over the compound semiconductor substrate. That is, it can be seen that, in the MISFET formed over the SOI substrate, the occurrence of the third harmonic distortion presents a larger problem than in the HEMT formed over the compound semiconductor substrate.

A description will be given to the causes of the occurrence of the third harmonic distortion. If the description will be given to, e.g., the MISFET $Q_N$ formed over the SOI substrate shown in FIG. 3 by way of example, the voltage dependency of a parasitic capacitance formed between the source region S and the drain region D of the MISFET $Q_N$ is the major cause thereof. The parasitic capacitance formed between the source region S and the drain region D can be divided into a parasitic capacitance formed between the source region S and the body region BD and a parasitic capacitance formed between the drain region D and the body region BD. These parasitic capacitances have capacitance values which vary according to the size of a depletion layer functioning as the capacitance insulating film, which also varies according to a voltage applied between the source region S and the drain region D. That is, the parasitic capacitance formed between the source region S and the drain region D has a voltage dependency and, since the voltage dependency includes non-linearity, the third harmonic distortion resulting from the non-linearity occurs. On the other hand, the HEMT formed over the compound semiconductor substrate is formed over the semi-insulating substrate, and the voltage dependency of a parasitic capacitance formed between the source region and the drain region is extremely small. Accordingly, in the HEMT formed over the compound semiconductor substrate, the third harmonic distortion is also small.

The higher-order harmonic distortion includes not only the third harmonic distortion described above, but also second harmonic distortion. In the MISFET formed over the SOI substrate, the second harmonic distortion occurred therein is also larger than that occurred in the HEMT formed over the compound semiconductor substrate.

Thus, in the MISFET formed over the SOI substrate, the higher-order harmonic distortion including the second harmonic distortion and the third harmonic distortion is larger than in the HEMT formed over the compound semiconductor substrate. Therefore, measures for reducing the higher-order harmonic distortion are needed. To satisfy the need, the present invention provides a technical idea which focuses attention particularly on the third harmonic distortion included in the higher-order harmonic distortion, and can achieve a reduction in third harmonic distortion.

(Voltage Dependency of Parasitic Capacitance During Application of DC Voltage)

As described above, the causes of the occurrence of the third harmonic distortion include the voltage dependency of the parasitic capacitance present between the source region and the drain region. Therefore, the voltage dependency of the parasitic capacitance will be examined first. First of all, a description will be given to the voltage dependency of the parasitic capacitance present between the source region and the drain region when a DC voltage (direct-current voltage) is applied between the source region and the drain region.

Figure 5:
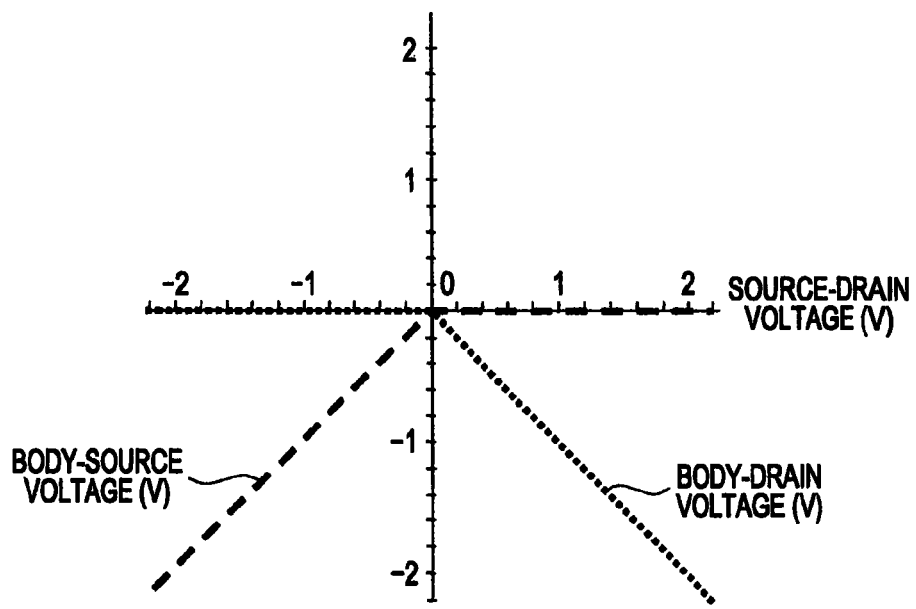
FIG. 5 is a graph showing a relationship between a source-drain voltage and a body-source voltage and a relationship between the source-drain voltage and a body-drain voltage when a DC voltage (direct-current voltage) is applied between a source region and a drain region.

A consideration will be given to the case where, in the state where the MISFET $Q_N$ shown in FIG. 3 is off, a DC voltage (direct-current voltage) is applied between the source region S and the drain region D. FIG. 5 is a graph showing a relationship between a source-drain voltage and a body-source voltage and a relationship between the source-drain voltage and a body-drain voltage when the DC voltage (direct-current voltage) is applied between the source region S and the drain region S. Here, the source-drain voltage shows a voltage applied between the source region S and the drain region D which are shown in FIG. 3, and particularly shows the voltage between the source region S and the drain region D based on the potential of the source region S. The body-source voltage shows a voltage applied between the source region S and the body region BD which are shown in FIG. 3, and particularly shows the voltage between the body region BD and the source region S based on the potential of the source region S. The body-drain voltage shows a voltage applied between the drain region D and the body region BD which are shown in FIG. 3, and particularly shows the voltage between the body region BD and the drain region D based on the potential of the drain region D. In FIG. 5, the abscissa axis represents the source-drain voltage, and the ordinate axis represents the body-source voltage or the body-drain voltage.

Figure 6:
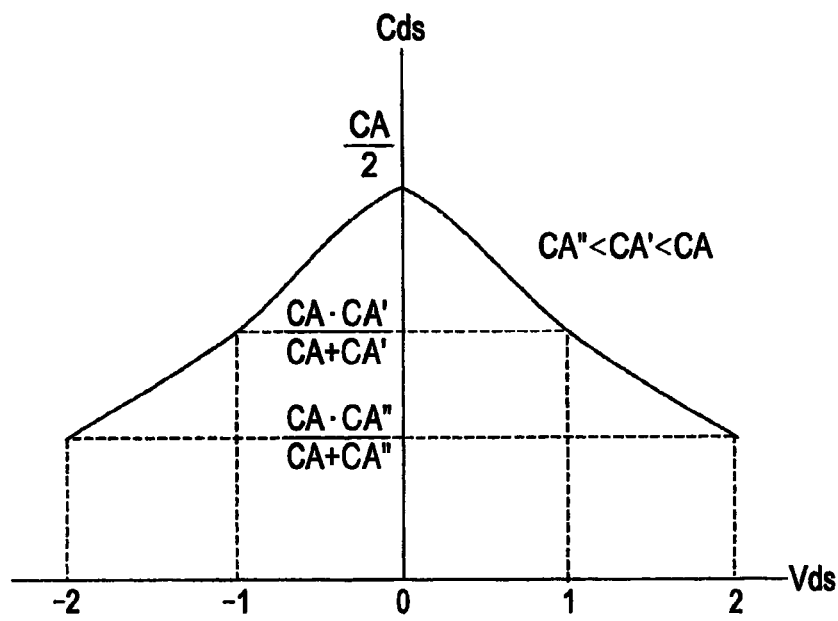
FIG. 6 is a graph showing a relationship between the source-drain voltage and a source-drain capacitance.

FIG. 6 is a graph showing a relationship between the source-drain voltage (Vds) and a source-drain capacitance (Cds). In FIG. 6, the abscissa axis represents the source-drain voltage (Vds), and the ordinate axis represents the source-drain capacitance (Cds).

First, as shown in FIG. 5, when the source-drain voltage is 0 V, each of the body-drain voltage and the body-source voltage is 0 V. At this time, if it is assumed that each of a body-drain junction capacitance and a body-source junction capacitance is the same capacitance CA, as shown in FIG. 6, the source-drain capacitance (Cds) is the series sum of the body-drain junction capacitance and the body-source junction capacitance, and is therefore CA/2.

Next, a consideration will be given to the case where, as the source-drain voltage, e.g., +1 V is applied. For example, the case will be considered where, e.g., 0 V is applied to the source region S and +1 V is applied to the drain region D. In this case, the voltage of the body region BD located between the source region S and the drain region D is 0 V. This is because, since the body region BD is in a floating state, there is no current flow through the body-source junction and through the body-drain junction, and therefore a forward voltage cannot be applied.

For example, if it is assumed that the voltage V of the body region BD satisfies 0<V<1, a positive potential is applied to the body region BD which is the p-type semiconductor region, and 0 V is applied to the source region S which is an n-type semiconductor region. As a result, a forward bias is applied to the junction between the body region BD and the source region S. Therefore, through the body-source junction between the body region BD and the source region S, a current needs to flow. However, the body region BD is in the floating state, and there is no current flow between the body region BD and the source region S. Therefore, the voltage V of the body region BD does not satisfy 0<V<1, and the voltage V of the body region BD becomes 0 V to prevent the forward bias from being applied to the body-source junction and the body-drain junction.

Thus, each of the source region S and the body region BD is at 0 V so that the body-source voltage remains 0 V, and the body-source junction capacitance retains CA. On the other hand, the body region BD is at 0 V and +1 V is applied to the drain region D so that the body-drain voltage is −1 V. That is, a reverse bias is applied between the body region BD and the drain region D. As a result, a depletion layer extends from the body-drain junction so that the body-drain junction capacitance decreases. For example, if the body-drain junction capacitance in this case is assumed to be CA', CA'<CA is satisfied.

As shown in FIG. 6, the source-drain capacitance (Cds) is the series sum of the body-drain junction capacitance (CA') and the body-source junction capacitance (CA) so that CA·CA'/(CA+CA')<C/2 is satisfied. That is, it can be seen that, when the source-drain voltage is +1 V, the source-drain capacitance (Cds) is smaller than when the source-drain voltage is 0 V.

A consideration will be given also to the case where, as the source-drain voltage, e.g., +2 V is applied. For example, the case will be considered where 0 V is applied to the source region S and +2 V is applied to the drain region D. In this case, the voltage of the body region BD located between the source region S and the drain region D is 0 V. This is because, since the body region BD is in the floating state, there is no current flow through the body-source junction and through the body-drain junction. Accordingly, each of the source region S and the body region BD is at 0 V so that the body-source voltage remains 0 V, and the body-source junction capacitance retains CA.

On the other hand, the body region BD is at 0 V and +2 V is applied to the drain region D so that the body-drain voltage is −2 V. That is, a deeper reverse bias is applied between the body region BD and the drain region D. As a result, the depletion layer further extends from the body-drain junction than in the case where +1 V is applied to the drain region D so that the body-drain junction capacitance further decreases. For example, if the body-drain junction capacitance in this case is assumed to be CA", CA"<CA'<CA is satisfied.

As shown in FIG. 6, the source-drain capacitance (Cds) is the series sum of the body-drain junction capacitance (CA") and the body-source junction capacitance (CA) so that CA·CA"/(CA+CA")<CA·CA'/(CA+CA')<C/2 is satisfied. That is, it can be seen that, when the source-drain voltage is +2 V, the source-drain capacitance (Cds) is smaller than when the source-drain voltage is +1 V or 0 V.

From the foregoing, it will be understood that, when a positive voltage is applied as the source-drain voltage (Vds), as the applied positive voltage increases, the source-drain capacitance (Cds) decreases.

Subsequently, a consideration will be given to the case where, as the source-drain voltage, a negative voltage is applied. For example, the case will be considered where, e.g., +1 V is applied to the source region S and 0 V is applied to the drain region D. In this case, the voltage of the body region BD located between the source region S and the drain region D is 0 V. This is because, since the body region BD is in the floating state, there is no current flow through the body-source junction and through the body-drain junction.

For example, if it is assumed that the voltage V of the body region BD satisfies 0<V<1, a positive potential is applied to the body region BD which is the p-type semiconductor region, and 0 V is applied to the drain region D which is an n-type semiconductor region. As a result, a forward bias is applied to the junction between the body region BD and the drain region D. Therefore, through the body-drain junction between the body region BD and the drain region 1), a current needs to flow. However, the body region BD is in the floating state, and there is no current flow between the body region BD and the drain region D. Therefore, the voltage V of the body region BD does not satisfy 0<V<1, and the voltage V of the body region BD becomes 0 V to prevent the forward bias from being applied to the body-source junction and the body-drain junction.

Thus, each of the drain region D and the body region BD is at 0 V so that the body-drain voltage remains 0 V and the body-drain junction capacitance retains CA. On the other hand, the body region BD is at 0 V and +1 V is applied to the source region S so that the body-source voltage is −1 V. That is, a reverse bias is applied between the body region BD and the source region S. As a result, a depletion layer extends from the body-drain junction so that the body-source junction capacitance decreases. At this time, the same reasoning as used in the above-mentioned case of applying the positive voltage (+1 V) as the source-drain voltage can be used, and therefore the body-source junction capacitance is CA' (CA'<CA).

As shown in FIG. 6, the source-drain capacitance (Cds) is the series sum of the body-source junction capacitance (CA') and the body-drain junction capacitance (CA) so that CA·CA'/(CA+CA')<C/2 is satisfied. That is, it can be seen that, when the source-drain voltage is −1 V, the source-drain capacitance (Cds) is smaller than when the source-drain voltage is 0 V. It can also be seen that the source-drain capacitance (Cds) when the source-drain voltage is −1 V is the same as the source-drain capacitance (Cds) when the source-drain voltage is +1 V.

A consideration will be given also to the case where, as the source-drain voltage, e.g., −2 V is applied. For example, the case will be considered where +2 V is applied to the source region S and 0 V is applied to the drain region D. In this case, the voltage of the body region BD located between the source region S and the drain region D is 0 V. This is because, since the body region BD is in the floating state, there is no current flow through the body-source junction and through the body-drain junction. Accordingly, each of the drain region D and the body region BD is at 0 V so that the body-drain voltage remains 0 V and the body-drain junction capacitance retains CA.

On the other hand, the body region BD is at 0 V and +2 V is applied to the source region S so that the body-source voltage is −2 V. That is, a deeper reverse bias is applied between the body region BD and the source region S. As a result, the depletion layer further extends from the body-source junction than in the case where +1 V is applied to the source region S so that the body-source junction capacitance further decreases. At this time, the same reasoning as used in the above-mentioned case of applying the positive voltage (+2 V) as the source-drain voltage can be used, and therefore the body-source junction capacitance is CA" (CA"<CA'<CA).

As shown in FIG. 6, the source-drain capacitance (Cds) is the series sum of the body-source junction capacitance (CA") and the body-drain junction capacitance (CA) so that CA·CA"/(CA+CA")<CA·CA'/(CA+CA')<C/2 is satisfied. That is, it can be seen that, when the source-drain voltage is −2 V, the source-drain capacitance (Cds) is smaller than when the source-drain voltage is −1 V or 0 V. It can also be seen that the source-drain capacitance (Cds) when the source-drain voltage is −2 V is the same as the source-drain capacitance (Cds) when the source-drain voltage is +2 V.

From the foregoing, it can be seen that, when a negative voltage is applied as the source-drain voltage (Vds), as the applied negative voltage (absolute value) increases, the source-drain capacitance (Cds) decreases. Therefore, the voltage dependency of the parasitic capacitance (source-drain capacitance) present between the source region S and the drain region D when the DC voltage (direct-current voltage) is applied between the source region S and the drain region D is as shown in FIG. 6. That is, the parasitic capacitance has a voltage dependency such that, when the source-drain voltage (Vds) is 0 V, the source-drain capacitance (Cds) is largest and, as the absolute value of the source-drain voltage increases irrespective of the positive or negative sign thereof, the source-drain capacitance (Cds) decreases. It can be said, in other words, that the voltage dependency of the source-drain capacitance (Cds) is laterally symmetrical with respect to the position where the source-drain capacitance (Cds) is 0 V, and upwardly protruding.

(Voltage Dependency of Parasitic Capacitance During Application of RF Voltage)

From the result of the examination described above, it is obvious that, when the DC voltage (direct-current voltage) is applied between the source region and the drain region of each of the MISFETs formed over the SOI substrate, the voltage dependency of the parasitic capacitance present between the source region and the drain region is laterally symmetrical with respect to the position where the source-drain capacitance (Cds) is 0 V, and upwardly protruding.

However, the present inventors have newly found that, as the voltage dependency related to each of the MISFETs $Q_N$ included in the antenna switch ASW shown in FIG. 2, the voltage dependency when the DC voltage (direct-current voltage) is applied cannot be used properly without change. That is, it should be considered that, to the antenna switch ASW, not the DC (direct-current voltage), but an RF voltage (RF signal) is applied, and the RF voltage is applied between the source region S and the drain region D of the MISFET $Q_N$ in the OFF state. By the examination conducted by the present inventors, it has been proved that there is a large difference between the voltage dependency of the source-drain capacitance (Cds) when the DC voltage is applied between the source region S and the drain region of the MISFET $Q_N$ in the OFF state and the voltage dependency thereof when the RF voltage is applied therebetween. Therefore, it is not proper to analyze the voltage dependency of the source-drain capacitance (Cds) when the DC voltage (direct-current voltage) is applied in order to obtain the voltage dependency of the source-drain capacitance (Cds) of each of the MISFETs $Q_N$ included in the antenna switch ASW, and it is needed to analyze the voltage dependency of the source-drain capacitance (Cds) when the RF voltage is applied.

To satisfy the need, the present inventors have newly analyzed the voltage dependency of the source-drain capacitance (Cds) when the RF voltage is applied, and obtained the following result, which will be described with reference to the drawings.

Figure 7:
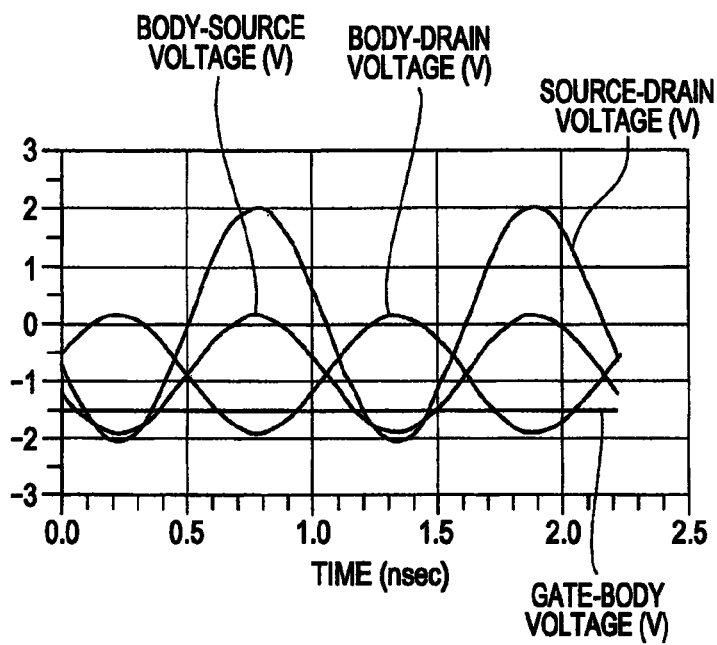
FIG. 7 is a graph showing respective variations with time in source-drain voltage, body-source voltage, body-drain voltage, and gate-body voltage when an RF voltage (AC voltage) is applied between the source region and the drain region.

A consideration will be given to the case where, in the state where the MISFET $Q_N$ shown in FIG. 3 is off, an RF voltage (AC voltage) is applied between the source region S and the drain region D. FIG. 7 is a graph showing respective variations with time in source-drain voltage, body-source voltage, body-drain voltage, and gate-body voltage when the RF voltage (AC voltage) is applied between the source region S and the drain region D. Here, the source-drain voltage shows a voltage applied between the source region S and the drain region D which are shown in FIG. 3, and particularly shows the voltage between the source region S and the drain region D based on the potential of the source region S. The body-source voltage shows a voltage applied between the source region S and the body region BD which are shown in FIG. 3, and particularly shows the voltage between the body region BD and the source region S based on the potential of the source region S. The body-drain voltage shows a voltage applied between the drain region D and the body region BD which are shown in FIG. 3, and particularly shows the voltage between the body region BD and the drain region D based on the potential of the drain region D. The gate-body voltage shows a voltage applied between the gate electrode G and the body region BD which are shown in FIG. 3, and particularly shows the voltage between the body region BD and the gate electrode G based on the potential of the body region BD. In FIG. 7, the abscissa axis represents a time, and the ordinate axis represents any of the source-drain voltage, the body-source voltage, the body-drain voltage, and the gate-body voltage.

First, as shown in FIG. 7, when the RF voltage is applied between the source region S and the drain region D of the MISFET $Q_N$ in the OFF state, the source-drain voltage becomes an RF voltage having an amplitude of about 2 V which is centered on 0 V. Specifically, the source-drain voltage becomes a voltage oscillating between −2 V and +2 V around 0 V. The body-source voltage becomes an RF voltage having an amplitude of about 1 V which is centered on about −1 V. Specifically, the body-source voltage is substantially 0 V when the amplitude of the source-drain voltage in the positive direction (plus direction) is maximum, and otherwise oscillates in the negative voltage range. Likewise, the body-drain voltage becomes an RF voltage having an amplitude of about 1 V which is centered on about −1 V. Specifically, the body-drain voltage is substantially 0 V when the amplitude of the source-drain voltage in the negative direction (minus direction) is maximum, and otherwise oscillates in the negative voltage range. That is, it can be seen that each of the body-drain voltage and the body-source voltage varies so as not to be a positive voltage. The reason for this is as follows.

First, a description will be given to the body-drain voltage. The event that the body-drain voltage becomes a positive voltage indicates that the body region BD has a positive voltage based on the potential of the drain region D. In consideration of the fact that the body region BD is formed of the p-type semiconductor region and the drain region D is formed of the n-type semiconductor region, the event that the body-drain voltage becomes a positive voltage indicates that a forward bias is applied to the pn junction between the body region BD and the drain region D. Therefore, if the body-drain voltage becomes a positive voltage, a forward current flows between the body region BD and the drain region D. However, since the body region BD is actually in the floating state, the forward current mentioned above does not flow. That is, since the body region BD is in the floating state and the forward current does not flow, the body-drain voltage does not become a positive voltage. For this reason, the body-drain voltage ranges from 0 V to a negative voltage.

The same holds true with the body-source voltage. That is, the event that the body-source voltage becomes a positive voltage indicates that the body region BD has a positive voltage based on the potential of the source region S. In consideration of the fact that the body region BD is formed of the p-type semiconductor region and the source region S is formed of the n-type semiconductor region, the event that the body-source voltage becomes a positive voltage indicates that a forward bias is applied to the pn junction between the body region BD and the source region S. Therefore, if the body-source voltage becomes a positive voltage, a forward current flows between the body region BD and the source region S. However, since the body region BD is actually in the floating state, the forward current mentioned above does not flow. That is, since the body region BD is in the floating state and the forward current does not flow, the body-source voltage does not become a positive voltage. For this reason, the body-source voltage ranges from 0 V to a negative voltage.

By contrast, as shown in FIG. 7, the gate-body voltage maintains a given potential difference in spite of its variations with time. The reason for this is as follows. That is, as shown in FIG. 3, the gate insulating film GOX is formed over the body region BD and, over the gate insulating film GOX, the gate electrode G is formed. As a result, in the MISFET $Q_N$ shown in FIG. 3, a gate capacitance including the body region BD as a lower electrode, the gate insulating film GOX as a capacitance insulating film, and the gate electrode G as an upper electrode is formed. Since the gate insulating film GOX is formed of an extremely thin film, the capacitance value of the gate capacitance mentioned above is extremely large. Here, due to the RF voltage applied between the source region S and the drain region D of the MISFET $Q_N$ in the OFF state, an RF voltage is applied to the body region BD. In addition, between the body region BD and the gate electrode G, the gate capacitance having the large capacitance value is formed. As a result, due to the gate capacitance having the large capacitance value, the AC-wise RF voltage moves from the body region BD into the gate electrode G. That is, from the fact that the body region BD is coupled to the gate electrode. G via the gate capacitance having the large capacitance value, it can be considered the body region BD and the gate electrode G are AC-wise short-circuited. Accordingly, the voltage of the gate electrode G varies with time in such a manner as to follow AC-wise variations in the voltage applied to the body region BD. As a result, in the voltage applied to the body region BD and the voltage applied to the gate electrode G, the AC-wise voltage variations maintain a given DC voltage (direct-current voltage) without affecting the potential difference between the body region BD and the gate electrode G. Accordingly, the gate-body voltage maintains the given potential in spite of its variations with time.

Next, a description will be given to the voltage dependencies of the body-drain junction capacitance and the body-source junction capacitance based on respective variations with time in source-drain voltage, body-source voltage, and body-drain voltage when the RF voltage (AC voltage) is applied between the source region S and the drain region D.

Figure 8:
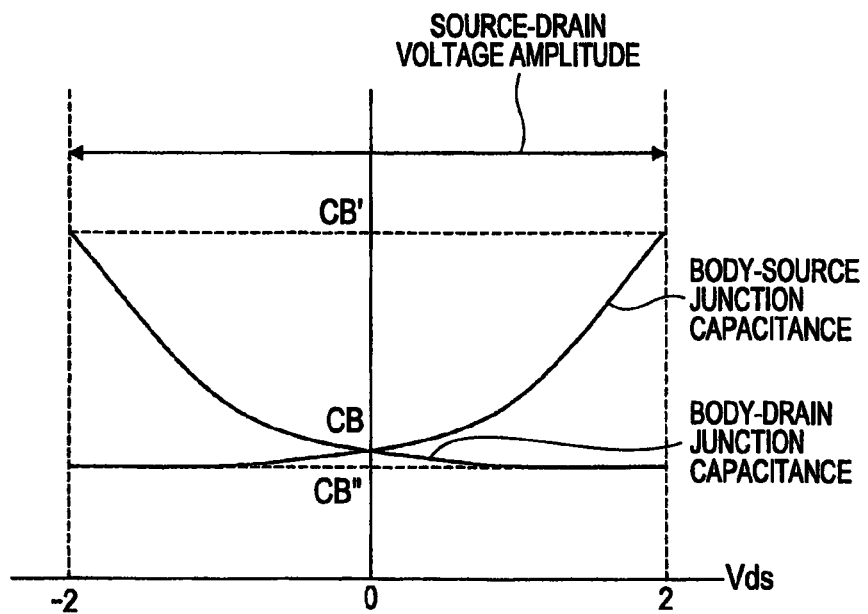
FIG. 8 is a graph showing a relationship between the source-drain voltage and a body-drain junction capacitance and a relationship between the source-drain voltage and a body-source junction capacitance.

FIG. 8 is a graph showing a relationship between the source-drain voltage (Vds) and the body-drain junction capacitance and a relationship between the source-drain voltage (Vds) and the body-source junction capacitance. In FIG. 8, the abscissa axis represents the source-drain voltage (Vds), and the ordinate axis represents the body-drain junction capacitance and the body-source junction capacitance.

First, a consideration will be given to the case where the source-drain voltage (Vds) is 0 V. As shown in FIG. 7, when the source-drain voltage is 0 V, each of the body-drain voltage and the body-source voltage is about −1 V. Therefore, to the pn junction between the body region BD and the drain region D, a reverse bias is applied and, to the pn junction between the body region BD and the source region S also, a reverse bias is applied. Each of the body-drain junction capacitance and the body-source junction capacitance at this time is assumed to be CB, as shown in FIG. 8.

Subsequently, a consideration will be given to the case where the source-drain voltage AC-wise varies to become a voltage which is largest in the positive voltage direction. That is, the case will be considered where, as shown in FIG. 7, the source-drain voltage is +2 V. In this case, as can be seen from FIG. 7, the body-source voltage is substantially 0 V. As a result, to the pn junction between the body region BD and the source region S, a reverse bias is not applied so that the width of the depletion layer decreases, and the value of the body-source junction capacitance increases. Therefore, as shown in FIG. 8, the body-source junction capacitance becomes, e.g., CB' (CB'>CB). On the other hand, as can be seen from FIG. 7, the body-drain voltage is substantially −2 V. As a result, to the pn junction between the body region BD and the drain region D, a deep reverse bias is applied so that the depletion layer further extends than in the case where the source-drain voltage is 0 V. As a result, the value of the body-drain junction capacitance further decreases. Therefore, as shown in FIG. 8, the body-drain junction capacitance becomes, e.g., CB" (CB"<CB).

A similar consideration can be applied to the case where the source-drain voltage AC-wise varies to become a voltage which is largest (which has a largest absolute value) in the negative voltage direction. Specifically, the case will be considered where, as shown in FIG. 7, the source-drain voltage is −2 V. In this case, as can be seen from FIG. 7, the body-drain voltage is substantially 0 V. As a result, to the pn junction between the body region BD and the drain region D, a reverse bias is not applied so that the width of the depletion layer decreases, and the value of the body-drain, junction capacitance increases. Also, the body-drain junction capacitance when the body-drain voltage is 0 V is the same as the body-source junction capacitance when the body-source voltage is 0 V. Therefore, as shown in FIG. 8, the body-drain junction capacitance becomes, e.g., CB' (CB'>CB). On the other hand, as can be seen from FIG. 7, the body-source voltage is substantially −2 V. As a result, to the pn junction between the body region BD and the source region S, a deep reverse bias is applied so that the depletion layer further extends than in the case where the source-drain voltage is 0 V. As a result, the value of the body-source junction capacitance further decreases. Also, the body-source junction capacitance when the body-source voltage is −2 V is the same as the body-drain junction capacitance when the body-drain voltage is −2 V. Therefore, as shown in FIG. 8, the body-source junction capacitance becomes, e.g., CB" (CB"<CB).

Accordingly, when the RF voltage (AC voltage) is applied between the source region S and the drain region D, the body-drain junction capacitance and the body-source junction capacitance have voltage dependencies as shown in FIG. 8.

Figure 9:
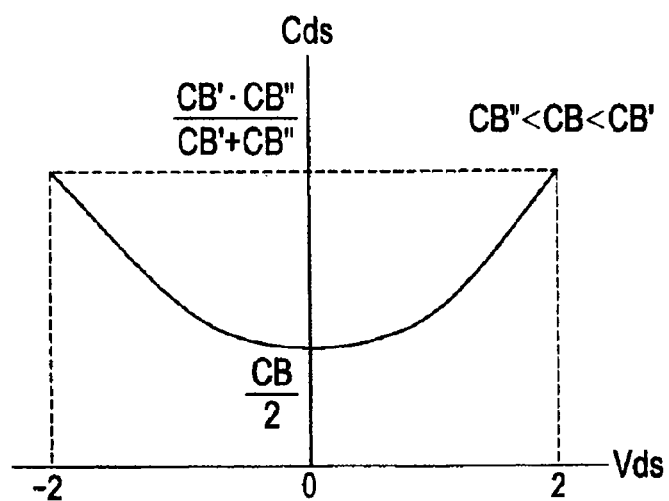
FIG. 9 is a graph showing the voltage dependency of the source-drain capacitance when an RF voltage (AC voltage) is applied between the source region and the drain region.

Here, the source-drain capacitance (Cds) can be represented as the series sum of the body-drain junction capacitance and the body-source capacitance. Therefore, based on the voltage dependencies of the body-drain junction capacitance and the body-source junction capacitance shown in FIG. 8, the voltage dependency of the source-drain capacitance (Cds) becomes as shown in FIG. 9. FIG. 9 is a graph showing the voltage dependency of the source-drain capacitance (Cds) when the RF-frequency voltage (AC voltage) is applied between the source region S and the drain region D. In FIG. 9, the abscissa axis represents the source-drain voltage (Vds), and the ordinate axis represents the source-drain capacitance (Cds). As shown in FIG. 9, the source-drain capacitance (Cds) has a voltage dependency such that, when the source-drain voltage (Vds) is 0 V, the source-drain capacitance (Cds) is smallest and, as the absolute value of the source-drain voltage increases irrespective of the positive or negative sign thereof, the source-drain capacitance (Cds) increases. It can be said, in other words, that the voltage dependency of the source-drain capacitance (Cds) is laterally symmetrical with respect to the position where the source-drain capacitance (Cds) is 0 V, and downwardly protruding.

Therefore, it can be seen that, as shown in FIGS. 6 and 9, the voltage dependency of the source-drain capacitance (Cds) is entirely different when the DC voltage (direct-current voltage) is applied between the source region S and the drain region D of each of the MISFETs formed over the SOI substrate and when the RF voltage (AC voltage) is applied between the source region S and the drain region D of each of the MISFETs formed over the SOI substrate.

That is, when the DC voltage (direct-current voltage) is applied, as shown in FIG. 6, the voltage dependency of the parasitic capacitance present between the source region S and the drain region D is laterally symmetrical with respect to the position where the source-drain capacitance (Cds) is 0 V, and upwardly protruding. By contrast, when the RF voltage (AC voltage) is applied, as shown in FIG. 9, the voltage dependency of the parasitic capacitance present between the source region S and the drain region D is laterally symmetrical with respect to the position where the source-drain capacitance (Cds) is 0 V, and downwardly protruding.

From the foregoing, it can be considered that, in the antenna switch ASW to which the RF voltage (AC voltage) is applied, it is proper to adopt, not the voltage dependency shown in FIG. 6, but the voltage dependency shown in FIG. 9 as the voltage dependency of the source-drain capacitance (Cds) of each of the MISFETs $Q_N$ included in the antenna switch ASW.

(Basic Idea of Present Invention)

As described above, when the RF voltage (AC voltage) is applied between the source region S and the drain region D of the MISFET $Q_N$, the voltage dependency of the source-drain capacitance (Cds) in the MISFET $Q_N$ is represented by the downwardly protruding curve, as shown in FIG. 9. Since the downwardly protruding curve shown in FIG. 9 includes a non-linear component, it can be considered that the third harmonic distortion results from the voltage dependency of the source-drain capacitance (Cds) including the non-linear component.

Accordingly, in the present invention, based on the findings described above, measures have been taken to allow a reduction in the third harmonic distortion generated from each of the MISFETs $Q_N$ included in the antenna switch ASW.

The basic idea of the present invention is that a mechanism for generating the third harmonic distortion resulting from the voltage dependency of the source-drain capacitance (Cds) and another third harmonic distortion having a phase opposite to that of the third harmonic distortion and substantially the same amplitude as that of the harmonic distortion is provided in the antenna switch ASW to cancel out the original third harmonic distortion by the other third harmonic distortion, and reduce the absolute value of the third harmonic distortion. Specifically, between the source region S and the drain region D of the MISFET $Q_N$ which is off in a predetermined circuit operation mode in the antenna switch ASW, a distortion compensating capacitance circuit is additionally provided. In addition, to the distortion compensating capacitance circuit, a voltage dependency (such that the capacitance is reduced by applying a voltage irrespective of the polarity of the voltage) opposite to the voltage dependency of the source-drain capacitance (Cds) is imparted. In this case, the voltage dependency opposite to the voltage dependency of the source-drain capacitance (Cds) causes the other third harmonic distortion having the phase opposite to that of the third harmonic distortion resulting from the voltage dependency of the source-drain capacitance (Cds). Therefore, by adjusting the amplitude of the other third harmonic distortion, the third harmonic distortion resulting from the voltage dependency of the source-drain capacitance (Cds) can be cancelled out. The optimization of the amplitude of the other third harmonic distortion can be performed by, e.g., adjusting the capacitance value of the distortion compensating capacitance circuit and the voltage dependency thereof.

Figure 10:
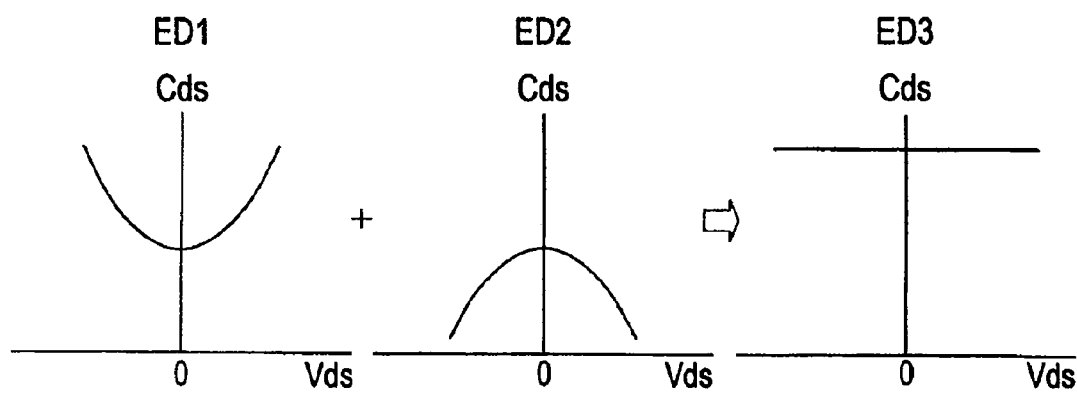
FIG. 10 is a view for illustrating the basic idea of the present invention.

Hereinbelow, the outline of the basic idea of the present invention will be described with reference to the drawing. FIG. 10 is a view for illustrating the basic idea of the present invention. As shown in FIG. 10, the basic idea of the present invention is to combine, when there is a downwardly protruding voltage dependency ED1 such as the voltage dependency of the source-drain capacitance (Cds) described above, the voltage dependency ED1 with an upwardly protruding voltage dependency ED2 such as that of the distortion compensating capacitance circuit. As a result, a flat voltage dependency such as a voltage dependency ED3 can be obtained. That is, the voltage dependency ED1 and the voltage dependency ED2 include respective non-linear components but, by combining the downwardly protruding voltage dependency ED1 with the upwardly protruding voltage dependency ED2, the flat voltage dependency ED3 including a reduced non-linear component can be obtained. In other words, this means that the phase of the third harmonic distortion resulting from the downwardly protruding voltage dependency ED1 is opposite to the phase of the other third harmonic distortion resulting from the upwardly protruding voltage dependency. Thus, the basic idea of the present invention is that, by combining the third harmonic distortion and the other harmonic distortion which are in anti-phase relation with each other, the original third harmonic distortion can be cancelled out.

(Structure of Distortion Compensating Capacitance Circuit)

To realize the basic idea of the present invention described above, it is needed first to design the distortion compensating capacitance circuit. That is, when the RF voltage (AC voltage) is applied between the source region S and the drain region D of each of the MISFETs $Q_N$ included in the antenna ASW, the voltage dependency of the source-drain capacitance (Cds) in the MISFET $Q_N$ is represented by the downwardly protruding curve, as shown in FIG. 9. Therefore, as will be understood from the basic idea of the present invention illustrated in FIG. 10, when the RF voltage (AC voltage) is applied, the distortion compensating capacitance circuit added to the antenna switch ASW is required to have the voltage dependency represented by the upwardly protruding curve. Therefore, a description will be given hereinbelow to a structure of the distortion compensating capacitance circuit having the voltage dependency represented by the upwardly protruding curve.

First, a description will be given to a capacitance element forming the distortion compensating capacitance circuit. Since the voltage dependency is required of the capacitance of the distortion compensating capacitance circuit, it can be considered that the voltage dependency is also required of the capacitance of the capacitance element forming the distortion compensating capacitance circuit. Therefore, in the present invention, as the capacitance element forming the distortion compensating capacitance circuit, a MOS diode capacitance element having a voltage dependency is used.

Hereinbelow, a structure of the MOS diode capacitance element forming the distortion compensating capacitance circuit will be described. FIG. 11(*a*) is a cross-sectional view showing a structure of a MOS diode capacitance element MDC1 in the present invention, and FIG. 11(*b*) is a circuit symbol diagram of the MOS diode capacitance element. As shown in FIG. 11(*a*), the MOS diode capacitance element MDC1 is formed over a SOI substrate including the semiconductor substrate (support substrate) 1S, the buried insulating layer BOX formed over the semiconductor substrate 1S, and a silicon layer (active layer) formed over the buried insulating layer BOX. Specifically, the MOS diode capacitance element MDC1 has a pair of semiconductor regions NR1A formed in two-dimensionally spaced-part relation in the silicon layer of the SOI substrate, and a semiconductor region NR1B formed between the pair of semiconductor regions NR1A. At this time, each of the semiconductor regions NR1A and the semiconductor region NR1B is a semiconductor region (impurity diffusion region) into which an impurity of the same conductivity type has been introduced, and formed of, e.g., an n-type semiconductor region. Therefore, the semiconductor regions NR1A and the semiconductor region NR1B are electrically coupled to each other and, of the semiconductor regions NR1A and the semiconductor region NR1B, the lower electrode of the MOS diode capacitance element MDC1 is formed. Note that the impurity concentration of the semiconductor region NR1B is lower than the impurity concentration of each of the semiconductor regions NR1A.

Over the semiconductor region NR1B, a capacitance insulating film CIL1 formed of, e.g., a silicon oxide film is formed. Over the capacitance insulating film CIL1, an electrode EL1 is formed. The electrode EL1 serves as the upper electrode of the MOS diode capacitance element MDC1, and is formed by, e.g., introducing an n-type impurity such as phosphorus into a polysilicon film. In addition, over the both side walls of the electrode EL1, the sidewalls SW are formed.

Figure 11A:
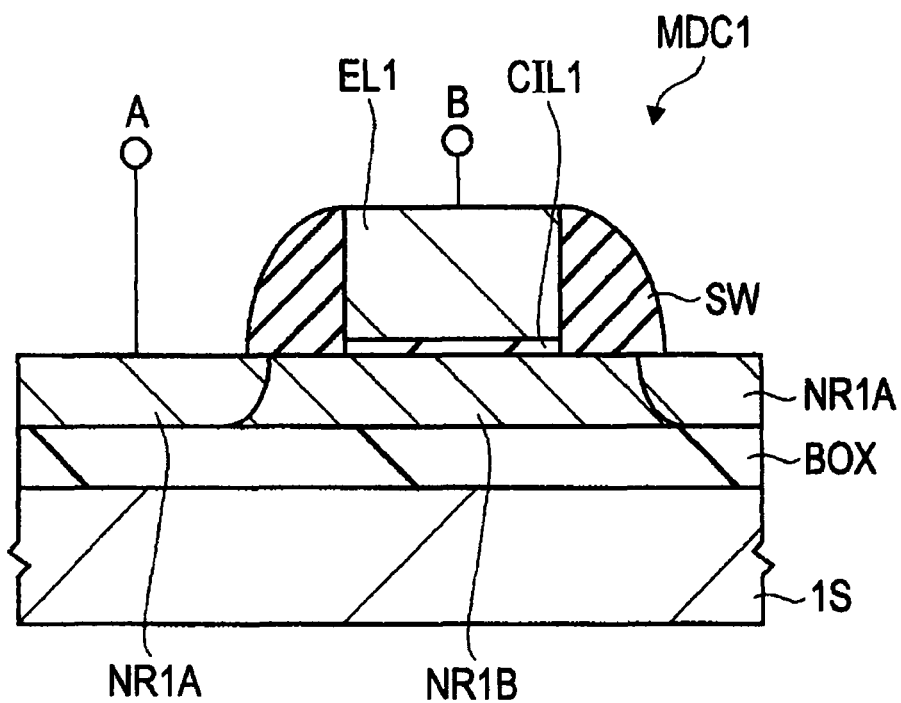
FIG. 11(a) is a cross-sectional view showing a structure of a MOS diode capacitance element in the present invention.

The MOS diode capacitance element MDC1 thus structured has the structure close to that of a typical MISFET, but is different therefrom in the following point. That is, in the typical MISFET, each of the source region and the drain region has a conductivity type different from that of the body region serving as a channel region. However, the MOS diode capacitance element MDC1 shown in FIG. 11(a) is different from the typical MISFET in that each of the semiconductor regions NR1A corresponding to the source region and the drain region of the typical MISFET is formed of the semiconductor region of the same conductivity type as that of the semiconductor region NR1B corresponding to the body region. In the MOS diode capacitance element MDC1 thus structured, the semiconductor region NR1A serving as the lower electrode is electrically coupled to a terminal A via wiring, and the electrode EL1 serving as the upper electrode is electrically coupled to a terminal B via wiring.

Figure 11B:
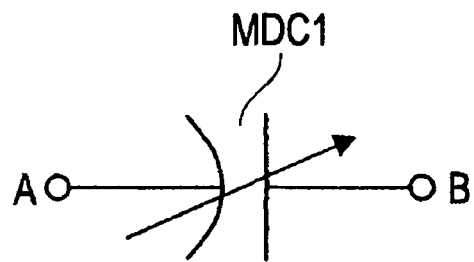
FIG. 11(b) is a circuit symbol diagram of the MOS diode capacitance element.

Here, the reason for referring to the capacitance element shown in each of FIGS. 11(a) and 11(b) as the MOS diode capacitance element is that the capacitance element is formed to have a MOS structure, and has two nodes (diodes) which are the terminals A and B. That is, it is additionally mentioned that, even though the capacitance element is referred to as the MOS diode capacitance element, a diode (pn junction diode) is not formed therein.

Subsequently, a description will be given to the fact that, in the MOS diode capacitance element MDC1 shown in FIG. 11(a), the capacitance value varies according to a voltage applied between the terminals A and B. That is, the description will be given to the fact that the capacitance value of the MOS diode capacitance element MDC1 shown in FIG. 11(a) has a voltage dependency.

Figure 12:
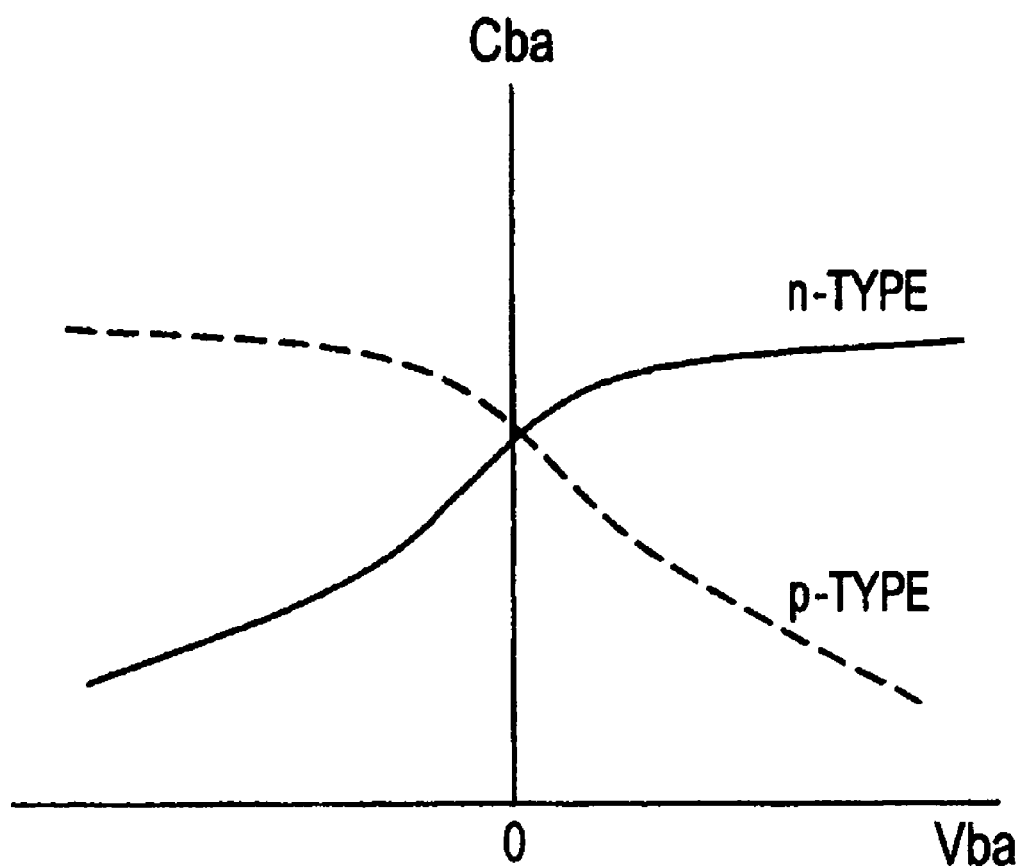
FIG. 12 is a graph showing that the capacitance value of the MOS diode capacitance element shown in FIG. 11(a) is varied by a voltage applied between terminals.

FIG. 12 is a graph showing that a capacitance value Cba of the MOS diode capacitance element MDC1 shown in FIG. 11(a) varies according to the voltage applied between the terminals A and B. In FIG. 12, the abscissa axis represents a voltage Vba applied between the terminals A and B, and particularly shows the voltage Vba between the terminals A and B based on the potential of the terminal A. On the other hand, the ordinate axis represents the capacitance value Cba of the MOS diode capacitance element MDC1.

Hereinbelow, a description will be given to the voltage dependency of the n-type MOS diode capacitance element MDC1 which is shown by the solid line in the graph of FIG. 12. It is assumed that the n-type MOS diode capacitance element MDC1 indicates a MOS diode capacitance element having a structure in which each of the semiconductor regions NR1A and the semiconductor region NR1B which are shown in FIG. 11(a) is formed of an n-type semiconductor region.

First, a consideration will be given to the case where, as shown in FIG. 12, a negative voltage is applied as the voltage Vba. The application of a negative voltage as the voltage Vba corresponds to the application of a voltage which is lower for the terminal B than for the terminal A, and corresponds to, e.g., the application of a positive voltage to the semiconductor region NR1B (semiconductor regions NR1A) and the application of a negative voltage to the electrode EL1 in the MOS diode capacitance element MDC1 shown in FIG. 11(a). In this case, in the semiconductor region NR1B immediately under the capacitance insulating film CIL1, a depletion layer expands. Since the depletion layer functions as an insulating region, the thickness of the capacitance insulating film of the MOS diode capacitance element MDC1 is the combination of the thickness of the capacitance insulating film CIL1 and the thickness of the depletion layer. This means that the capacitance insulating film of the MOS diode capacitance element MDC1 is thicker than in the case where the capacitance insulating film of the MOS diode capacitance element MDC1 is formed only of the capacitance insulating film CIL1 and, consequently, the capacitance value Cba of the MOS diode capacitance element MDC1 decreases.

On the other hand, a consideration will be given to the case where a positive voltage is applied as the voltage Vba. The application of a positive voltage as the voltage Vba corresponds to the application of a voltage which is higher for the terminal B than for the terminal A, and corresponds to, e.g., the application of a negative voltage to the semiconductor region NR1B (semiconductor regions NR1A) and the application of a positive voltage to the electrode EL1 in the MOS diode capacitance element MDC1 shown in FIG. 11(a). In this case, in the semiconductor region NR1B immediately under the capacitance insulating film CIL1, the depletion layer disappears, and electrons are accumulated in the vicinity of the interface between the semiconductor region NR1B and the capacitance insulating film CIL1 to form an accumulation layer. As a result, the capacitance insulating film of the MOS diode capacitance element MDC1 is formed only of the capacitance insulating film CIL1. This means that the capacitance insulating film of the MOS diode capacitance element MDC1 is thinner than in the case where the capacitance insulating film of the MOS diode capacitance element MDC1 is formed of the capacitance insulating film CIL1 and the depletion layer and, consequently, the capacitance value Cba of the MOS diode capacitance element MDC1 increases.

From the consideration described above, as shown by the solid line of FIG. 12, in the n-type MOS diode capacitance element MDC1, the capacitance value Cba is relatively small when the voltage Vba is a negative voltage and, as the voltage Vba changes from a negative voltage to a positive voltage, the thickness of the depletion layer formed in the semiconductor region NR1B decreases so that the capacitance value Cba increases. It can be seen that, in the n-type MOS diode capacitance element MDC1, when a larger positive voltage is applied as the voltage Vba, the depletion layer disappears and the accumulation layer of the electrons is formed, and afterwards the capacitance value Cba is substantially constant.

In the n-type MOS diode capacitance element MDC1 having such a voltage dependency, by adjusting the impurity concentration and the impurity distribution of the semiconductor region NR1B, the depletion layer can be adjusted. Therefore, by adjusting the impurity concentration and the impurity distribution of the semiconductor region NR1B, a predetermined voltage dependency can be obtained. For example, the impurity concentration of the semiconductor region NR1B can be adjusted to a value in the range of $1\times10^{17}/cm^3$ to $1\times10^{18}/cm^3$. In addition, by adjusting the width of the electrode EL1, the absolute value of a voltage-induced capacitance change can be set to a predetermined value.

Next, a description will be given to the voltage dependency of the p-type MOS diode capacitance element MDC1 which is shown by the broken line in the graph of FIG. 12. It is assumed that the p-type MOS diode capacitance element MDC1 indicates a MOS diode capacitance element having a structure in which each of the semiconductor regions NR1A and the semiconductor region NR1B which are shown in FIG. 11(a) is formed of a p-type semiconductor region.

First, a consideration will be given to the case where, as shown in FIG. 12, a positive voltage is applied as the voltage Vba. The application of a positive voltage as the voltage Vba corresponds to the application of a voltage which is higher for the terminal B than for the terminal A, and corresponds to, e.g., the application of a negative voltage to the semiconductor region NR1B (semiconductor regions NR1A) and the application of a positive voltage to the electrode EL1 in the MOS diode capacitance element MDC1 shown in FIG. 11(a). In this case, in the semiconductor region NR1B immediately under the capacitance insulating film CIL1, a depletion layer expands. Since the depletion layer functions as an insulating region, the thickness of the capacitance insulating film of the MOS diode capacitance element MDC1 is the combination of the thickness of the capacitance insulating film CIL1 and the thickness of the depletion layer. This means that the capacitance insulating film of the MOS diode capacitance element MDC1 is thicker than in the case where the capacitance insulating film of the MOS diode capacitance element MDC1 is formed only of the capacitance insulating film CIL1 and, consequently, the capacitance value Cba of the MOS diode capacitance element MDC1 decreases.

On the other hand, a consideration will be given to the case where a negative voltage is applied as the voltage Vba. The application of a negative voltage as the voltage Vba corresponds to the application of a voltage which is lower for the terminal B than for the terminal A, and corresponds to, e.g., the application of a positive voltage to the semiconductor region NR1B (semiconductor regions NR1A) and the application of a negative voltage to the electrode EL1 in the MOS diode capacitance element MDC1 shown in FIG. 11(a). In this case, in the semiconductor region NR1B immediately under the capacitance insulating film CIL1, the depletion layer disappears, and holes are accumulated in the vicinity of the interface between the semiconductor region NR1B and the capacitance insulating film CIL1 to form an accumulation layer. As a result, the capacitance insulating film of the MOS diode capacitance element MDC1 is formed only of the capacitance insulating film CIL1. This means that the capacitance insulating film of the MOS diode capacitance element MDC1 is thinner than in the case where the capacitance insulating film of the MOS diode capacitance element MDC1 is formed of the capacitance insulating film CIL1 and the depletion layer and, consequently, the capacitance value Cba of the MOS diode capacitance element MDC1 increases.

From the consideration described above, as shown by the broken line of FIG. 12, in the p-type MOS diode capacitance element MDC1, the capacitance value Cba is relatively small when the voltage Vba is a positive voltage and, as the voltage Vba changes from a positive voltage to a negative voltage, the thickness of the depletion layer formed in the semiconductor region NR1B decreases so that the capacitance value Cba increases. It can be seen that, in the p-type MOS diode capacitance element MDC1, when a larger negative voltage is applied as the voltage Vba, the depletion layer disappears and the accumulation layer of the holes is formed, and afterwards the capacitance value Cba is substantially constant.

In the p-type MOS diode capacitance element MDC1 having such a voltage dependency, by adjusting the impurity concentration and the impurity distribution of the semiconductor region NR1B, the depletion layer can be adjusted. Therefore, by adjusting the impurity concentration and the impurity distribution of the semiconductor region NR1B, a predetermined voltage dependency can be obtained. For example, the impurity concentration of the semiconductor region NR1B can be adjusted to a value in the range of $1\times10^{17}/cm^3$ to $1\times10^{18}/cm^3$. In addition, by adjusting the width of the electrode EL1, the absolute value of a voltage-induced capacitance change can be set to a predetermined value.

From the foregoing, as shown in FIG. 12, it can be seen that the voltage dependency of the n-type MOS diode capacitance element MDC1 and the voltage dependency of the p-type MOS diode capacitance element MDC1 are in mutually inverse relation with respect to 0 V.

Here, the voltage dependency of the capacitance value in the single MOS diode capacitance element MDC1 is as shown in FIG. 12. On the other hand, the distortion compensating capacitance circuit is required to have the voltage dependency represented by the upwardly protruding curve when the RF voltage (AC voltage) is applied thereto. Therefore, with only the single MOS diode capacitance element MDC1, the distortion compensating capacitance circuit having the voltage dependency represented by the upwardly protruding curve cannot be implemented. Accordingly, the present invention combines the two MOS diode capacitance elements MDC to implement the distortion compensating capacitance circuit having the voltage dependency represented by the upwardly protruding curve. Hereinbelow, a description will be given to a structure of the distortion compensating capacitance circuit.

Figure 13A:
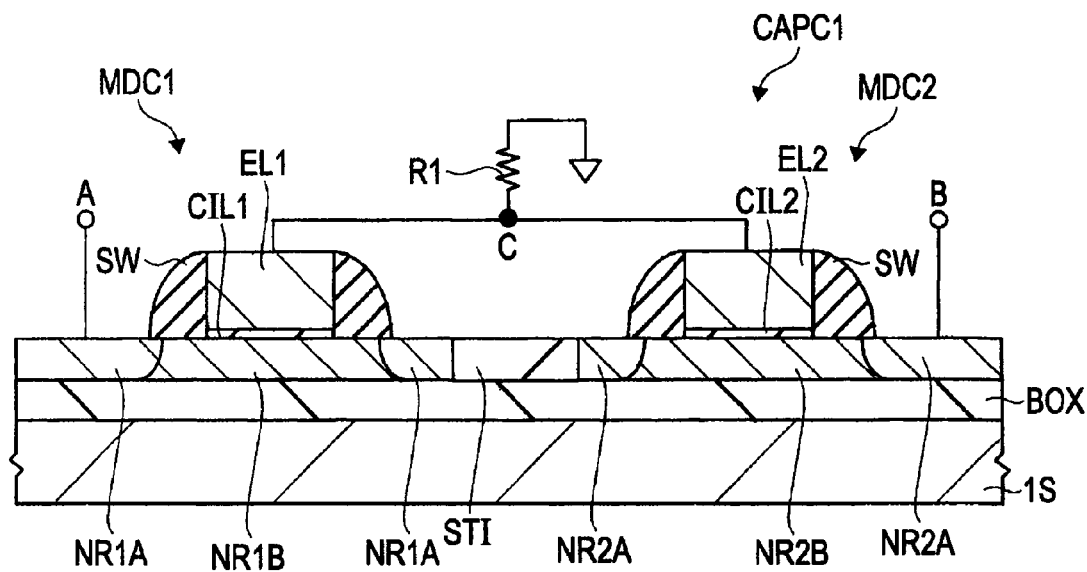
FIG. 13(a) is a view showing a structure of a distortion compensating capacitance circuit in the present invention.

FIG. 13(a) is a view showing a structure of a distortion compensating capacitance circuit CAPC1 in the present invention. As shown in FIG. 13(a), the distortion compensating capacitance circuit CAPC1 in the present invention is formed over the SOI substrate including the semiconductor substrate 1S, the buried insulating layer BOX formed over the semiconductor substrate 1S, and the silicon layer formed over the buried insulating layer BOX. The distortion compensating capacitance circuit CPAC1 in the present invention has the MOS diode capacitance element MDC1 and a MOS diode capacitance element MDC2 each formed over the SOI substrate. The MOS diode capacitance elements MDC1 and MDC2 are isolated by an isolation region STI formed in the silicon layer of the SOI substrate 1.

A specific description will be given to respective structures of the MOS diode capacitance elements MDC1 and MDC2 included in the distortion compensating capacitance circuit CAPC1 in the present invention. As shown in FIG. 13(a), the MOS diode capacitance element MDC1 has the pair of semiconductor regions NR1A formed in spaced-apart relation in the silicon layer of the SOI substrate, and the semiconductor region NR1B formed between the pair of semiconductor regions NR1A. Each of the semiconductor regions NR1A and the semiconductor region NR1B is a semiconductor region into which an impurity of the same conductivity type has been introduced, and formed of, e.g., an n-type semiconductor region into which an n-type impurity such as phosphorus has been introduced.

The MOS diode capacitance element MDC1 has, over the semiconductor region NR1B, the capacitance insulating film CIL1 formed of, e.g., a silicon oxide film and also has, over the capacitance insulating film CIL1, the electrode EL1. The electrode EL1 is formed of, e.g., a polysilicon film into which an n-type impurity such as phosphorus has been introduced. Over the both side walls of the electrode EL1, the sidewalls SW are formed.

Next, as shown in FIG. 13(a), the MOS diode capacitance element MDC2 has a pair of semiconductor regions NR2A formed in spaced-apart relation in the silicon layer of the SOI substrate, and a semiconductor region NR2B formed between the pair of semiconductor regions NR2A. Each of the semiconductor regions NR2A and the semiconductor region NR2B is a semiconductor region into which an impurity of the same conductivity type has been introduced, and formed of, e.g., an n-type semiconductor region into which an n-type impurity such as phosphorus has been introduced.

The MOS diode capacitance element MDC2 has, over the semiconductor region NR2B, a capacitance insulating film CIL2 formed of, e.g., a silicon oxide film and also has, over the capacitance insulating film CIL2, an electrode EL2. The electrode EL2 is formed of, e.g., a polysilicon film into which an n-type impurity such as phosphorus has been introduced. Over the both side walls of the electrode EL2, the sidewalls SW are formed.

In the MOS diode capacitance elements MDC1 and MDC2 thus structured, the terminal A is electrically coupled to the semiconductor region NR1A of the MOS diode capacitance element MDC1, and the terminal B is electrically coupled to the semiconductor region NR2A of the MOS diode capacitance element MDC2. The electrode EL1 of the MOS diode capacitance element MDC1 is electrically coupled to the electrode EL2 of the MOS diode capacitance element MDC2. A node C between the mutually coupled electrodes EL1 and EL2 is coupled to, e.g., a DC power source or a GND potential (ground potential) via a resistance element R1. The reason for coupling the node C to the DC power source or the GND potential is that, when the node C is brought into the floating state, charges may be accumulated in the node C to shift the potential of the node C from a desired value, and the shift should be prevented.

Figure 13B:
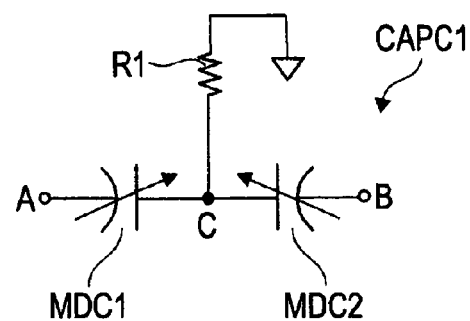
FIG. 13(b) is a view showing a circuit diagram of the distortion compensating capacitance circuit having the structure shown in FIG. 13(a)

The distortion compensating capacitance circuit CAPC1 in the present invention is structured as described above, and a circuit diagram thereof is as shown in FIG. 13(b). FIG. 13(b) is a view showing the circuit diagram of the distortion compensating capacitance circuit CAPC1 having the structure shown in FIG. 13(a). As shown in FIG. 13(b), in the distortion compensating circuit CAPC1 in the present invention, the MOS diode capacitance elements MDC1 and MDC2 are coupled in anti-series between the terminals A and B. It can be seen that the node C located at the middle between the MOS diode capacitance elements MDC1 and MDC2 is coupled to the DC power source or the GND potential via the resistance element R1.

Figure 14:
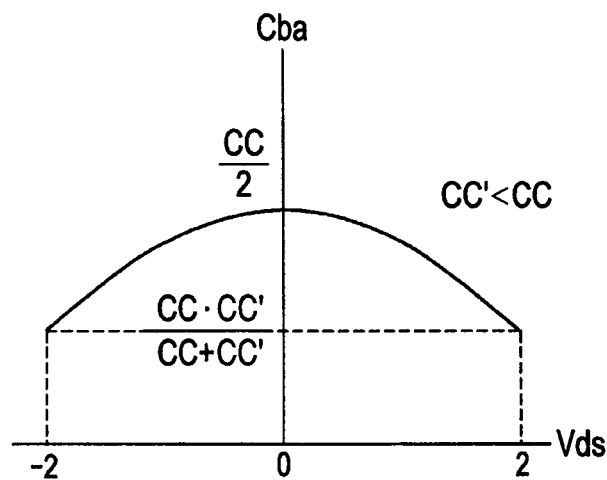
FIG. 14 is a graph showing the voltage dependency of the distortion compensating circuit.

Subsequently, a description will be given to the fact that the distortion compensating capacitance circuit CAPC1 in the present invention has the voltage dependency which is symmetric, and represented by the upwardly protruding curve. FIG. 14 is a graph showing the voltage dependency of the distortion compensating circuit CAPC1. First, a consideration will be given to the case where the voltage Vba applied between the terminals A and B is 0 V. It follows that, e.g., in FIGS. 13(a) and 13(b), 0 V is applied to each of the terminals A and B and the node C. At this time, to each of the electrode EL1 serving as the upper electrode of the MOS diode capacitance element MDC1 shown in FIGS. 13(a) and 13(b) and the semiconductor region NR1B serving as the lower electrode of the MOS diode capacitance element MDC1, 0 V is applied. Likewise, to each of the electrode EL2 serving as the upper electrode of the MOS diode capacitance element MDC2 shown in FIGS. 13(a) and 13(b) and the semiconductor region NR2B serving as the lower electrode of the MOS diode capacitance element MDC2, 0 V is applied.

Here, the capacitance insulating film CIL1 serving as the capacitance insulating film of the MOS diode capacitance element MDC1 and the capacitance insulating film CIL2 serving as the capacitance insulating film of the MOS diode capacitance element MDC2 have the same thicknesses. Accordingly, the capacitance value of the MOS diode capacitance element MDC1 and the capacitance value of the MOS diode capacitance element MDC2 are the same, and assumed to be, e.g., CC. At this time, since the capacitance value Cba of the distortion compensating capacitance circuit CAPC1 is the series sum of the capacitance value (CC) of the MOS diode capacitance element MDC1 and the capacitance value (CC) of the MOS diode capacitance element MDC2, the capacitance value Cba of the distortion compensating capacitance circuit CAPC1 is CC/2.

Subsequently, a consideration will be given to the case where the voltage Vba is a positive voltage (e.g., Vba=2 V). It follows that, e.g., in FIGS. 13(a) and 13(b), 0 V is applied to each of the terminal A and the node C, and +2 V is applied to the terminal B. At this time, to each of the electrode EL1 serving as the upper electrode of the MOS diode capacitance element MDC1 shown in FIGS. 13(a) and 13(b) and the semiconductor region NR1B serving as the lower electrode of the MOS diode capacitance element MDC1, 0 V is applied so that the capacitance value of the MOS diode capacitance element MDC1 remains CC. On the other hand, to the electrode EL2 serving as the upper electrode of the MOS diode capacitance element MDC2 shown in FIGS. 13(a) and 13(b), 0 V is applied and, to the semiconductor region NR2B serving as the lower electrode of the MOS diode capacitance element MDC2, +2 V is applied. Accordingly, in the MOS diode capacitance element MDC2, the voltage of the semiconductor region NR2B becomes a positive voltage with respect to the voltage of the electrode EL2, and therefore a depletion layer expands in the semiconductor region NR2B immediately under the capacitance insulating film CIL2. As a result, the thickness of the capacitance insulating film of the MOS diode capacitance element MDC2 is the combination of the thickness of the capacitance insulating film CIL2 and the thickness of the depletion layer. Consequently, the capacitance value of the MOS diode capacitance element MDC2 decreases, and is assumed to be, e.g., CC' (CC'<CC). In this case, since the capacitance value Cba of the distortion compensating capacitance circuit CAPC1 is the series sum of the capacitance value (CC) of the MOS diode capacitance element MDC1 and the capacitance value (CC') of the MOS diode capacitance element MDC2, the capacitance value Cba of the distortion compensating capacitance circuit CAPC1 is CC·CC'/(CC+CC'). That is, it can be seen that the capacitance value of the distortion compensating capacitance circuit CAPC1 when the voltage Vba is a positive value is lower than the capacitance value of the distortion compensating capacitance circuit CAPC1 when the voltage Vba is 0 V.

Next, a consideration will be given to the case where the voltage Vba is a negative voltage (e.g., Vba=−2 V). It follows that, e.g., in FIGS. 13(a) and 13(b), 0 V is applied to each of the terminal B and the node C, and +2 V is applied to the terminal A. At this time, to each of the electrode EL2 serving as the upper electrode of the MOS diode capacitance element MDC2 shown in FIGS. 13(a) and 13(b) and the semiconductor region NR2B serving as the lower electrode of the MOS diode capacitance element MDC2, 0 V is applied so that the capacitance value of the MOS diode capacitance element MDC2 remains CC. On the other hand, to the electrode EL1 serving as the upper electrode of the MOS diode capacitance element MDC1 shown in FIGS. 13(a) and 13(b), 0 V is applied and, to the semiconductor region NR1B serving as the lower electrode of the MOS diode capacitance element MDC1, +2 V is applied. Accordingly, in the MOS diode capacitance element MDC1, the voltage of the semiconductor region NR1B becomes a positive voltage with respect to the voltage of the electrode EL1, and therefore a depletion layer expands in the semiconductor region NR1B immediately under the capacitance insulating film CIL1. As a result, the thickness of the capacitance insulating film of the MOS diode capacitance element MDC1 is the combination of the thickness of the capacitance insulating film CIL1 and the thickness of the depletion layer. Consequently, the capacitance value of the MOS diode capacitance element MDC1 decreases. Here, since the structure of the MOS diode capacitance element MDC1 is the same as the structure of the MOS diode capacitance element MDC2, the thickness of the depletion layer formed in the MOS diode capacitance element MDC2 when the voltage Vba is a positive voltage (2V) is the same as the thickness of the depletion layer formed in the MOS diode capacitance element MDC1 when the voltage Vba is a negative voltage (−2V) as in the case considered herein. Accordingly, the capacitance value of the MOS diode capacitance element MDC1 when the voltage Vba is a negative voltage (−2 V) is CC' (CC'<CC), which is the same as the capacitance value of the MOS diode capacitance element MDC2 when the voltage Vba is a positive voltage (+2 V). In this case, since the capacitance value Cba of the distortion compensating capacitance circuit CAPC1 is the series sum of the capacitance value (CC') of the MOS diode capacitance element MDC1 and the capacitance value (CC) of the MOS diode capacitance element MDC2, the capacitance value Cba of the distortion compensating capacitance circuit CAPC1 is CC·CC'/(CC+CC'). That is, it can be seen that the capacitance value of the distortion compensating capacitance circuit CAPC1 when the voltage Vba is a negative value is lower than the capacitance value of the distortion compensating capacitance circuit CAPC1 when the voltage Vba is 0 V, and the same as the capacitance value of the distortion compensating capacitance circuit CAPC1 when the voltage Vba is a positive voltage (having the same absolute value). From the foregoing, as shown in FIG. 14, it can be seen that the capacitance value Cba of the distortion compensating capacitance circuit CAPC1 in the present invention is largest when the voltage Vba satisfies Vba=0 V, and smaller as the absolute value of the voltage Vba is larger even when the voltage Vba is a positive voltage or a negative voltage. That is, it will be understood that the capacitance value Cba of the distortion compensating capacitance circuit CAPC1 has the voltage dependency which is symmetric, and represented by the upwardly protruding curve.

It will be understood that, thus, the voltage dependency of the distortion compensating capacitance circuit CAPC1 shown in FIG. 14 is opposite to the voltage dependency (see FIG. 9) of the parasitic capacitance present between the source region S and the drain region D when the RF voltage (AC voltage) is applied. Therefore, it will be understood that, by adjusting the impurity concentrations of the semiconductor regions NR1B and NR2B serving as the lower electrodes of the MOS diode capacitance elements MDC1 and MDC2 included in the distortion compensating capacitance circuit CAPC1 as well as the widths of the electrodes EL1 and EL2 and thereby optimizing the voltage dependency of the capacitance value of the distortion compensating capacitance circuit CAPC1, it is possible to provide the distortion compensating capacitance circuit CAPC1 with the effect of cancelling out the third harmonic distortion resulting from the voltage dependency of the parasitic capacitance of the MISFET $Q_N$.

Note that, since the voltage dependency of the parasitic capacitance of the MISFET $Q_N$ is downwardly protruding and symmetric, it is important that the distortion compensating capacitance circuit CAPC1 having the voltage dependency opposite to this voltage dependency has the upwardly protruding voltage dependency and symmetry. Accordingly, it is desirable that the two MOS diode capacitance elements MDC1 and MDC2 included in the distortion compensating capacitance circuit CAPC1 have the same structures. Therefore, it is desirable that the two MOS diode capacitance elements MDC1 and MDC2 are formed of, e.g., identical n-type MOS diode capacitance elements or identical p-type MOS diode capacitance elements.

(Application of Distortion Compensating Capacitance Circuit to Antenna Switch)

Next, a description will be given to, when the distortion compensating capacitance circuit CAPC1 described above is applied to the antenna switch ASW, in terms of effectively reducing the third harmonic distortion, which component of the antenna switch ASW is desirable as a target in which the distortion compensating capacitance circuit CAPC1 is to be provided.

Figure 15:
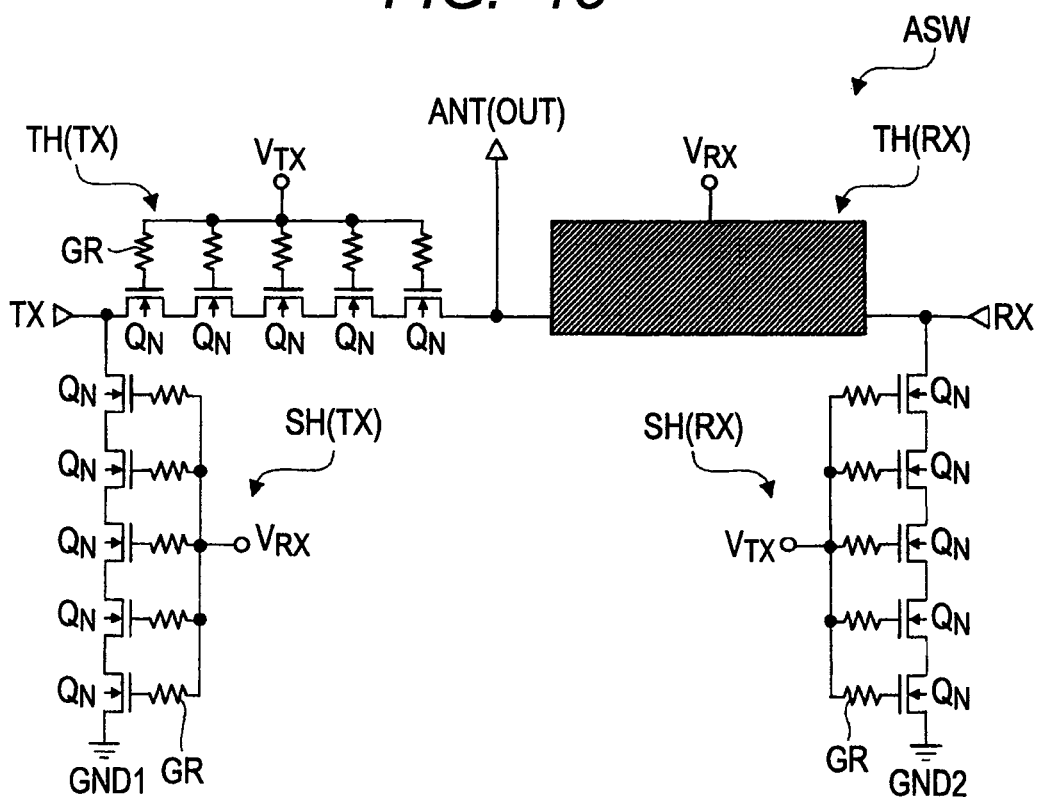
FIG. 15 is a view showing a circuit configuration of the antenna switch.

FIG. 15 is a view showing a circuit configuration of the antenna switch ASW. As shown in FIG. 15, the antenna switch ASW has the transmission terminal TX, the reception terminal RX, and the antenna terminal ANT(OUT). The antenna switch ASW has the TX through transistor TH(TX) between the transmission terminal TX and the antenna terminal ANT(OUT), and has the RX through transistor TH(RX) between the reception terminal RX and the antenna terminal ANT(OUT). In addition, the antenna switch ASW has the TX shunt transistor SH(TX) between the transmission terminal TX and the GND terminal GND1, and has the RX shunt transistor SH(RX) between the reception terminal RX and the GND terminal GND2.

In the present invention, in the antenna switch ASW thus configured, the distortion compensating capacitance circuit described above is applied to the RX through transistor TX (RX) (shown by the hatched region of FIG. 15). The reason for this is as follows. That is, the antenna switch ASW may transmit a transmission signal and receive a reception signal, and the transmission signal is a high-power signal, while the reception signal is a weak signal. Accordingly, the third harmonic distortion generated when the high-power transmission signal is transmitted also increases. Therefore, it is conceivably necessary to reduce the third harmonic distortion generated when the transmission signal is transmitted from the antenna switch ASW.

When the transmission signal is transmitted from the antenna switch ASW, the TX through transistor TH(TX) and the RX shunt transistor SH(RX) which are shown in FIG. 15 are turned on, and the RX through transistor TH(RX) and the TX shunt transistor SH(TX) are turned off. The third harmonic distortion is mainly generated from a transistor in the OFF state. Therefore, the present invention has added the distortion compensating capacitance circuits to the RX through transistor TH(RX) which is off when the transmission signal is transmitted from the antenna switch ASW.

Note that transistors which are off when the transmission signal is transmitted from the antenna switch ASW include not only the RF through transistor TH(RX), but also the TX shunt transistor SH(TX). However, the distortion compensating capacitance circuits are added not to the TX shunt transistor SH(TX), but to the RX through transistor TH(RX) for the following reason.

That is, since the RX through transistor TH(RX) is provided in a path by which the reception signal is directly transmitted, there is a great need to reduce the ON resistance. Therefore, the RX through transistor TH(RX) has a large gate width, and accordingly has a large size. On the other hand, since the TX shunt transistor SH(TX) is not provided in the path by which the signal is directly transmitted, the need to reduce the ON resistance thereof is smaller than the need to reduce the ON resistance of the RX through transistor TH(RX). In the TX shunt transistor SH(TX), it is rather necessary to minimize the leakage of the transmission signal via the OFF capacitance so that the gate width of the TX shunt transistor SH(TX) is smaller than the gate width of the RX through transistor TH(RX). This means that the size of the TX shunt transistor SH(TX) is smaller than the size of the RX through transistor TH(RX). Accordingly, when the distortion compensating capacitance circuits are added to the RX through transistor TH(RX) having a larger size, since the size of the RX through transistor TH(RX) is relatively large compared with the size of each of the distortion compensating capacitance circuits, the influence exerted on the RX through transistor TH(RX) by providing the distortion compensating capacitance circuits therein can be reduced. Conversely, if the distortion compensating capacitance circuits are added to the TX shunt transistor SH(TX) having a smaller size, the size difference between each of the distortion compensating capacitance circuits and the TX shunt transistor SH(TX) is smaller than the size difference between each of the distortion compensating capacitance circuits and the RX through transistor TH(RX). Therefore, the influence exerted on the TX shunt transistor SH(TX) by providing the distortion compensating capacitance circuits therein is increased. For this reason, the distortion compensating capacitance circuits are added to the RX through transistor TH(RX).

(Configuration and Problem of Japanese Patent Application No. 2009-158995)

As described above, when the distortion compensating capacitance circuits are additionally provided in the antenna switch ASW, the distortion compensating capacitance circuits are added to the RX through transistor TH(RX) included in the antenna switch ASW. A description will be given to an example (comparative example) of a configuration of Japanese Patent Application No. 2009-158995 obtained by actually adding the distortion compensating capacitance circuits to the RX through transistor TH(RX), and subsequently to the problem of the comparative example.

Figure 16:
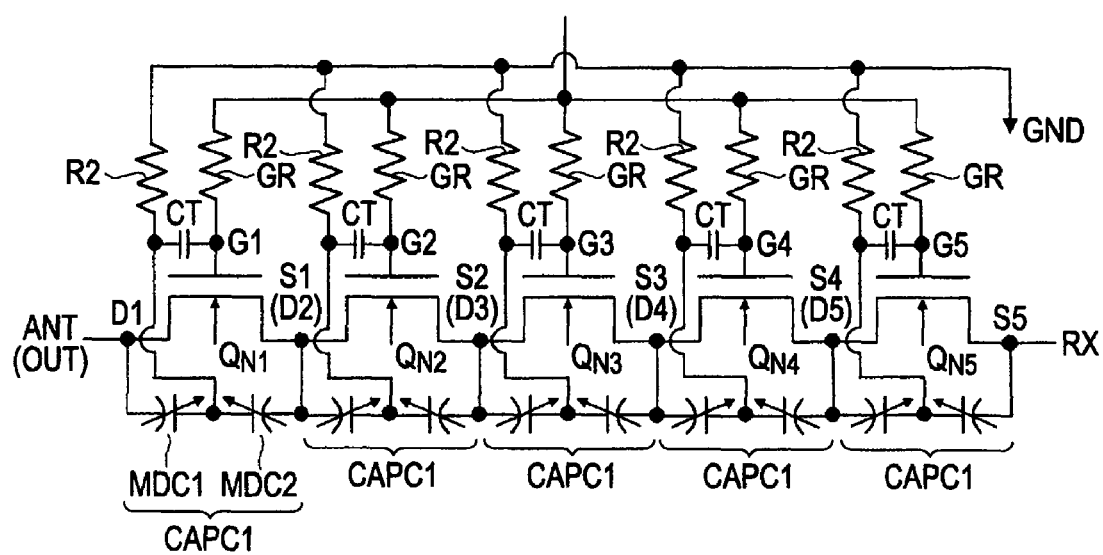
FIG. 16 is a circuit diagram showing a configuration of a comparative example obtained by adding the distortion compensating capacitance circuits to a RX through transistor.

FIG. 16 is a circuit diagram showing a configuration of the comparative example obtained by adding the distortion compensating capacitance circuits CAPC1 to the RX through transistor. As shown in FIG. 16, between the antenna terminal ANT(OUT) and the reception terminal RX, the five MISFETs $Q_{N1}$ to $Q_{N5}$ included in the RX through transistor are coupled in series. Specifically, the antenna terminal ANT(OUT) is coupled to the drain region D1 of the MISFET $Q_{N1}$, and the source region S1 of the MISFET $Q_{N1}$ is coupled to the drain region D2 of the MISFET $Q_{N2}$. Also, the source region S2 of the MISFET $Q_{N2}$ is coupled to the drain region D3 of the MISFET $Q_{N3}$, and the source region S3 of the MISFET $Q_{N3}$ is coupled to the drain region D4 of the MISFET $Q_{N4}$. Also, the source region S4 of the MISFET $Q_{N4}$ is coupled to the drain region D5 of the MISFET $Q_{m}$, and the source region S5 of the MISFET $Q_{N5}$ is coupled to the reception terminal RX.

In addition, the gate electrodes G1 to G5 of the MISFETs $Q_{N1}$ to $Q_{N5}$ are coupled to each other via the gate resistances GR. To each of the MISFETs $Q_{N1}$ to $Q_{N5}$, the distortion compensating capacitance circuit CAPC1 is coupled. Specifically, between the drain region D1 and the source region S1 of the MISFET $Q_{N1}$, the distortion compensating capacitance circuit CAPC1 is coupled and, between the drain region D2 and the source region S2 of the MISFET $Q_{N2}$, the distortion compensating capacitance circuit CAPC1 is coupled. Also, between the drain region D3 and the source region S3 of the MISFET $Q_{N4}$, the distortion compensating capacitance circuit CAPC1 is coupled and, between the drain region D4 and the source region S4 of the MISFET $Q_{N4}$, the distortion compensating capacitance circuit CAPC1 is coupled. Also, between the drain region D5 and the source region S5 of the, MISFET $Q_{N5}$, the distortion compensating capacitance circuit CAPC1 is coupled.

Each of the distortion compensating capacitance circuits CAPC1 coupled in parallel to the individual MISFETs $Q_{N1}$ to $Q_{N5}$ has a configuration in which the MOS diode capacitance elements MDC1 and MDC2 are coupled in anti-series. The middle nodes between the MOS diode capacitance elements MDC1 and MDC2 are coupled to the individual gate electrodes G1 to G5 via respective capacitance elements CT. The middle nodes between the MOS diode capacitance elements MDC1 and MDC2 are also bundled via respective resistance elements R2 to be coupled to GND (ground).

Here, the capacitance elements CT have the functions of AC-wise short-circuiting the middle nodes between the MOS diode capacitance elements MDC1 and MDC2 with the respective gate electrodes G1 to G5 of the MISFETs $Q_{N1}$ to $Q_{N5}$ and the respective body regions of the MISFETs $Q_{N1}$ to $Q_{N5}$. That is, the voltages (potentials) of the respective body regions of the MISFETs $Q_{N1}$ to $Q_{N5}$ have substantially middle values between the voltages of the respective source regions S1 to S5 and the voltages of the respective drain regions D1 to D5 of the MISFETs $Q_{N1}$ to $Q_{N5}$. Since the body regions are coupled to the gate electrodes G1 to G5 via gate capacitances having large capacitance values, the body regions are AC-wise short-circuited with the gate electrodes G1 to G5. Since the gate electrodes G1 to G5 are coupled to the respective middle nodes of the distortion compensating capacitance circuits CAPC1 via the capacitance elements CT, the body regions, the gate electrodes G1 to G5, and the middle nodes are eventually AC-wise short-circuited. Also, since the body regions have substantially middle values between the voltages of the source regions S1 to S5 and the voltages of the drain regions D1 to D5 of the MISFETs $Q_{N1}$ to $Q_{N5}$, the middle nodes short-circuited with the respective body regions have middle values between the voltages of the source regions S1 to S5 and the voltages of the drain regions D1 to D5 to which the respective distortion compensating capacitance circuits CAPC1 are coupled. As a result, the distortion compensating capacitance circuits CAPC1 become symmetrical with respect to the middle nodes. This ensures the symmetry of the voltage dependency of each of the distortion compensating capacitance circuits CAPC1, and allows the distortion compensating function of the distortion compensating capacitance circuit CAPC1 to be effectively achieved. Therefore, it can be said that the capacitance elements CT shown in FIG. 16 have the functions of ensuring the symmetries of the voltage dependencies of the distortion compensating capacitance circuits CAPC1.

Thus, in the comparative example, the capacitance elements CT are used to ensure the symmetries of the voltage dependencies of the distortion compensating capacitance circuits CAPC1. However, as a result of using the capacitance elements CT, problems as shown below occur. That is, as the capacitance elements CT, MIMS (Metal Insulator Metal) capacitance elements having small voltage dependencies are used desirably to prevent the occurrence of the higher-order harmonic distortion as a side-effect. However, to AC-wise short-circuit the gate electrodes G1 to G5 and the respective middle nodes of the distortion compensating capacitance circuits, large capacitance values are required. Specifically, each of the capacitance elements CT is required to have a capacitance value of about 1 pF. However, since a MIM capacitance element is generally low in capacitance density, to increase the capacitance value thereof, it is necessary to increase the area thereof to lead to the problem of an increased area occupied by the MIM capacitance element. In addition, it is necessary to newly form the MIM capacitance elements to also lead to the problem of the addition of extra manufacturing steps. Moreover, a parasitic capacitance occurs between each of the added capacitance elements CT and the support substrate forming the SOI substrate to also lead to the problem of the occurrence of the second harmonic distortion due to the parasitic capacitance.

(Distortion Compensating Capacitance Circuit in First Embodiment)

Accordingly, in the present first embodiment, measures have been taken to ensure the symmetry of the voltage dependency of each of the distortion compensating capacitance circuits without using the capacitance elements CT described above, and allow the distortion compensating function of the distortion compensating capacitance circuit to be effectively achieved. Hereinbelow, a structure of the distortion compensating capacitance circuit in the present first embodiment for which the measures have been taken will be described with reference to the drawings.

Figure 17A:
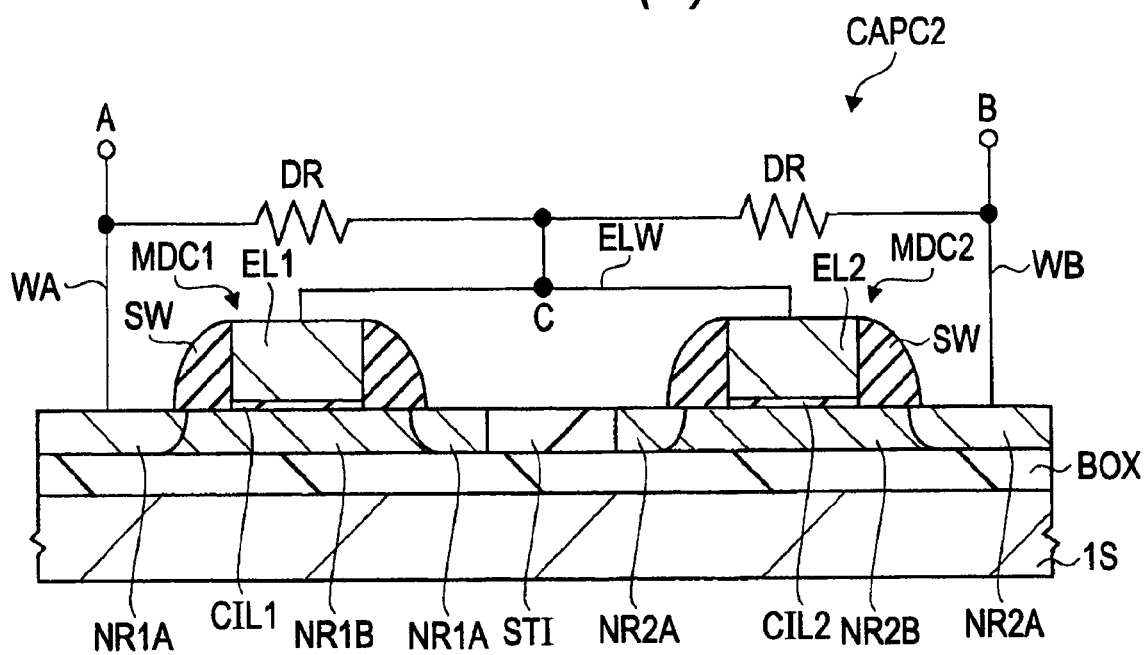
FIG. 17(a) is a view showing a structure of the distortion compensating capacitance circuit in the first embodiment.

FIG. 17(a) is a view showing a structure of a distortion compensating capacitance circuit CAPC2 in the present first embodiment. As shown in FIG. 17(a), the distortion compensating capacitance circuit CAPC2 in the present first embodiment is formed over the SOI substrate including the semiconductor substrate 1S, the buried insulating layer BOX formed over the semiconductor substrate 1S, and the silicon layer formed over the buried insulating layer BOX. The distortion compensating capacitance circuit CAPC2 in the present first embodiment has the MOS diode capacitance elements MDC1 and MDC2 formed over the SOI substrate. The MOS diode capacitance elements MDC1 and MDC2 are isolated by the isolation region STI formed in the silicon layer of the SOI substrate.

A specific description will be given to the respective structures of the MOS diode capacitance elements MDC1 and MDC2 included in the distortion compensating capacitance circuit CAPC2 in the present first embodiment. As shown in FIG. 17(a), the MOS diode capacitance element MDC1 has the pair of semiconductor regions NR1A formed in spaced-apart relation in the silicon layer of the SOI substrate, and the semiconductor region NR1B formed between the pair of semiconductor regions NR1A. Each of the semiconductor regions NR1A and the semiconductor region NR1B is a semiconductor region into which an impurity of the same conductivity type has been introduced, and formed of, e.g., an n-type semiconductor region into which an n-type impurity such as phosphorus has been introduced.

The MOS diode capacitance element MDC1 has, over the semiconductor region NR1B, the capacitance insulating film CIL1 formed of, e.g., a silicon oxide film and also has, over the capacitance insulating film CIL1, the electrode EL1. The electrode EL1 is formed of, e.g., a polysilicon film into which an n-type impurity such as phosphorus has been introduced. Over the both side walls of the electrode EL1, the sidewalls SW are formed.

Next, as shown in FIG. 17(a), the MOS diode capacitance element MDC2 has the pair of semiconductor regions NR2A formed in spaced-apart relation in the silicon layer of the SOI substrate, and the semiconductor region NR2B formed between the pair of semiconductor regions NR2A. Each of the semiconductor regions NR2A and the semiconductor region NR2B is a semiconductor region into which an impurity of the same conductivity type has been introduced, and formed of, e.g., an n-type semiconductor region into which an n-type impurity such as phosphorus has been introduced.

The MOS diode capacitance element MDC2 has, over the semiconductor region NR2B, the capacitance insulating film CIL2 formed of, e.g., a silicon oxide film and also has, over the capacitance insulating film CIL2, the electrode EL2. The electrode EL2 is formed of, e.g., a polysilicon film into which an n-type impurity such as phosphorus has been introduced. Over the both side walls of the electrode EL2, the sidewalls SW are formed.

In the MOS diode capacitance elements MDC1 and MDC2 thus structured, the terminal A is electrically coupled to the semiconductor region NR1A of the MOS diode capacitance element MDC1 via a wiring line WA, and the terminal B is electrically coupled to the semiconductor region NR2A of the MOS diode capacitance element MDC2 via a wiring line WB. The electrode EL1 of the MOS diode capacitance element MDC1 is electrically coupled to the electrode EL2 of the MOS diode capacitance element MDC2 via a wiring line ELW. In the description given thus far, the distortion compensating capacitance circuit CAPC2 in the present first embodiment has the same structure as that of the distortion compensating capacitance circuit CAPC1 shown in FIGS. 13(a) and 13(b). Therefore, it will be understood that the distortion compensating capacitance circuit CAPC2 in the present first embodiment also has the voltage dependency represented by the upwardly protruding curve (see FIG. 14).

The present first embodiment is characterized in that, between the node C between the electrodes EL1 and EL2 and the terminal A, a high resistance element DR is formed and, between the node C and the terminal B also, the high resistance element DR is formed. The high resistance element DR formed between the node C and the terminal A and the high resistance element DR formed between the node C and the terminal B have the same resistance values. Accordingly, to the node C, a voltage having the middle value of the voltage applied between the terminals A and B is applied. Therefore, in the distortion compensating capacitance circuit CAPC2 in the present first embodiment, it is possible to equalize the respective voltages applied to the MOS diode capacitance elements MDC1 and MDC2 with respect to the node C. That is, according to the present first embodiment, it is possible to ensure the symmetry of the voltage dependency of the distortion compensating capacitance circuit CAPC2 without using the capacitance elements CT used in the comparative example, and allow the distortion compensating function of the distortion compensating capacitance circuit to be effectively achieved.

Moreover, in the distortion capacitance circuit CAPC2 in the present first embodiment, by coupling the node C to the terminal A via the high resistance element DR and coupling the node C to the terminal B via the high resistance element DR, it is possible to prevent the node C from being brought into the floating state. For example, when the node C is in the floating state, charges may be accumulated in the node C in the floating state to shift the voltage (potential) of the node C from a middle value between the voltages of the terminals A and B. However, according to the present first embodiment, the node C is coupled to the terminals A and B via the high resistance elements DR, and therefore it is possible to prevent the node C from being brought into the floating state. As a result, it is possible to prevent the symmetry of the voltage dependency of the distortion compensating capacitance circuit with respect to the node C from being impaired due to the event that the node C is brought into the floating state. Thus, according to the present first embodiment, it is possible to sufficiently ensure the symmetry of the voltage dependency of the distortion compensating capacitance circuit CAPC2, and thereby obtain the remarkable effect of allowing the distortion compensating function of the distortion compensating capacitance circuit to be effectively achieved.

Figure 17B:
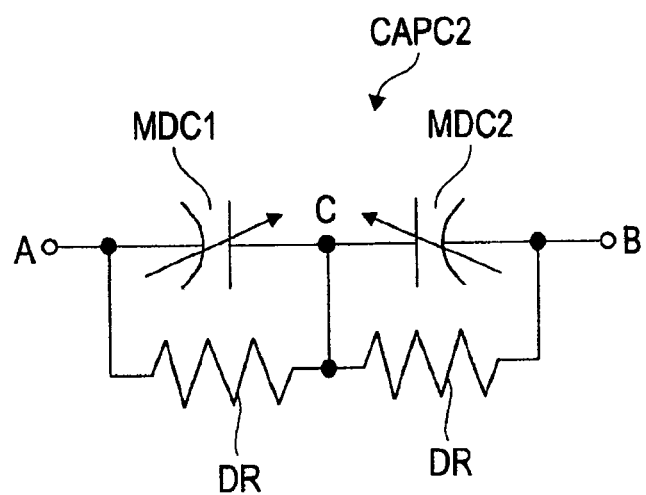
FIG. 17(b) is a view showing a circuit diagram of the distortion compensating capacitance circuit having the structure shown in FIG. 17(a)

The distortion compensating capacitance circuit CAPC2 in the present first embodiment is structured as described above, and a circuit diagram thereof is as shown in FIG. 17(b). FIG. 17(b) is a view showing the circuit diagram of the distortion compensating capacitance circuit CAPC2 having the structure shown in FIG. 17(a). As shown in FIG. 17(b), in the distortion compensating capacitance circuit CAPC2 in the present first embodiment, the MOS diode capacitance elements MDC1 and MDC2 are coupled in anti-series between the terminals A and B. In parallel to the MOS diode capacitance element MDC1, one of the high resistance elements DR is coupled and, in parallel to the MOS diode capacitance element MDC2, the other high resistance element DR is coupled. At this time, one of the high resistance elements DR and the other high resistance element DR have the same resistance values. As a result, to the node C located between the terminals A and B, a voltage resulting from voltage division between the two high resistance elements DR having equal resistance values is applied. Accordingly, it will be understood that, to the node C, a voltage having the middle value of the voltage applied between the terminals A and B is applied. Therefore, it will be understood that, in the distortion compensating capacitance circuit CAPC2 in the present first embodiment, symmetry with respect to the node C is ensured to allow the capacitance value of the distortion compensating capacitance circuit CAPC2 to have the voltage dependency which is symmetric, and represented by the upwardly protruding curve.

It will be understood that, thus, the voltage dependency of the distortion compensating capacitance circuit CAPC2 in the present first embodiment is opposite to the voltage dependency (see FIG. 9) of the parasitic capacitance present between the source region and the drain region when the RF voltage (AC voltage) is applied. Therefore, it will be understood that, by adjusting the impurity concentrations of the semiconductor regions NR1B and NR2B serving as the lower electrodes of the MOS diode capacitance elements MDC1 and MDC2 included in the distortion compensating capacitance circuit CAPC2 as well as the widths of the electrodes EL1 and EL2 and thereby optimizing the voltage dependency of the capacitance value of the distortion compensating capacitance circuit CAPC2, it is possible to provide the distortion compensating capacitance circuit CAPC2 with the effect of cancelling out the third harmonic distortion resulting from the voltage dependency of the parasitic capacitance of the MISFET (Application of Distortion Compensating Capacitance Circuit in First Embodiment to Antenna Switch)

Next, a description will be given to an example in which the distortion compensating capacitance circuit CAPC2 in the present first embodiment is applied to the antenna switch ASW. In the present first embodiment also, in terms of effectively reducing the third harmonic distortion, in the antenna switch ASW shown in FIG. 15, the distortion compensating capacitance circuit CAPC2 in the present first embodiment is applied to the RX through transistor TH(RX) (shown by the hatched region of FIG. 15).

Figure 18:
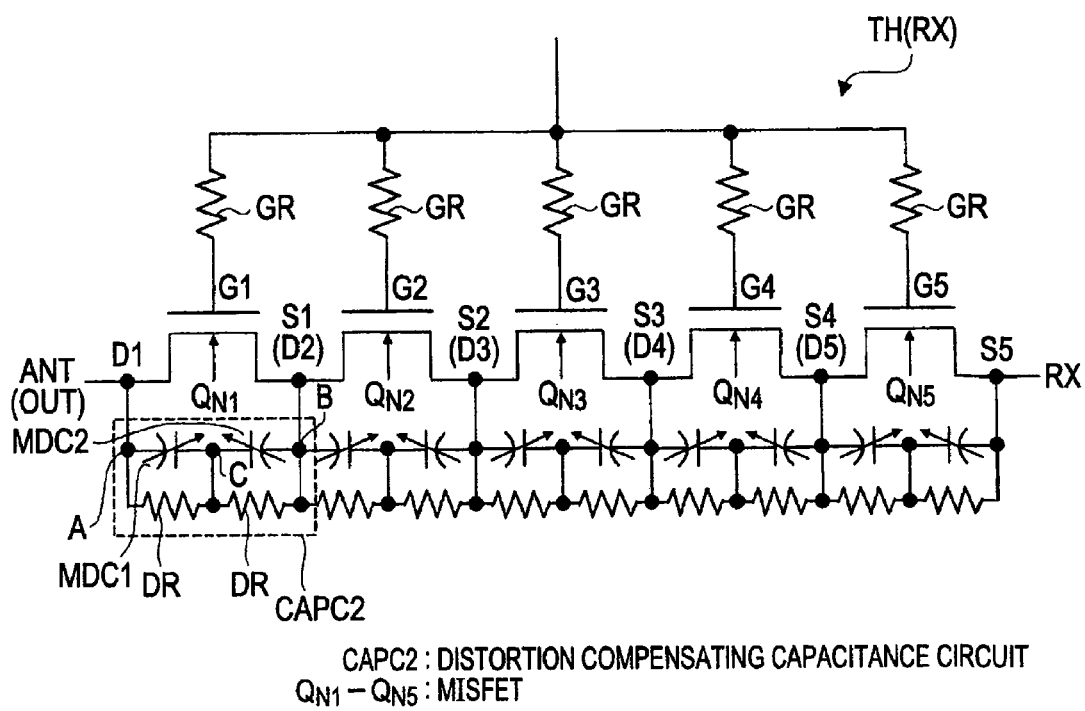
FIG. 18 is a circuit diagram showing a configuration obtained by adding the distortion compensating capacitance circuits in the first embodiment to the RX through transistor.

FIG. 18 is a circuit diagram showing a configuration obtained by adding the distortion compensating capacitance circuits CAPC2 in the present first embodiment to the RX through transistor TH(RX). As shown in FIG. 18, between the antenna terminal ANT(OUT) and the reception terminal RX, the five MISFETs $Q_{N1}$ to $Q_{N5}$ included in the RX through transistor TH(RX) are coupled in series. Specifically, the antenna terminal ANT(OUT) is coupled to the drain region D1 of the MISFET $Q_{N1}$, and the source region S1 of the MISFET $Q_{N1}$ is coupled to the drain region D2 of the MISFET $Q_{N2}$. Also, the source region S2 of the MISFET $Q_{N2}$ is coupled to the drain region D3 of the MISFET $Q_{N3}$, and the source region S3 of the MISFET $Q_{N3}$ is coupled to the drain region D4 of the MISFET $Q_{N4}$. Also, the source region S4 of the MISFET $Q_{N4}$ is coupled to the drain region D5 of the MISFET $Q_{N5}$, and the source region S5 of the MISFET $Q_{N5}$ is coupled to the reception terminal RX.

In addition, the gate electrodes G1 to G5 of the MISFETs $Q_{N1}$ to $Q_{N5}$ are coupled to each other via the gate resistances GR. To each of the MISFETs $Q_{N1}$ to $Q_{N5}$, the distortion compensating capacitance circuit CAPC2 is coupled. Specifically, between the drain region D1 and the source region S1 of the MISFET $Q_{N1}$, the distortion compensating capacitance circuit CAPC2 is coupled and, between the drain region D2 and the source region S2 of the MISFET $Q_{N2}$, the distortion compensating capacitance circuit CAPC2 is coupled. Also, between the drain region D3 and the source region S3 of the MISFET $Q_{N3}$, the distortion compensating capacitance circuit CAPC2 is coupled and, between the drain region D4 and the source region S4 of the MISFET $Q_{N4}$, the distortion compensating capacitance circuit CAPC2 is coupled. Also, between the drain region D5 and the source region S5 of the MISFET $Q_{N5}$, the distortion compensating capacitance circuit CAPC2 is coupled.

Here, the distortion compensating capacitance circuit CAPC2 in the present first embodiment has the voltage dependency represented by the upwardly protruding curve. That is, in the present first embodiment, between the respective source regions and the respective drain regions of the plurality of MISFETs $Q_{N1}$ to $Q_{N5}$ coupled in series, the capacitance circuits are coupled each of which has a voltage dependency such that, in either of the cases where a positive voltage is applied to the drain region based on the potential of the source region and where a negative voltage is applied to the drain region based on the potential of the source region, the capacitance decreases to a value smaller than that in a state where the potential of the source region and the potential of the drain region are at the same level.

Each of the distortion compensating capacitance circuits CAPC2 coupled in parallel to the individual MISFETs $Q_{N1}$ to $Q_{N5}$ has a configuration in which the MOS diode capacitance elements MDC1 and MDC2 are coupled in anti-series, and the node C between the MOS diode capacitance elements MDC1 and MDC2 has a voltage resulting from voltage division between the two high resistance elements DR provided between the terminals A and B and having equal resistance values. That is, between the terminal A and the node C, one of the high resistance elements DR is provided and, between the terminal B and the node C, the other high resistance element DR is provided. Accordingly, to the node C, a voltage having the middle value of the voltage applied between the terminals A and B is applied. Therefore, in the distortion compensating capacitance circuit CAPC2 in the present first embodiment, it is possible to equalize the respective voltages applied to the MOS diode capacitance elements MDC1 and MDC2 with respect to the node C. That is, according to the present first embodiment, it is possible to ensure the symmetry of the voltage dependency of each of the distortion compensating capacitance circuits CAPC2 without using the capacitance elements CT used in the comparative example, and allow the distortion compensating function of the distortion compensating capacitance circuit to be effectively achieved.

When attention is particularly focused on the distortion compensating capacitance circuit CAPC2 provided in parallel to the MISFET $Q_{N1}$, the terminal A of the distortion compensating capacitance circuit CAPC2 is coupled to the drain region D1 of the MISFET $Q_{N1}$, and the terminal B of the distortion compensating capacitance circuit CAPC2 is coupled to the source region S1 of the MISFET $Q_{N1}$. Here, the voltage (potential) of the node C of the distortion compensating capacitance circuit CAPC2 has a middle value between the voltages applied to the terminals A and B due to the two high resistance elements DR having equal resistance values. Since the terminal A is coupled to the drain region D1 of the MISFET $Q_{N1}$ and the terminal B is coupled to the source region S1 of the MISFET $Q_{N1}$, the voltage of the node C of the distortion compensating capacitance circuit CAPC2 is substantially equal to the voltage of the body region having substantially a middle value between the voltages applied to the drain region D1 and the source region S1.

Note that, in the present first embodiment, the terminals A and B of the distortion compensating capacitance circuit CAPC2 are electrically coupled via the two high resistance elements DR. Since the terminal A is coupled to the drain region D1 of the MISFET $Q_{N1}$ and the terminal B is coupled to the source region S1 of the MISFET $Q_{N1}$, it follows that the drain region D1 and the source region S1 are electrically coupled via the two high resistance elements DR. Therefore, it can be considered that, even when the MISFET $Q_{N1}$ is turned off, since the drain region D1 and the source region S1 are electrically coupled via the two high resistance elements DR, the RF signal undesirably flows between the drain region D1 and the source region S1. However, the resistance values of the high resistance elements DR are extremely high, and the RF signal can be sufficiently attenuated with the high resistance elements DR. That is, by setting the resistance values of the high resistance elements DR sufficiently high to cut off the transmission of the RF signal, the RF signal is prevented from flowing between the drain region D1 and the source region S1. Namely, in the present first embodiment, the high resistance elements DR provided in the distortion compensating capacitance circuit CAPC2 have an important function of setting the node C of the distortion compensating capacitance circuit CAPC2 at a middle potential between the potentials of the terminals A and B to ensure the symmetry of the voltage dependency of the distortion compensating capacitance circuit CAPC2 as well as the function of increasing the resistance values to cut off the transmission of the RF signal.

(Layout Configuration of Distortion Compensating Capacitance Circuit in First Embodiment)

Figure 19:
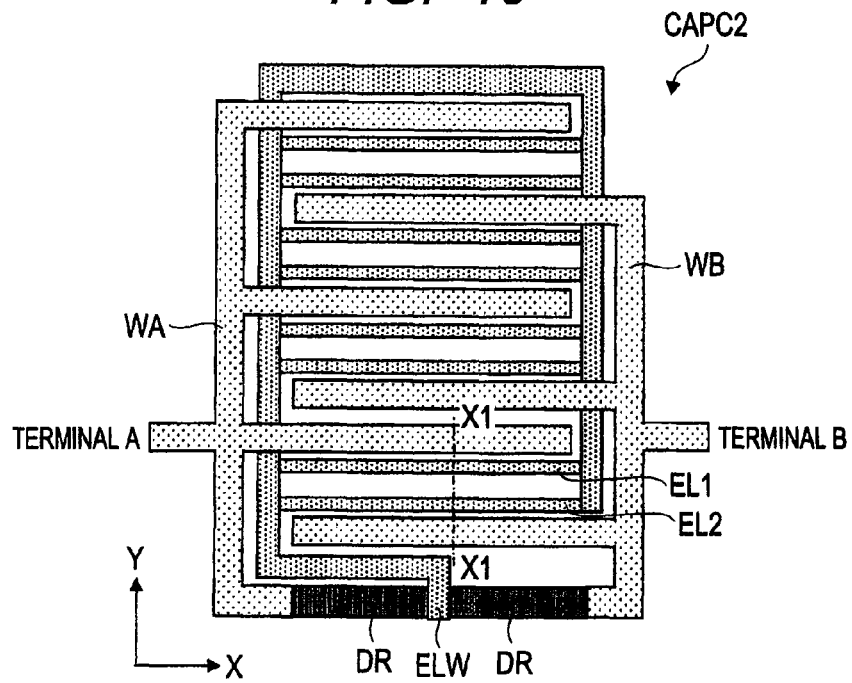
FIG. 19 is a view showing a layout configuration of the distortion compensating capacitance circuit in the first embodiment.

Next, a layout configuration of the distortion compensating capacitance circuit CAPC2 in the present first embodiment will be described. FIG. 19 is a view showing the layout configuration of the distortion compensating capacitance circuit CAPC2 in the present first embodiment. In FIG. 19, the electrodes EL1 and EL2 extend side by side in the X-direction (lateral direction) of the paper sheet with FIG. 19. Specifically, the electrodes EL1 and the electrodes EL2 are paired in one-to-one correspondence, and the plurality of pairs are arranged in the Y-direction (vertical direction), while each extending in the X-direction (lateral direction). A wiring line ELW is placed so as to surround the electrodes EL1 and EL2. That is, the wiring line ELW is routed so as to electrically couple the electrodes EL1 and EL2. In addition, the wiring line WA coupled to the terminal A and the wiring line WB coupled to the terminal B are placed in an interdigitating configuration so as to extend from the area outside the wiring line ELW surrounding the electrodes EL1 and EL2 to the area inside the wiring line ELW. The wiring lines WA and ELW are coupled via one of the high resistance elements DR, while the wiring lines WB and ELW are coupled via the other high resistance element DR. Note that the cross-sectional view along the line X1-X1 of FIG. 19 corresponds to FIG. 17(a).

(Layout Configuration of RX Through Transistor in First Embodiment)

Figure 20:
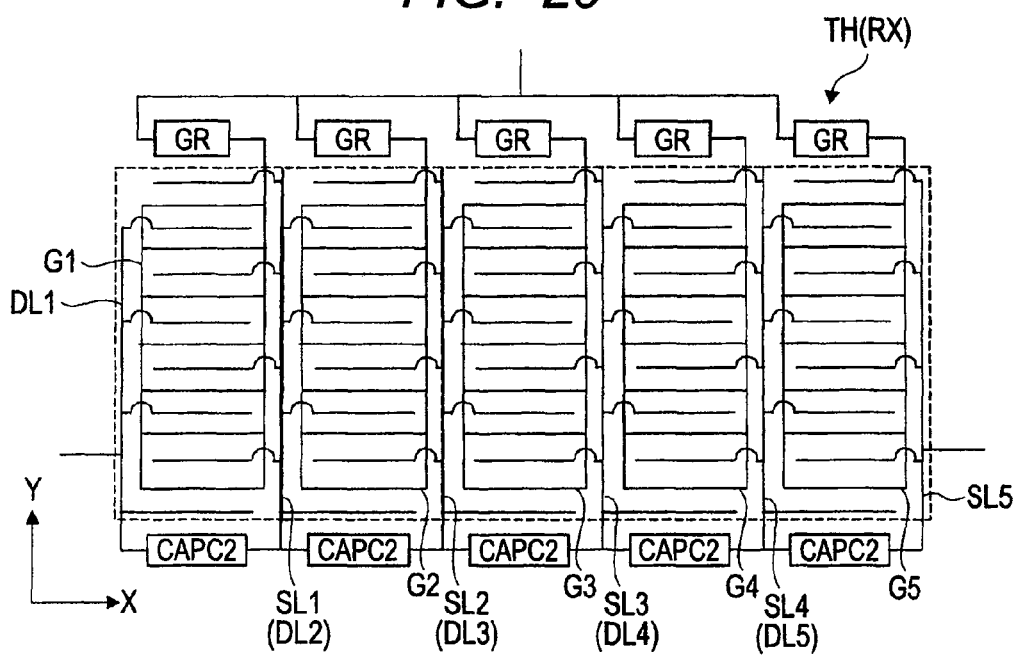
FIG. 20 is a view showing a layout configuration of the RX through transistor in the first embodiment.

Subsequently, a description will be given to a layout configuration of the RX through transistor TH(RX) provided with the distortion compensating capacitance circuits CAPC2 in the present first embodiment. FIG. 20 is a view showing the layout configuration of the RX through transistor TH(RX) in the present first embodiment.

As shown in FIG. 20, drain lines DL1 to DL5 and source lines SL1 to SL5 which are placed to be arranged in the X-direction (lateral direction) extend in the Y-direction (vertical direction). At this time, the drain line DL2 and the source line SL1 are formed as a single common line, and the drain line DL3 and the source line SL2 are formed as a single common line. Likewise, the drain line DL4 and the source line SL3 are formed as a single common line, and the drain line DL5 and the source line SL4 are formed as a single common line. From each of the drain lines DL1 to DL5 and the source lines SL1 to SL5, branch lines extend in the X-direction (lateral direction).

For example, when attention is focused on the drain line DL1 and the source line SL1, the branch lines extending from the drain line DL1 in the X-direction and the branch lines extending from the source line SL1 in the X-direction are alternately arranged in an interdigitating configuration. The gate electrode G1 extends in the X-direction so as to be interposed between the branch lines extending from the drain line DL1 in the X-direction and the branch lines extending from the source line SL1 in the X-direction. The gate electrode G1 extending in the X-direction is coupled at the end portions thereof to arterial lines extending in the Y-direction, which are coupled to gate resistances GR. On the other hand, between the drain line DL1 and the source line SL1, the distortion compensating capacitance circuit CAPC2 is coupled.

Likewise, when attention is focused on the drain line DL2 and the source line SL2, the branch lines extending from the drain line DL2 in the X-direction and the branch lines extending from the source line SL2 in the X-direction are alternately arranged in an interdigitating configuration. The gate electrode G2 extends in the X-direction so as to be interposed between the branch lines extending from the drain line DL2 in the X-direction and the branch lines extending from the source line SL2 in the X-direction. The gate electrode G2 extending in the X-direction is coupled at the end portions thereof to arterial lines extending in the Y-direction, which are coupled to the gate resistances GR. On the other hand, between the drain line DL2 and the source line SL2, the distortion compensating capacitance circuit CAPC2 is coupled.

Also, when attention is focused on the drain line DL3 and the source line SL3, the branch lines extending from the drain line DL3 in the X-direction and the branch lines extending from the source line SL3 in the X-direction are alternately arranged in an interdigitating configuration. The gate electrode G3 extends in the X-direction so as to be interposed between the branch lines extending from the drain line DL3 in the X-direction DL3 and the branch lines extending from the source line SL3 in the X-direction. The gate electrode G3 extending in the X-direction is coupled at the end portions thereof to arterial lines extending in the Y-direction, which are coupled to the gate resistances GR. On the other hand, between the drain line DL3 and the source line SL3, the distortion compensating capacitance circuit CAPC2 is coupled.

Also, when attention is focused on the drain line DL4 and the source line SL4, the branch lines extending from the drain line DL4 in the X-direction and the branch lines extending from the source line SL4 in the X-direction are alternately arranged in an interdigitating configuration. The gate electrode G4 extends in the X-direction so as to be interposed between the branch lines extending from the drain line DL4 in the X-direction and the branch lines extending from the source line SL4 in the X-direction. The gate electrode G4 extending in the X-direction is coupled at the end portions thereof to arterial lines extending in the Y-direction, which are coupled to the gate resistances GR. On the other hand, between the drain line DL4 and the source line SL4, the distortion compensating capacitance circuit CAPC2 is coupled.

Likewise, when attention is focused on the drain line DL5 and the source line SL5, the branch lines extending from the drain line DL5 in the X-direction and the branch lines extending from the source line SL5 in the X-direction are alternately arranged in an interdigitating configuration. The gate electrode G5 extends in the X-direction so as to be interposed between the branch lines extending from the drain line DL5 in the X-direction and the branch lines extending from the source line SL5 in the X-direction. The gate electrode G5 extending in the X-direction is coupled at the end portions thereof to arterial lines extending in the Y-direction, which are coupled to the gate resistances GR. On the other hand, between the drain line DL5 and the source line SL5, the distortion compensating capacitance circuit CAPC2 is coupled. The foregoing is the layout configuration of the RX through transistor TH(RX) provided with the distortion compensating capacitance circuits CAPC2 in the present first embodiment.

(Effects of First Embodiment)

By applying the distortion compensating capacitance circuit CAPC2 in the present first embodiment to the antenna switch ASW, effects as shown below can be obtained. That is, as in the distortion compensating capacitance circuit CAPC2 in the present first embodiment, when the MOS diode capacitance elements MDC1 and MDC2 are coupled in anti-series, due to the voltage dependencies of the MOS diode capacitance elements MDC1 and MDC2, the capacitance value of the distortion compensating capacitance circuit CAPC2 has the voltage dependency represented by the upwardly protruding curve. Therefore, the third harmonic distortion generated from the distortion compensating capacitance circuit CAPC2 in the present first embodiment can cancel out the anti-phase third harmonic distortion resulting from the voltage dependency (voltage dependency represented by the upwardly protruding curve) of the OFF capacitance in each of the MISFETs $Q_{N1}$ to $Q_{N5}$ included in the antenna switch ASW. As a result, it is possible to reduce the absolute value of the third harmonic distortion generated from the antenna switch ASW.

In the present first embodiment, to achieve the effect described above, the capacitance value of the distortion compensating capacitance circuit CAPC2 and the voltage dependency thereof are set such that the third harmonic distortion generated from the distortion compensating capacitance circuit CAPC2 compensates for the third harmonic distortion generated from each of the MISFETs $Q_{N1}$ to $Q_{N5}$. Specifically, the impurity concentration of the semiconductor region NR1B shown in FIG. 17(a) is about $5\times10^{17}/\text{cm}^3$, and the width of each of the electrodes EL1 and EL2 is about 1/10 of the gate width of each of the MISFETs $Q_{N1}$ to $Q_{N5}$.

To allow the third harmonic distortion generated from the distortion compensating capacitance circuit CAPC2 described above to effectively cancel out the third harmonic distortion generated from each of the MISFETs $Q_{N1}$ to $Q_{N5}$, it is needed to ensure the symmetry of the voltage dependency of the capacitance value of the distortion compensating capacitance circuit CAPC2. Accordingly, in the comparative example shown in FIG. 16, for example, the capacitance element CT is provided between the gate electrode G1 of the MISFET $Q_{N1}$ and the middle node of the distortion compensating capacitance circuit CAPC1 to AC-wise short-circuit the gate electrode G1 and the middle node, and thereby ensure the symmetry of the voltage dependency of the distortion compensating capacitance circuit CAPC1. However, in the case of providing the capacitance element CT, as side-effects thereof, problems arise such as an increased area occupied by the capacitance element CT, the addition of manufacturing steps, and an increased secondary harmonic distortion resulting from an increased parasitic capacitance between the capacitance element CT and the SOI substrate.

By contrast, in the present first embodiment, as shown in FIG. 18, the high resistance element DR is formed between the node C and the terminal A, and the high resistance element DR is formed between the node C and the terminal B. Since the high resistance element DR formed between the node C and the terminal A and the high resistance element DR formed between the node C and the terminal B have the same resistance values, it follows that a voltage having the middle value of the voltage applied between the terminals A and B is applied. Therefore, in the distortion compensating capacitance circuit CAPC2 in the present first embodiment, it is possible to equalize the respective voltages applied to the MOS diode capacitance elements MDC1 and MDC2 with respect to the node C. That is, according to the present first embodiment, it is possible to ensure the symmetry of the voltage dependency of the distortion compensating capacitance circuit CAPC2 without using the capacitance elements CT used in the comparative example, and allow the distortion compensating function of the distortion compensating capacitance circuit to be effectively achieved. Thus, the present first embodiment eliminates the need to use the capacitance elements CT used in the comparative example shown in FIG. 16, and allows the avoidance of the side-effects caused by using the capacitance elements CT.

Also, in the comparative example, to prevent the middle node of each of the distortion compensating capacitance circuits CAPC1 from being brought into the floating state, as shown in FIG. 16, the middle node is coupled to GND (ground) via the resistance elements R2. In this case, the need arises to newly provide the resistance elements R2 aside from the capacitance element CT, and there is the need to newly provide a new wiring line for coupling the middle node to GND (ground), which results in an increased area occupied by the antenna switch ASW. By contrast, in each of the distortion compensating capacitance circuits CAPC2 in the present first embodiment shown in FIG. 18, the node C is coupled to the terminals A and B via the high resistance elements DR, and therefore it is possible to prevent the node C from being brought into the floating state. As a result, it is possible to prevent the symmetry of the voltage dependency of the distortion compensating capacitance circuit with respect to the node C from being impaired due to the event in which the node C is brought into the floating state. That is, in the present first embodiment, to set the node C at the middle potential between the potentials of the terminals A and B and ensure the symmetry of the voltage dependency of the distortion compensating capacitance circuit CAPC2, the two high resistance elements DR are provided. By the high resistance elements DR, the node C is electrically coupled to the terminals A and B, and consequently, by providing the high resistance elements DR, it is also possible to simultaneously prevent the node C from being brought into the floating state.

Compared with the antenna switch ASW that is not provided with the distortion compensating capacitance circuits CAPC2, the antenna switch ASW in the present first embodiment allows for a reduction of about 10 dB in third harmonic distortion without substantially affecting characteristics other than the third harmonic distortion, such as the second harmonic distortion, a loss, and isolation.

In addition, according to the present first embodiment, the capacitance elements CT that are necessary in the comparative example shown in FIG. 16 are no longer necessary. Therefore, compared with the second harmonic distortion in the antenna switch ASW in the comparative example, the second harmonic distortion can be reduced by about 3 dB and, moreover, it is also possible to obtain the effect of reducing the area occupied by the antenna switch ASW and the number of manufacturing steps.

Thus, in a semiconductor chip formed with the antenna switch ASW in the present first embodiment, it is possible to obtain the remarkable effect of allowing for a reduction as large as about 10 dB in third harmonic distortion without substantially increasing manufacturing cost and a chip size.

Second Embodiment

Application of Distortion Compensating Capacitance Circuit in Second Embodiment to Antenna Switch In the foregoing first embodiment, the description has been given to the example in which, between the respective source regions and the respective drain regions of the plurality of MISFETs $Q_{N1}$ to $Q_{N5}$ included in the RX through transistor TH(RX), the distortion compensating capacitance circuits CAPC2 are provided. In the present second embodiment, a description will be given to a configuration in which the plurality of distortion compensating capacitance circuit CAPC2 are coupled in series between the antenna terminal ANT(OUT) provided with the RF through transistor TH(RX) and the reception terminal RX.

Figure 21:
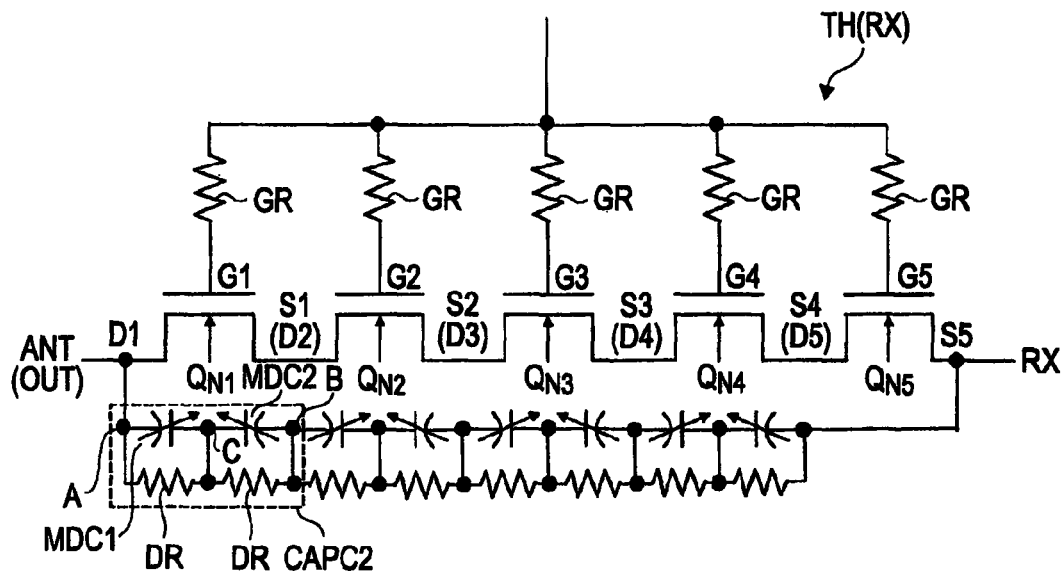
FIG. 21 is a circuit diagram showing a circuit configuration of the RX through transistor provided with distortion compensating capacitance circuits in a second embodiment.

FIG. 21 is a circuit diagram showing a circuit configuration of the RX through transistor TH(RX) provided with the distortion compensating capacitance circuits CAPC2 in the present second embodiment. As shown in FIG. 21, between the antenna terminal ANT(OUT) and the reception terminal RX, the five MISFETs $Q_{N1}$ to $Q_{N5}$ included in the RX through transistor TH(RX) are coupled in series. Specifically, the antenna terminal ANT(OUT) is coupled to the drain region D1 of the MISFET $Q_{N1}$, and the source region S1 of the MISFET $Q_{N1}$ is coupled to the drain region D2 of the MISFET $Q_{N2}$. Also, the source region S2 of the MISFET $Q_{N2}$ is coupled to the drain region D3 of the MISFET $Q_{N3}$, and the source region S3 of the MISFET $Q_{N3}$ is coupled to the drain region D4 of the MISFET $Q_{N4}$. Also, the source region S4 of the MISFET $Q_{N4}$ is coupled to the drain region D5 of the MISFET $Q_{N5}$, and the source region S5 of the MISFET $Q_{N5}$ is coupled to the reception terminal RX.

In addition, the gate, electrodes G1 to G5 of the MISFETs $Q_{N1}$ to $Q_{N5}$ are coupled to each other via the gate resistances GR. In the present second embodiment, between the antenna terminal ANT(OUT) and the reception terminal RX, the plurality of distortion compensating capacitance circuits CAPC2 are coupled in series. Specifically, in the present second embodiment, as shown in FIG. 21, the four distortion compensating capacitance circuits CAPC2 are coupled in series between the antenna terminal ANT(OUT) and the reception terminal RX. That is, in the present second embodiment, the five MISFETs $Q_{N1}$ to $Q_{N5}$ are coupled in series between the antenna terminal ANT(OUT) and the reception terminal RX, and the four series-coupled distortion compensating capacitance circuits CAPC2 are coupled in parallel to the five MISFETs $Q_{N1}$ to $Q_{N5}$.

Here, the distortion compensating capacitance circuit CAPC2 in the present second embodiment has the voltage dependency represented by the upwardly protruding curve. In the present second embodiment, between the antenna terminal ANT(OUT) and the reception terminal RX, the capacitance circuits are coupled each of which has a voltage dependency such that, in either of the cases where a positive voltage is applied to the reception terminal RX based on the potential of the antenna terminal ANT(OUT) and where a negative voltage is applied to the reception terminal RX based on the potential of the antenna terminal ANT(OUT), the capacitance decreases to a value smaller than that in a state where the potential of the antenna terminal ANT(OUT) and the potential of the reception terminal RX are at the same level.

(Layout Configuration of RX Through Transistor in Second Embodiment)

Figure 22:
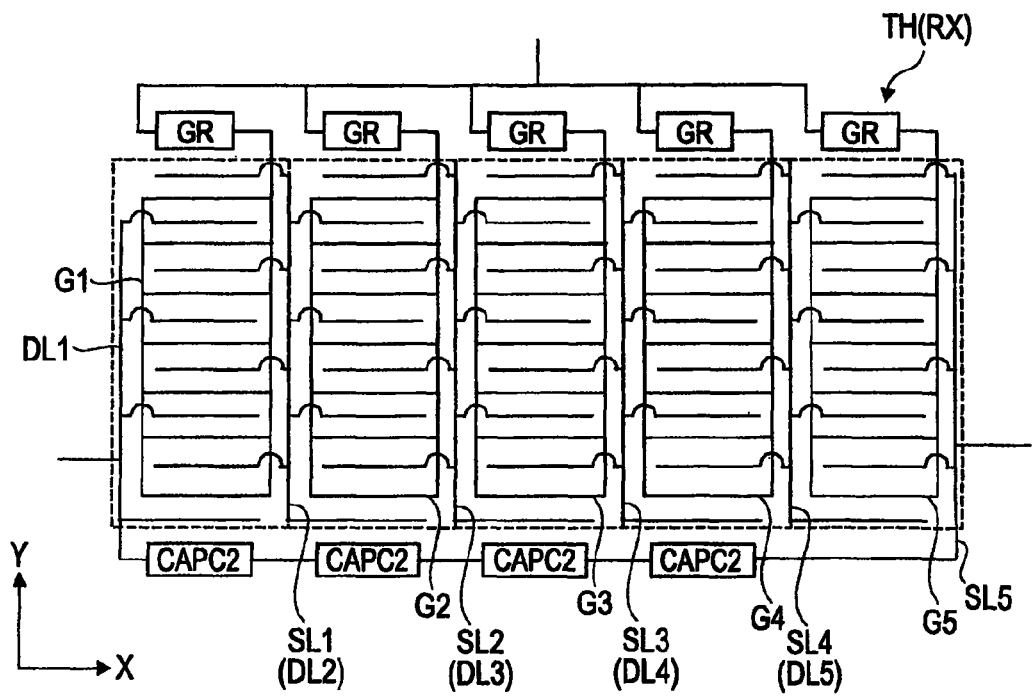
FIG. 22 is a view showing a layout configuration of the RX through transistor in the second embodiment.

Next, FIG. 22 is a view showing a layout configuration of the RX through transistor TH(RX) in the present second embodiment. The layout configuration of the RX through transistor TH(RX) in the present second embodiment is substantially the same as the layout configuration of the RX through transistor TH(RX) in the foregoing first embodiment shown in FIG. 20. What is different is that, in the present second embodiment, between the drain line DL1 and the source line SL5, the four distortion compensating capacitance circuits CAPC2 are provided in series.

(Effects of Second Embodiment)

The antenna switch ASW in the present second embodiment is configured as described above. By applying the distortion compensating capacitance circuit CAPC2 in the present second embodiment to the antenna switch ASW, effects as shown below can be obtained. That is, the capacitance value of the distortion compensating capacitance circuit CAPC2 in the present second embodiment has the voltage dependency represented by the upwardly protruding curve, in the same manner as in the foregoing first embodiment. Therefore, the third harmonic distortion generated from the distortion compensating capacitance circuit CAPC2 in the present second embodiment can cancel out the anti-phase third harmonic distortion resulting from the voltage dependency (voltage dependency represented by the upwardly protruding curve) of the OFF capacitance in each of the MISFETs $Q_{N1}$ to $Q_{N5}$ included in the antenna switch ASW. As a result, it is possible to reduce the absolute value of the third harmonic distortion generated from the antenna switch ASW.

In the present second embodiment, to achieve the effect described above, the capacitance value of the distortion compensating capacitance circuit CAPC2 and the voltage dependency thereof are set such that the third harmonic distortion generated from the distortion compensating capacitance circuit CAPC2 compensates for the third harmonic distortion generated from each of the MISFETs $Q_{N1}$ to $Q_{N5}$. Specifically, the impurity concentration of the semiconductor region NR1B shown in FIG. 17(a) is about $5 \times 10^{17}/cm^3$, and the width of each of the electrodes EL1 and EL2 is about 1/10 of the gate width of each of the MISFETs $Q_{N1}$ to $Q_{N5}$.

Also, in the present second embodiment, as shown in FIG. 21, the high resistance element DR is formed between the node C and the terminal A, and the high resistance element DR is formed between the node C and the terminal B. Since the high resistance element DR formed between the node C and the terminal A and the high resistance element DR formed between the node C and the terminal B have the same resistance values, it follows that a voltage having the middle value of the voltage applied between the terminals A and B is applied. Therefore, in the distortion compensating capacitance circuit CAPC2 in the present second embodiment, it is possible to equalize the respective voltages applied to the MOS diode capacitance elements MDC1 and MDC2 with respect to the node C. That is, according to the present second embodiment, it is possible to ensure the symmetry of the voltage dependency of the distortion compensating capacitance circuit CAPC2, and allow the distortion compensating function of the distortion compensating capacitance circuit to be effectively achieved.

Also, in each of the distortion compensating capacitance circuits CAPC2 in the present second embodiment shown in FIG. 21, the node C is coupled to the antenna terminal ANT(OUT) and the reception terminal RX via the high resistance elements DR, and therefore it is possible to prevent the node C from being brought into the floating state. As a result, it is possible to prevent the symmetry of the voltage dependency of the distortion compensating capacitance circuit with respect to the node C from being impaired due to the event in which the node C is brought into the floating state.

Examples of an effect specific to the present second embodiment that can be considered include the following effect. That is, in the present second embodiment, the plurality of distortion compensating capacitance circuits CAPC2 are structured to be coupled between the antenna terminal ANT(OUT) and the reception terminal RX. This allows the number of the series-coupled stages of the distortion compensating capacitance circuits CAPC2 to be inserted between the antenna terminal ANT(OUT) and the reception terminal RX to be set independently of the number of the series-coupled stages of the MISFETs $Q_{N1}$ to $Q_{N5}$ to be provided between the antenna terminal ANT(OUT) and the reception terminal RX. As a result, the design flexibility of the antenna switch ASW to which the distortion compensating capacitance circuits CAPC2 have been added increases to allow an improvement in the accuracy of distortion compensation by each of the distortion compensating capacitance circuits CAPC2.

Finally in the present second embodiment, a description will be given to the advantage of providing the distortion compensating capacitance circuits CAPC2 between the antenna terminal ANT(OUT) and the reception terminal RX. For example, in the antenna switch ASW shown in FIG. 15, when the RX through transistor TH(RX) is off, the RX shunt transistor SH(RX) is turned on so that the reception terminal RX is at a ground potential. Therefore, in the present second embodiment, the distortion compensating capacitance circuits CAPC2 are provided between the antenna terminal ANT(OUT) and the reception terminal RX. Since the reception terminal RX is substantially at the ground potential, even when the distortion compensating capacitance circuits CAPC2 are provided between the antenna terminal ANT(OUT) and the GND terminal, the same effect can be conceivably obtained.

Subsequently, a consideration will be given to the case where the RX through transistor TH(RX) is on. In this case, since the RX through transistor TH(RX) is on, the RX through transistor TH(RX) is no longer a main generation source of the third harmonic distortion resulting from the voltage dependency of the OFF capacitance. That is, when the RX through transistor TH(RX) is on, the third harmonic distortion generated from the RX through transistor TH(RX) decreases, and therefore it is desirable to reduce the anti-phase third harmonic distortion generated from the distortion compensating capacitance circuit CAPC2.

Here, since the RX shunt transistor SH(RX) is off, the reception terminal RX is no longer at the ground potential. That is, when the RX shunt transistor SH(RX) is on, conduction occurs between the antenna terminal ANT(OUT) and the reception terminal RX so that the voltage difference between the antenna terminal ANT(OUT) and the reception terminal RX decreases. Accordingly, when the distortion compensating capacitance circuits CAPC2 are coupled between the antenna terminal ANT(OUT) and the reception terminal RX, the voltage applied to each of the distortion compensating capacitance circuits CAPC2 also decreases. As a result, the anti-phase third harmonic distortion generated from the distortion compensating capacitance circuit CAPC2 also decreases. Therefore, when the distortion compensating capacitance circuits CAPC2 are coupled between the antenna terminal ANT(OUT) and the reception terminal RX, if the RX through transistor TH (RX) is off and serves as the main generation source of the third harmonic distortion, each of the distortion compensating capacitance circuits CAPC2 generates the large anti-phase third harmonic distortion so as to compensate therefor. On the other hand, if the RX through transistor TH (RX) is on and does not serve as the main generation source of the third harmonic distortion, the anti-phase third harmonic distortion generated from each of the distortion compensating capacitance circuits CAPC2 also decreases. As a result, excessive compensation by the distortion compensating capacitance circuit CAPC2 is advantageously suppressed.

On the other hand, a consideration will be given to the case where, between the antenna terminal ANT(OUT) and the GND terminal, the distortion compensating capacitance circuits CAPC2 are coupled. When the reception signal is received, there is no conduction between the antenna terminal ANT(OUT) and the GND terminal so that the voltage between the antenna terminal ANT(OUT) and the GND terminal is higher than the voltage between the antenna terminal ANT(OUT) and the reception terminal RX when the RX through transistor TH(RX) is on. Accordingly, when the distortion compensating capacitance circuits CAPC2 are coupled between the antenna terminal ANT(OUT) and the GND terminal, even if the RX through transistor TH(RX) is on and does not serve as the main generation source of the third harmonic distortion, the anti-phase third harmonic distortion generated from each of the distortion compensating capacitance circuits CAPC2 increases. As a result, due to excessive compensation by the distortion compensating capacitance circuit CAPC2, the generated third harmonic distortion undesirably increases.

Thus, it will be understood that, under any situation, the configuration in which the distortion compensating capacitance circuits CAPC2 are provided between the antenna terminal ANT(OUT) and the reception terminal RX is more desirable than the configuration in which the distortion compensating capacitance circuits CAPC2 are provided between the antenna terminal ANT(OUT) and the GND terminal.

Third Embodiment

In the distortion compensating capacitance circuit CAPC2 in the first embodiment, the MOS diode capacitance elements MDC1 and MDC2 are coupled in anti-series so as to electrically couple the electrode EL1 of the MOS diode capacitance element MDC1 to the electrode EL2 of the MOS diode capacitance element MDC2. By contrast, in the present third embodiment, a description will be given to a distortion compensating capacitance circuit in which the MOS diode capacitance elements MDC1 and MDC2 are coupled in anti-series so as to electrically couple the semiconductor region NR1B of the MOS diode capacitance element MDC1 to the semiconductor region NR2B of the MOS diode capacitance element MDC2.

(Distortion Compensating Capacitance Circuit in Third Embodiment)

Figure 23A:
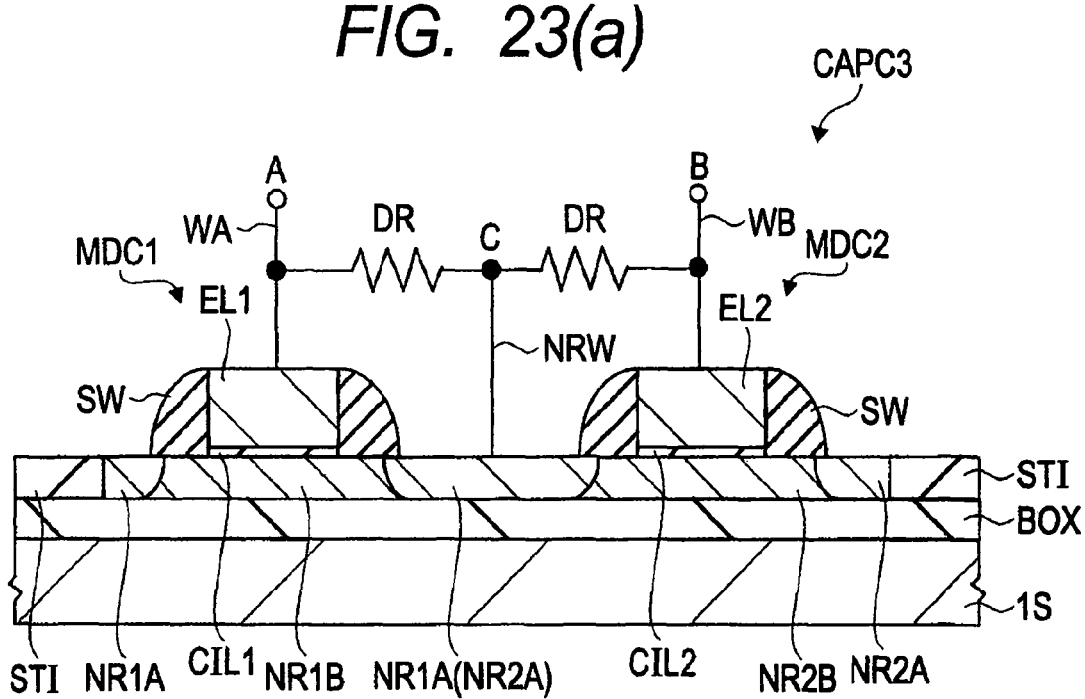
FIG. 23(a) is a view showing a structure of a distortion compensating capacitance circuit in a third embodiment.

FIG. 23(a) is a view showing a structure of a distortion compensating capacitance circuit CAPC3 in the present third embodiment. As shown in FIG. 23(a), the distortion compensating capacitance circuit CAPC3 in the present third embodiment is formed over the SOI substrate including the semiconductor substrate 1S, the buried insulating layer BOX formed over the semiconductor substrate 1S, and the silicon layer formed over the buried insulating layer BOX. The distortion compensating capacitance circuit CAPC3 in the present third embodiment has the MOS diode capacitance elements MDC1 and MDC2 formed over the SOI substrate.

A specific description will be given to the respective structures of the MOS diode capacitance elements MDC1 and MDC2 included in the distortion compensating capacitance circuit CAPC3 in the present third embodiment. As shown in FIG. 23(a), the MOS diode capacitance element MDC1 has the pair of semiconductor regions NR1A formed in spaced-apart relation in the silicon layer of the SOI substrate, and the semiconductor region NR1B formed between the pair of semiconductor regions NR1A. Each of the semiconductor regions NR1A and the semiconductor region NR1B is a semiconductor region into which an impurity of the same conductivity type has been introduced, and formed of, e.g., an n-type semiconductor region into which an n-type impurity such as phosphorus has been introduced.

The MOS diode capacitance element MDC1 has, over the semiconductor region NR1B, the capacitance insulating film CIL1 formed of, e.g., a silicon oxide film and also has, over the capacitance insulating film CIL1, the electrode EL1. The electrode EL1 is formed of, e.g., a polysilicon film into which an n-type impurity such as phosphorus has been introduced. Over the both side walls of the electrode EL1, the sidewalls SW are formed.

Next, as shown in FIG. 23(a), the MOS diode capacitance element MDC2 has the pair of semiconductor regions NR2A formed in spaced-apart relation in the silicon layer of the SOI substrate, and the semiconductor region NR2B formed between the pair of semiconductor regions NR2A. Each of the semiconductor regions NR2A and the semiconductor region NR2B is semiconductor region into which an impurity of the same conductivity type has been introduced, and formed of, e.g., an n-type semiconductor region into which an n-type impurity such as phosphorus has been introduced.

The MOS diode capacitance element MDC2 has, over the semiconductor region NR2B, the capacitance insulating film CIL2 formed of, e.g., a silicon oxide film and also has, over the capacitance insulating film CIL2, the electrode EL2. The electrode EL2 is formed of, e.g., a polysilicon film into which an n-type impurity such as phosphorus has been introduced. Over the both side walls of the electrode EL2, the sidewalls SW are formed.

In the MOS diode capacitance elements MDC1 and MDC2 thus structured, the semiconductor region NR1A interposed between the MOS diode capacitance elements MDC1 and MDC2 serves also as the semiconductor region NR2A. That is, in the present third embodiment, the semiconductor regions (NR1A and NR2A) interposed between the MOS diode capacitance elements MDC1 and MDC2 are formed as a common semiconductor region. Therefore, it follows that the pair of semiconductor regions NR1A, the semiconductor region NR1B, the pair of semiconductor regions NR2A, and the semiconductor region NR2B are integrated and electrically coupled to each other.

The electrode EL1 of the MOS diode capacitance element MDC1 is electrically coupled to the terminal A via the wiring line WA, while the electrode EL2 of the MOS diode capacitance element MDC2 is electrically coupled to the terminal B via the wiring line WB. Also, the semiconductor region NR1A (semiconductor region NR2A) interposed between the MOS diode capacitance elements MDC1 and MDC2 is coupled to the node C with a wiring line NRW.

Here, the present third embodiment is characterized in that, between the node C and the terminal A, the high resistance element DR is formed and, between the node C and the terminal B also, the high resistance element DR is formed. The high resistance element DR formed between the node C and the terminal A and the high resistance element DR formed between the node C and the terminal B have the same resistance values. Accordingly, to the node C, a voltage having the middle value of the voltage applied between the terminals A and B is applied. Therefore, in the distortion compensating capacitance circuit CAPC3 in the present third embodiment, it is possible to equalize the respective voltages applied to the MOS diode capacitance elements MDC1 and MDC2 with respect to the node C.

Figure 23B:
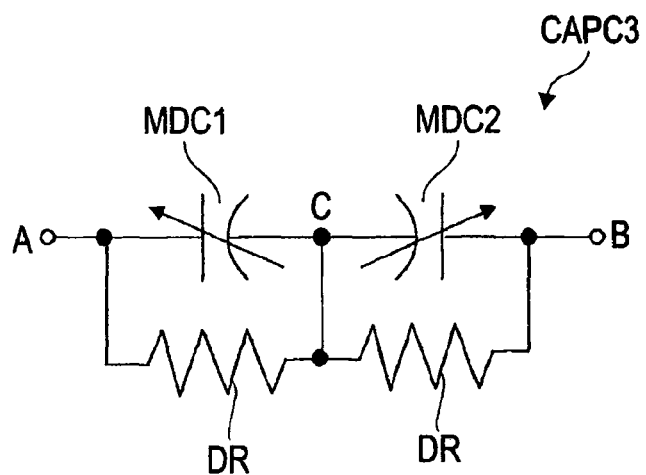
FIG. 23(b) is a view showing a circuit diagram of the distortion compensating capacitance circuit having the structure shown in FIG. 23(a)

The distortion compensating capacitance circuit CAPC3 in the present third embodiment is structured as described above, and a circuit diagram thereof is as shown in FIG. 23(b). FIG. 23(b) is a view showing the circuit diagram of the distortion compensating capacitance circuit CAPC3 having the structure shown in FIG. 23(a). As shown in FIG. 23(b), in the distortion compensating capacitance circuit CAPC3 in the present third embodiment, the MOS diode capacitance elements MDC1 and MDC2 are coupled in anti-series between the terminals A and B. In parallel to the MOS diode capacitance element MDC1, one of the high resistance elements DR is coupled and, in parallel to the MOS diode capacitance element MDC2, the other high resistance element DR is coupled. At this time, one of the high resistance elements DR and the other high resistance element DR have the same resistance values. As a result, to the node C located between the terminals A and B, a voltage resulting from voltage division between the two high resistance elements DR having equal resistance values is applied. Accordingly, to the node C, a voltage having the middle value of the voltage applied between the terminals A and B is applied.

Subsequently, the voltage dependency of the capacitance value in the distortion compensating capacitance circuit CAPC3 having the structure described above will be described with reference to FIG. 23(a). First, a consideration will be given to the case where, in FIG. 23(a), a voltage of 0 V is applied between the terminals A and B. For example, it is assumed that 0 V is applied to the terminal A, and 0 V is applied to the terminal B. In this case, to the node C, a voltage having a middle value between the voltages of the terminals A and B is applied so that the voltage of the node C is also 0 V. Accordingly, to each of the semiconductor regions NR1B and NR2B electrically coupled to the node C also, 0 V is applied. As a result, in the MOS diode capacitance element MDC1, 0 V is applied to the electrode EL1 serving as the upper electrode, and 0 V is applied also to the semiconductor region NR1B serving as the lower electrode. Therefore, a depletion layer does not expand in the semiconductor region NR1B, and the capacitance value of the MOS diode capacitance element MDC1 increases. Likewise, in the MOS diode capacitance element MDC2 also, 0 V is applied to the electrode EL2 serving as the upper electrode, and 0 V is applied also to the semiconductor region NR2B serving as the lower electrode. Therefore, a depletion layer does not expand in the semiconductor region NR2B, and the capacitance value of the MOS diode capacitance element MDC2 increases to be the same as the capacitance value of the MOS diode capacitance element MDC1. At this time, the capacitance value of the distortion compensating capacitance circuit CAPC3 is the series sum of the capacitance value of the MOS diode capacitance element MDC1 and the capacitance value of the MOS diode capacitance element MDC2.

Next, a consideration will be given to the case where, in FIG. 23(a), a positive voltage (e.g., +2 V) is applied between the terminals A and B. For example, it is assumed that 0 V is applied to the terminal A, and +2 V is applied to the terminal B. In this case, to the node C, a voltage having a middle value between the voltages of the terminals A and B is applied so that the voltage of the node C is +1 V. Accordingly, to each of the semiconductor regions NR1B and NR2B electrically coupled to the node C also, +1 V is applied. As a result, in the MOS diode capacitance element MDC1, 0 V is applied to the electrode EL1 serving as the upper electrode, and +1 V is applied to the semiconductor region NR1B serving as the lower electrode. Therefore, a depletion layer expands in the semiconductor region NR1B, and the capacitance value of the MOS diode capacitance element MDC1 decreases. On the other hand, in the MOS diode capacitance element MDC2, +2 V is applied to the electrode EL2 serving as the upper electrode, and +1 V is applied to the semiconductor region NR2B serving as the lower electrode. Therefore, a depletion layer does not expand in the semiconductor region NR2B, and the capacitance value of the MOS diode capacitance element MDC2 does not change from the capacitance value when 0 V is applied between the terminals A and B. As a result, the capacitance value of the distortion compensating capacitance circuit CAPC3, which is the series sum of the capacitance value of the MOS diode capacitance element MDC1 and the capacitance value of the MOS diode capacitance element MDC2, decreases to a value smaller than that when 0 V is applied between the terminals A and B.

A consideration will be given also to the case where, in FIG. 23(a), a negative voltage (e.g., −2 V) is applied between the terminals A and B. For example, it is assumed that +2 V is applied to the terminal A, and 0 V is applied to the terminal B. In this case, to the node C, a voltage having a middle value between the voltages of the terminals A and B is applied so that the voltage of the node C is +1 V. Accordingly, to each of the semiconductor regions NR1B and NR2B electrically coupled to the node C also, +1 V is applied. As a result, in the MOS diode capacitance element MDC1, +2 V is applied to the electrode EL1 serving as the upper electrode, and +1 V is applied also to the semiconductor region NR1B serving as the lower electrode. Therefore, a depletion layer does not expand in the semiconductor region NR1B, and the capacitance value of the MOS diode capacitance element MDC1 is the same as the capacitance value when 0 V is applied between the terminals A and B. On the other hand, in the MOS diode capacitance element MDC2, 0 V is applied to the electrode EL2 serving as the upper electrode, and +1 V is applied to the semiconductor region NR2B serving as the lower electrode. Therefore, a depletion layer expands in the semiconductor region NR2B, and the capacitance value of the MOS diode capacitance element MDC2 decreases to a value smaller than the capacitance value when 0 V is applied between the terminals A and B, and becomes the same as the capacitance value of the MOS diode capacitance element MDC1 when a positive voltage (+2 V) is applied between the terminals A and B. As a result, the capacitance value of the distortion compensating capacitance circuit CAPC3, which is the series sum of the capacitance value of the MOS diode capacitance element MDC1 and the capacitance value of the MOS diode capacitance element MDC2, decreases to a value smaller than that when 0 V is applied between the terminals A and B, and becomes the same as that when a positive voltage (+2 V) is applied between the terminals A and B.

From the foregoing, it will be understood that, in the distortion compensating capacitance circuit CAPC3 in the present third embodiment, the symmetry with respect to the node C is ensured, and therefore the capacitance value of the distortion compensating capacitance circuit CAPC3 has the voltage dependency which is symmetric, and represented by the upwardly protruding curve.

It will be understood that, thus, the voltage dependency of the distortion compensating capacitance circuit CAPC3 in the present third embodiment is opposite to the voltage dependency (see FIG. 9) of the parasitic capacitance present between the source region and the drain region when the RF voltage (AC voltage) is applied. Therefore, it will be understood that, by adjusting the impurity concentrations of the semiconductor regions NR1B and NR2B serving as the lower electrodes of the MOS diode capacitance elements MDC1 and MDC2 included in the distortion compensating capacitance circuit CAPC3 as well as the widths of the electrodes EL1 and EL2 and thereby optimizing the voltage dependency of the capacitance value of the distortion compensating capacitance circuit CAPC3, it is possible to provide the distortion compensating capacitance circuit CAPC3 with the effect of cancelling out the third harmonic distortion resulting from the voltage dependency of the parasitic capacitance of the MISFET $Q_N$.

(Application of Distortion Compensating Capacitance Circuit in Third Embodiment to Antenna Switch)

Next, a description will be given to an example in which the distortion compensating capacitance circuit CAPC3 in the present third embodiment is applied to the antenna switch ASW. In the present third embodiment also, in terms of effectively reducing the third harmonic distortion, in the antenna switch ASW shown in FIG. 15, the distortion compensating capacitance circuit CAPC3 in the present third embodiment is applied to the RX through transistor TH(RX) (shown by the hatched region of FIG. 15).

Figure 24:
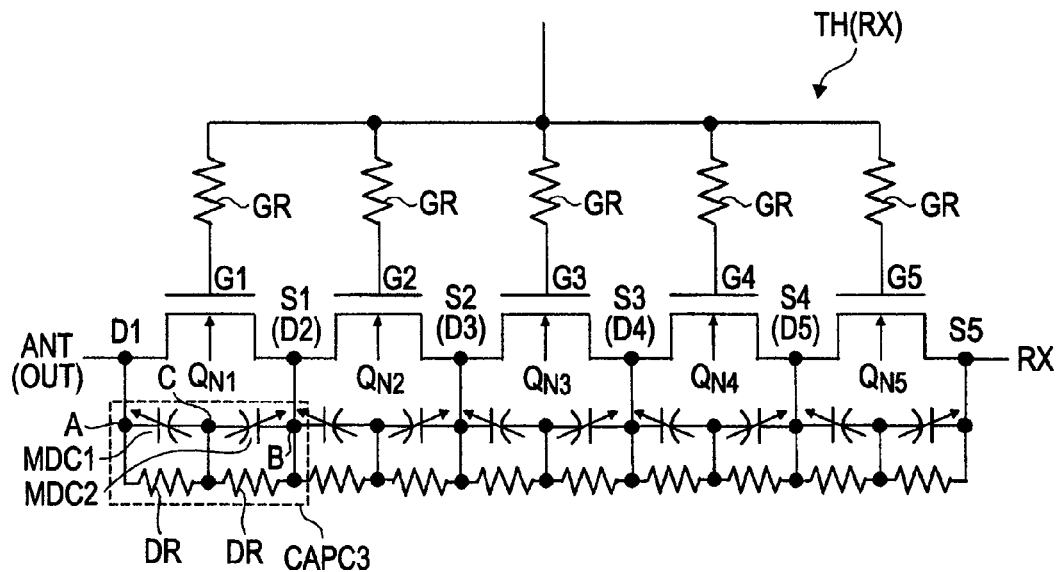
FIG. 24 is a circuit diagram showing a configuration obtained by adding the distortion compensating capacitance circuits in the third embodiment to the RX through transistor.

FIG. 24 is a circuit diagram showing a configuration obtained by adding the distortion compensating capacitance circuits CAPC3 in the present third embodiment to the RX through transistor TH(RX). As shown in FIG. 24, between the antenna terminal ANT(OUT) and the reception terminal RX, the five MISFETs $Q_{N1}$ to $Q_{N5}$ included in the RX through transistor TH(RX) are coupled in series. Specifically, the antenna terminal ANT(OUT) is coupled to the drain region D1 of the MISFET $Q_{N1}$, and the source region S1 of the MISFET $Q_{N1}$ is coupled to the drain region D2 of the MISFET $Q_{N2}$. Also, the source region S2 of the MISFET $Q_{N2}$ is coupled to the drain region D3 of the MISFET $Q_{N3}$, and the source region S3 of the MISFET $Q_{N3}$ is coupled to the drain region D4 of the MISFET $Q_{N4}$. Also, the source region S4 of the MISFET $Q_{N4}$ is coupled to the drain region D5 of the MISFET $Q_{13}$, and the source region S5 of the MISFET $Q_{N5}$ is coupled to the reception terminal RX.

In addition, the gate electrodes G1 to G5 of the MISFETs $Q_{N1}$ to $Q_{N5}$ are coupled to each other via the gate resistances GR. To each of the MISFETs $Q_{N1}$ to $Q_{N5}$, the distortion compensating capacitance circuit CAPC3 is coupled. Specifically, between the drain region D1 and the source region S1 of the MISFET $Q_{N1}$, the distortion compensating capacitance circuit CAPC3 is coupled and, between the drain region D2 and the source region S2 of the MISFET $Q_{N2}$, the distortion compensating capacitance circuit CAPC3 is coupled. Also, between the drain region D3 and the source region S3 of the MISFET $Q_{N3}$, the distortion compensating capacitance circuit CAPC3 is coupled and, between the drain region D4 and the source region S4 of the MISFET $Q_{N4}$, the distortion compensating capacitance circuit CAPC3 is coupled. Also, between the drain region D5 and the source region S5 of the MISFET $Q_{N5}$, the distortion compensating capacitance circuit CAPC3 is coupled.

Here, the distortion compensating capacitance circuit CAPC3 in the present third embodiment has the voltage dependency represented by the upwardly protruding curve. That is, in the present third embodiment, between the respective source regions and the respective drain regions of the plurality of MISFETs $Q_{N1}$ to $Q_{N5}$ coupled in series, the capacitance circuits are coupled each of which has a voltage dependency such that, in either of the cases where a positive voltage is applied to the drain region based on the potential of the source region and where a negative voltage is applied to the drain region based on the potential of the source region, the capacitance decreases to a value smaller than that in a state where the potential of the source region and the potential of the drain region are at the same level.

Each of the distortion compensating capacitance circuits CAPC3 coupled in parallel to the individual MISFETs $Q_{N1}$ to $Q_{N5}$ has a configuration in which the MOS diode capacitance elements MDC1 and MDC2 are coupled in anti-series, and the node C between the MOS diode capacitance elements MDC1 and MDC2 has a voltage resulting from voltage division between the two high resistance elements DR provided between the terminals A and B and having equal resistance values. That is, between the terminal A and the node C, one of the high resistance elements DR is provided and, between the terminal B and the node C, the other high resistance element DR is provided. Accordingly, to the node C, a voltage having the middle value of the voltage applied between the terminals A and B is applied. Therefore, in the distortion compensating capacitance circuit CAPC3 in the present third embodiment, it is possible to equalize the respective voltages applied to the MOS diode capacitance elements MDC1 and MDC2 with respect to the node C. That is, according to the present third embodiment, it is possible to ensure the symmetry of the voltage dependency of the distortion compensating capacitance circuit CAPC3, and allow the distortion compensating function of the distortion compensating capacitance circuit to be effectively achieved.

(Layout Configuration of Distortion Compensating Capacitance Circuit in Third Embodiment)

Figure 25:
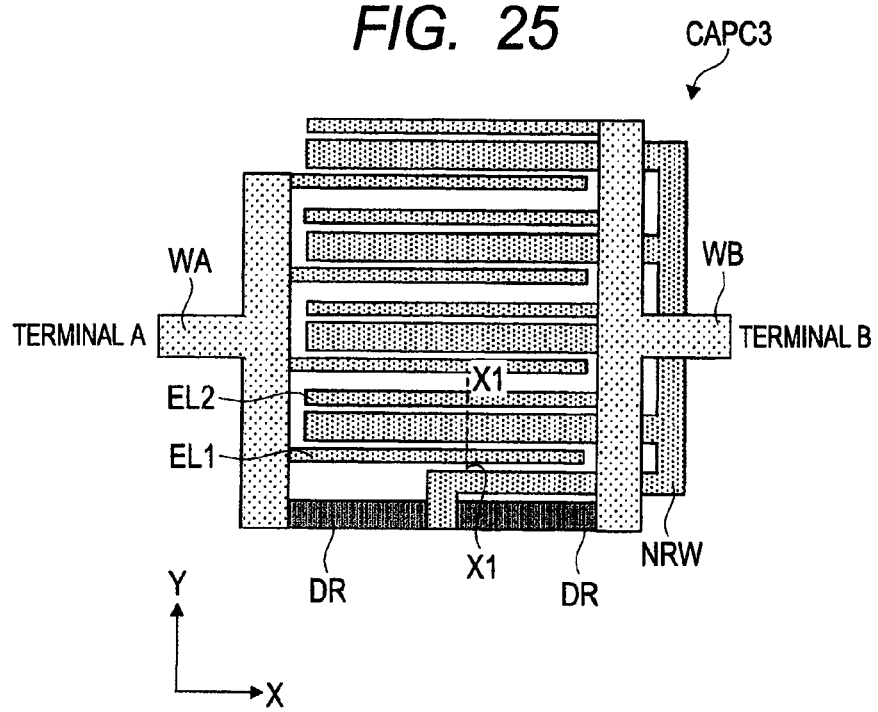
FIG. 25 is a view showing a layout configuration of the distortion compensating capacitance circuit in the third embodiment.

Subsequently, a description will be given to a layout configuration of the distortion compensating capacitance circuit CAPC3 in the present third embodiment. FIG. 25 is a view showing the layout configuration of the distortion compensating capacitance circuit CAPC3 in the present third embodiment. In FIG. 25, the electrodes EL1 and EL2 extend side by side in the X-direction (lateral direction) of the paper sheet with FIG. 25. Specifically, the electrodes EL1 and the electrodes EL2 are paired in one-to-one correspondence, and the plurality of pairs are arranged in the Y-direction (vertical direction), while each extending in the X-direction (lateral direction). The plurality of electrodes EL1 are bundled with the wiring line WA to be coupled to the terminal A. Likewise, the plurality of electrodes EL2 are bundled with the wiring line WB to be coupled to the terminal B. In addition, the wiring line NRW is placed so as to extend in the X-direction to be interposed between the electrodes EL1 and EL2. The wiring lines NRW and WA are coupled via one of the high resistance elements DR, while the wiring lines NRW and WB are coupled via the other high resistance element DR. Note that the cross-sectional view along the line X1-X1 of FIG. 25 corresponds to FIG. 23(a).

Note that the layout configuration of the RX through transistor TH(RX) in the present third embodiment is substantially the same as the layout configuration of the RX through transistor TH(RX) in the foregoing first embodiment shown in FIG. 20. What is different is that, instead of the distortion compensating capacitance circuits CAPC2, the distortion compensating capacitance circuits CAPC3 are used.

(Effects of Third Embodiment)

The antenna switch ASW in the present third embodiment is configured as described above. By applying the distortion compensating capacitance circuit CAPC3 in the present third embodiment to the antenna switch ASW, effects as shown below can be obtained. That is, the capacitance value of the distortion compensating capacitance circuit CAPC3 in the present third embodiment has the voltage dependency represented by the upwardly protruding curve, in the same manner as in the foregoing first embodiment. Therefore, the third harmonic distortion generated from the distortion compensating capacitance circuit CAPC3 in the present third embodiment can cancel out the anti-phase third harmonic distortion resulting from the voltage dependency (voltage dependency represented by the upwardly protruding curve) of the OFF capacitance in each of the MISFETs $Q_{N1}$ to $Q_{N5}$ included in the antenna switch ASW. As a result, it is possible to reduce the absolute value of the third harmonic distortion generated from the antenna switch ASW.

In the present third embodiment, to achieve the effect described above, the capacitance value of the distortion compensating capacitance circuit CAPC3 and the voltage dependency thereof are set such that the third harmonic distortion generated from the distortion compensating capacitance circuit CAPC3 compensates for the third harmonic distortion generated from each of the MISFETs $Q_{N1}$ to $Q_{N5}$. Specifically, the impurity concentration of the semiconductor region NR1B shown in FIG. 23(a) is about $5 \times 10^{17}/cm^3$, and the width of each of the electrodes EL1 and EL2 is about $\frac{1}{10}$ of the gate width of each of the MISFETs $Q_{N1}$ to $Q_{N5}$.

Also, in the present third embodiment, as shown in FIGS. 23(a) and 23(b), the high resistance element DR is formed between the node C and the terminal A, and the high resistance element DR is formed between the node C and the terminal B. Since the high resistance element DR formed between the node C and the terminal A and the high resistance element DR formed between the node C and the terminal B have the same resistance values, it follows that a voltage having the middle value of the voltage applied between the terminals A and B is applied. Therefore, in the distortion compensating capacitance circuit CAPC3 in the present third embodiment, it is possible to equalize the respective voltages applied to the MOS diode capacitance elements MDC1 and MDC2 with respect to the node C. That is, according to the present third embodiment, it is possible to ensure the symmetry of the voltage dependency of the distortion compensating capacitance circuit CAPC3, and allow the distortion compensating function of the distortion compensating capacitance circuit to be effectively achieved.

Also, in the distortion compensating capacitance circuit CAPC3 in the present third embodiment shown in FIGS. 23(a) and 23(b), the node C is coupled to the terminals A and B via the high resistance elements DR, and therefore it is possible to prevent the node C from being brought into the floating state. As a result, it is possible to prevent the symmetry of the voltage dependency of the distortion compensating capacitance circuit with respect to the node C from being impaired due to the event in which the node C is brought into the floating state.

Examples of an effect specific to the present third embodiment that can be considered include the following effect. That is, in the distortion compensating capacitance circuit CAPC3 in the present third embodiment, as shown in FIG. 23(a), the semiconductor region NR1B of the MOS diode capacitance element MDC1 is electrically coupled to the semiconductor region NR2B of the MOS diode capacitance element MDC2. As a result, unlike in the distortion compensating capacitance circuit CAPC2 in the foregoing first embodiment shown in FIGS. 17(a) and 17(b), there is no need to isolate the MOS diode capacitance elements MDC1 and MDC2 with the isolation region STI. Thus, in the distortion compensating capacitance circuit CAPC3 in the present third embodiment, there is no need to form the isolation region for isolating the MOS diode capacitance elements MDC1 and MDC2. This allows a reduction in the area occupied by the distortion compensating capacitance circuit CAPC3.

Fourth Embodiment

In the foregoing first embodiment, the description has been given to the distortion compensating capacitance circuit CAPC2 in which the MOS diode capacitance elements MDC1 and MDC2 are coupled in anti-series. In the present fourth embodiment, a description will be given to a distortion compensating capacitance circuit in which the MOS diode capacitance elements MDC1 and MDC2 are coupled in anti-parallel.

(Distortion Compensating Capacitance Circuit in Fourth Embodiment)

Figure 26A:
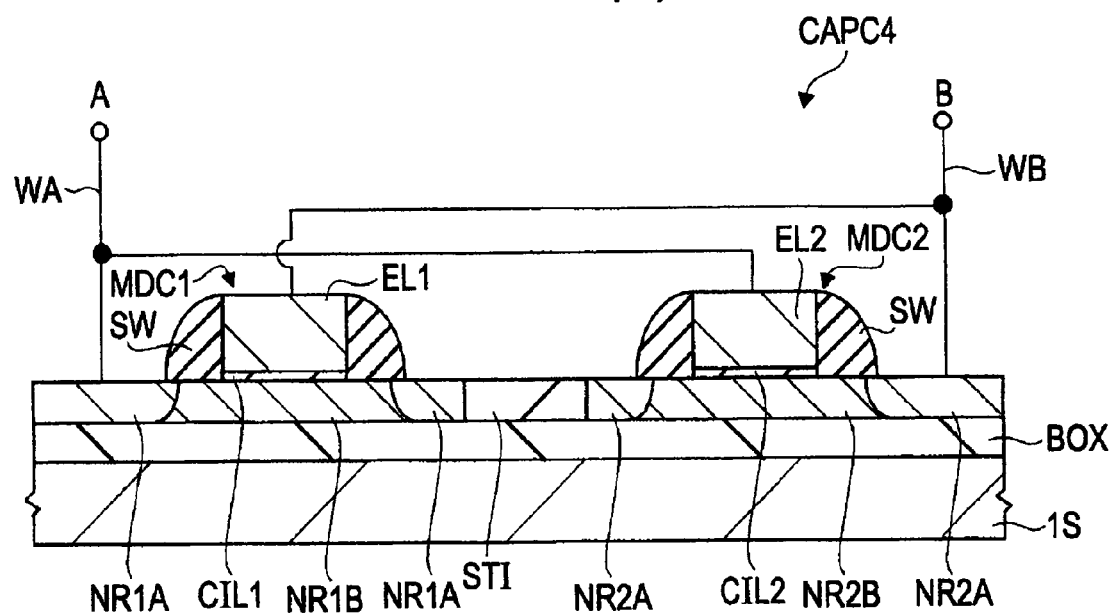
FIG. 26(a) is a view showing a structure of a distortion compensating capacitance circuit in a fourth embodiment.

FIG. 26(a) is a view showing a structure of a distortion compensating capacitance circuit CAPC4 in the present fourth embodiment. As shown in FIG. 26(a), the distortion compensating capacitance circuit CAPC4 in the present fourth embodiment is formed over the SOI substrate including the semiconductor substrate 1S, the buried insulating layer BOX formed over the semiconductor substrate 1S, and the silicon layer formed over the buried insulating layer BOX. The distortion compensating capacitance circuit CAPC4 in the present fourth embodiment has the MOS diode capacitance elements MDC1 and MDC2 formed over the SOI substrate. The MOS diode capacitance elements MDC1 and MDC2 are isolated by the isolation region STI formed in the silicon layer of the SOI substrate.

A specific description will be given to the respective structures of the MOS diode capacitance elements MDC1 and MDC2 included in the distortion compensating capacitance circuit CAPC4 in the present fourth embodiment. As shown in FIG. 26(a), the MOS diode capacitance element MDC1 has the pair of semiconductor regions NR1A formed in spaced-apart relation in the silicon layer of the SOI substrate, and the semiconductor region NR1B formed between the pair of semiconductor regions NR1A. Each of the semiconductor regions NR1A and the semiconductor region NR1B is a semiconductor region into which an impurity of the same conductivity type has been introduced, and formed of, e.g., an n-type semiconductor region into which an n-type impurity such as phosphorus has been introduced.

The MOS diode capacitance element MDC1 has, over the semiconductor region NR1B, the capacitance insulating film CIL1 formed of, e.g., a silicon oxide film and also has, over the capacitance insulating film CIL1, the electrode EL1. The electrode EL1 is formed of, e.g., a polysilicon film into which an n-type impurity such as phosphorus has been introduced. Over the both side walls of the electrode EL1, the sidewalls SW are formed.

Next, as shown in FIG. 26(a), the MOS diode capacitance element MDC2 has the pair of semiconductor regions NR2A formed in spaced-apart relation in the silicon layer of the SOI substrate, and the semiconductor region NR2B formed between the pair of semiconductor regions NR2A. Each of the semiconductor regions NR2A and the semiconductor region NR2B is a semiconductor region into which an impurity of the same conductivity type has been introduced, and formed of, e.g., an n-type semiconductor region into which an n-type impurity such as phosphorus has been introduced.

The MOS diode capacitance element MDC2 has, over the semiconductor region NR2B, the capacitance insulating film CIL2 formed of, e.g., a silicon oxide film and also has, over the capacitance insulating film CIL2, the electrode EL2. The electrode EL2 is formed of, e.g., a polysilicon film into which an n-type impurity such as phosphorus has been introduced. Over the both side walls of the electrode EL2, the sidewalls SW are formed.

In the MOS diode capacitance elements MDC1 and MDC2 thus structured, the electrode EL1 of the MOS diode capacitance element MDC1 is electrically coupled to the terminal B via the wiring line WB, and the electrode EL2 of the MOS diode capacitance element MDC2 is electrically coupled to the terminal A via the wiring line WA.

Note that, in the distortion compensating capacitance circuit CAPC4 in the present fourth embodiment, the MOS diode capacitance elements MDC1 and MDC2 are coupled in anti-parallel. Accordingly, unlike in the distortion compensating capacitance circuit CAPC2 in the foregoing first embodiment in which the MOS diode capacitance elements MDC1 and MDC2 are coupled in anti-series, there is no middle node between the MOS diode capacitance elements MDC1 and MDC2. Therefore, unlike in the foregoing first embodiment, there is no need to ensure the symmetry of the voltage dependency with respect to the middle node. As a result, in the distortion compensating capacitance circuit CAPC4 in the present fourth embodiment, the high resistance elements DR are not used.

Figure 26B:
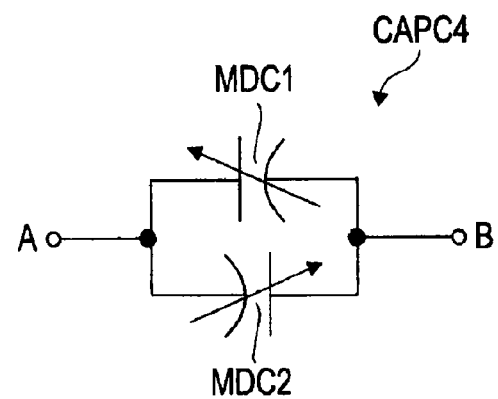
FIG. 26(b) is a view showing a circuit diagram of the distortion compensating capacitance circuit having the structure shown in FIG. 26(a)

The distortion compensating capacitance circuit CAPC4 in the present fourth embodiment is structured as described above, and a circuit diagram thereof is as shown in FIG. 26(b).

FIG. 26(b) is a view showing the circuit diagram of the distortion compensating capacitance circuit CAPC4 having the structure shown in FIG. 26(a). As shown in FIG. 26(b), in the distortion compensating capacitance circuit CAPC4 in the present fourth embodiment, the MOS diode capacitance elements MDC1 and MDC2 are coupled in anti-parallel between the terminals A and B.

Hereinbelow, the voltage dependency of the capacitance value in the distortion compensating capacitance circuit CAPC4 having the structure described above will be described with reference to FIG. 26(a). First, a consideration will be given to the case where, in FIG. 26(a), a voltage of 0 V is applied between the terminals A and B. For example, it is assumed that 0 V is applied to the terminal A, and 0 V is applied to the terminal B. In this case, to each of the semiconductor region NR1B electrically coupled to the terminal A and the semiconductor region NR2B electrically coupled to the terminal B, 0 V is applied. To each of the electrode EL2 coupled to the terminal A and the electrode EL1 coupled to the terminal B, 0 V is applied. As a result, in the MOS diode capacitance element MDC1, 0 V is applied to the electrode EL1 serving as the upper electrode, and 0 V is applied also to the semiconductor region NR1B serving as the lower electrode. Therefore, a depletion layer does not expand in the semiconductor region NR1B, and the capacitance value of the MOS diode capacitance element MDC1 increases. Likewise, in the MOS diode capacitance element MDC2 also, 0 V is applied to the electrode EL2 serving as the upper electrode, and 0 V is applied also to the semiconductor region NR2B serving as the lower electrode. Therefore, a depletion layer does not expand in the semiconductor region NR2B, and the capacitance value of the MOS diode capacitance element MDC2 increases to be the same as the capacitance value of the MOS diode capacitance element MDC1. At this time, the capacitance value of the distortion compensating capacitance circuit CAPC4 is the parallel sum of the capacitance value of the MOS diode capacitance element MDC1 and the capacitance value of the MOS diode capacitance element MDC2.

Next, a consideration will be given to the case where, in FIG. 26(a), a positive voltage (e.g., +2 V) is applied between the terminals A and B. For example, it is assumed that 0 V is applied to the terminal A, and +2 V is applied to the terminal B. In this case, to each of the semiconductor region NR1B electrically coupled to the terminal A and the electrode EL2 electrically coupled to the terminal A, 0 V is applied. To each of the semiconductor region NR2B coupled to the terminal B and the electrode EL1 coupled to the terminal B, +2 V is applied. As a result, in the MOS diode capacitance element MDC1, +2 V is applied to the electrode EL1 serving as the upper electrode, and 0 V is applied to the semiconductor region NR1B serving as the lower electrode. Therefore, a depletion layer does not expand in the semiconductor region NR1B, and the capacitance value of the MOS diode capacitance element MDC1 does not change from the capacitance value when 0 V is applied between the terminals A and B. On the other hand, in the MOS diode capacitance element MDC2, 0 V is applied to the electrode EL2 serving as the upper electrode, and +2 V is applied to the semiconductor region NR2B serving as the lower electrode. Therefore, a depletion layer expands in the semiconductor region NR2B, and the capacitance value of the MOS diode capacitance element MDC2 decreases. At this time, the capacitance value of the distortion compensating capacitance circuit CAPC4, which is the parallel sum of the capacitance value of the MOS diode capacitance element MDC1 and the capacitance value of the MOS diode capacitance element MDC2, decreases to a value smaller than that when 0 V is applied between the terminals A and B.

A consideration will be given also to the case where, in FIG. 26(a), a negative voltage (e.g., −2 V) is applied between the terminals A and B. For example, it is assumed that +2 V is applied to the terminal A, and 0 V is applied to the terminal B. In this case, to each of the semiconductor region NR1B electrically coupled to the terminal A and the electrode EL2 electrically coupled to the terminal A, +2 V is applied. To each of the semiconductor region NR2B coupled to the terminal B and the electrode EL1 coupled to the terminal B, 0 V is applied. As a result, in the MOS diode capacitance element MDC1, 0 V is applied to the electrode EL1 serving as the upper electrode, and +2 V is applied to the semiconductor region NR1B serving as the lower electrode. Therefore, a depletion layer expands in the semiconductor region NR1B, and the capacitance value of the MOS diode capacitance element MDC1 decreases to a value smaller than the capacitance value when 0 V is applied between the terminals A and B, and becomes the same as the capacitance value of the MOS diode capacitance element MDC2 when a positive voltage (+2 V) is applied between the terminals A and B. On the other hand, in the MOS diode capacitance element MDC2, +2 V is applied to the electrode EL2 serving as the upper electrode, and 0 V is applied to the semiconductor region NR2B serving as the lower electrode. Therefore, a depletion layer does not expand in the semiconductor region NR2B, and the capacitance value of the MOS diode capacitance element MDC2 is the same as the capacitance value when 0 V is applied between the terminals A and B. As a result, the capacitance value of the distortion compensating capacitance circuit CAPC4, which is the parallel sum of the capacitance value of the MOS diode capacitance element MDC1 and the capacitance value of the MOS diode capacitance element MDC2, decreases to a value smaller than that when 0 V is applied between the terminals A and B, and becomes the same as that when a positive voltage (+2 V) is applied between the terminals A and B.

From the foregoing, it will be understood that, in the distortion compensating capacitance circuit CAPC4 in the present fourth embodiment, the capacitance value of the distortion compensating capacitance circuit CAPC4 has the voltage dependency which is symmetric, and represented by the upwardly protruding curve.

It will be understood that, thus, the voltage dependency of the distortion compensating capacitance circuit CAPC4 in the present fourth embodiment is opposite to the voltage dependency (see FIG. 9) of the parasitic capacitance present between the source region and the drain region when the RF voltage (AC voltage) is applied. Therefore, it will be understood that, by adjusting the impurity concentrations of the semiconductor regions NR1B and NR2B serving as the lower electrodes of the MOS diode capacitance elements MDC1 and MDC2 included in the distortion compensating capacitance circuit CAPC4 as well as the widths of the electrodes EL1 and EL2 and thereby optimizing the voltage dependency of the capacitance value of the distortion compensating capacitance circuit CAPC4, it is possible to provide the distortion compensating capacitance circuit CAPC4 with the effect of cancelling out the third harmonic distortion resulting from the voltage dependency of the parasitic capacitance of the MISFET $Q_N$.

(Application of Distortion Compensating Capacitance Circuit in Fourth Embodiment to Antenna Switch)

Next, a description will be given to an example in which the distortion compensating capacitance circuit CAPC4 in the present fourth embodiment is applied to the antenna switch ASW. In the present fourth embodiment also, in terms of effectively reducing the third harmonic distortion, in the antenna switch ASW shown in FIG. 15, the distortion compensating capacitance circuit CAPC4 in the present fourth embodiment is applied to the RX through transistor TH(RX) (shown by the hatched region of FIG. 15).

Figure 27:
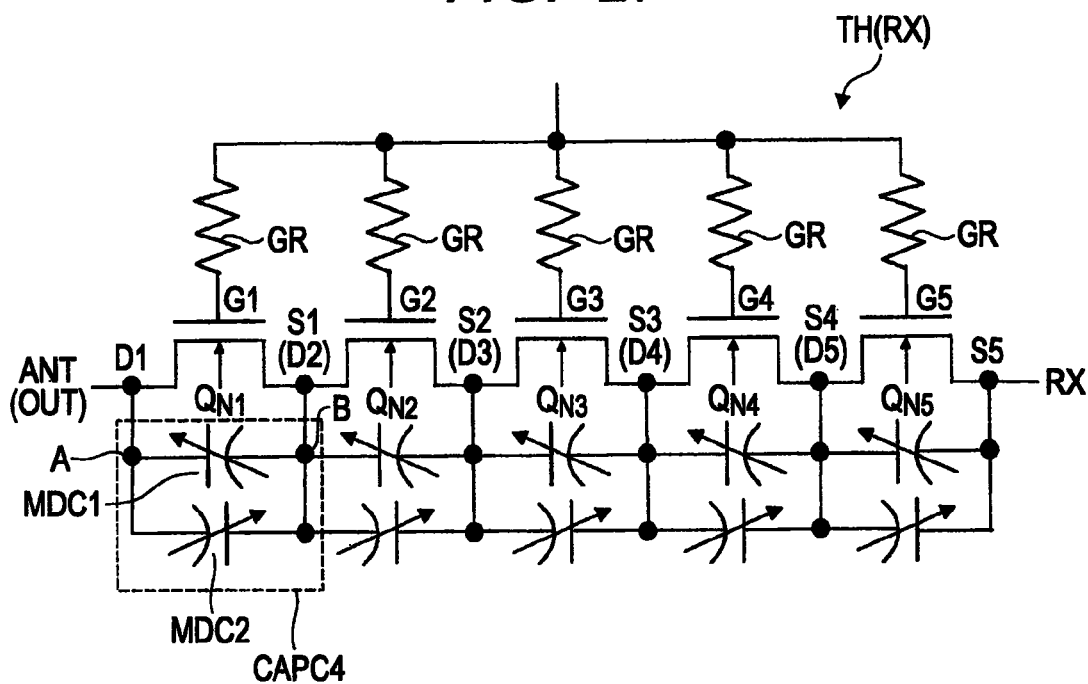
FIG. 27 is a circuit diagram showing a configuration obtained by adding the distortion compensating capacitance circuits in the fourth embodiment to the RX through transistor.

FIG. 27 is a circuit diagram showing a configuration obtained by adding the distortion compensating capacitance circuits CAPC4 in the present fourth embodiment to the RX through transistor TH(RX). As shown in FIG. 27, between the antenna terminal ANT(OUT) and the reception terminal RX, the five MISFETs $Q_{N1}$ to $Q_{N5}$ included in the RX through transistor TH(RX) are coupled in series. Specifically, the antenna terminal ANT(OUT) is coupled to the drain region D1 of the MISFET $Q_{N1}$, and the source region S1 of the MISFET $Q_{N1}$ is coupled to the drain region D2 of the MISFET $Q_N$. Also, the source region S2 of the MISFET $Q_{N2}$ is coupled to the drain region D3 of the MISFET $Q_{N3}$, and the source region S3 of the MISFET $Q_{N3}$ is coupled to the drain region D4 of the MISFET $Q_{N4}$. Also, the source region S4 of the MISFET $Q_{N4}$ is coupled to the drain region D5 of the MISFET $Q_{N5}$, and the source region S5 of the MISFET $Q_{N5}$ is coupled to the reception terminal RX.

In addition, the gate electrodes G1 to G5 of the MISFETs $Q_{N1}$ to $Q_{N5}$ are coupled to each other via the gate resistances GR. To each of the MISFETs $Q_{N1}$ to $Q_{N5}$, the distortion compensating capacitance circuit CAPC4 is coupled. Specifically, between the drain region D1 and the source region S1 of the MISFET $Q_{N1}$, the distortion compensating capacitance circuit CAPC4 is coupled and, between the drain region D2 and the source region S2 of the MISFET $Q_{N2}$, the distortion compensating capacitance circuit CAPC4 is coupled. Also, between the drain region D3 and the source region S3 of the MISFET $Q_{N3}$, the distortion compensating capacitance circuit CAPC4 is coupled and, between the drain region D4 and the source region S4 of the MISFET $Q_{N4}$, the distortion compensating capacitance circuit CAPC4 is coupled. Also, between the drain region D5 and the source region S5 of the MISFET $Q_{N5}$, the distortion compensating capacitance circuit CAPC4 is coupled.

Here, the distortion compensating capacitance circuit CAPC4 in the present fourth embodiment has the voltage dependency represented by the upwardly protruding curve. That is, in the present fourth embodiment, between the respective source regions and the respective drain regions of the plurality of MISFETs $Q_{N1}$ to $Q_{N5}$ coupled in series, the capacitance circuits are coupled each of which has a voltage dependency such that, in either of the cases where a positive voltage is applied to the drain region based on the potential of the source region and where a negative voltage is applied to the drain region based on the potential of the source region, the capacitance decreases to a value smaller than that in a state where the potential of the source region and the potential of the drain region are at the same level.

Each of the distortion compensating capacitance circuits CAPC4 coupled in parallel to the individual MISFETs $Q_{N1}$ to $Q_{N5}$ has a configuration in which the MOS diode capacitance elements MDC1 and MDC2 are coupled in anti-parallel. Therefore, according to the present fourth embodiment, it is possible to ensure the symmetry of the voltage dependency of the distortion compensating capacitance circuit CAPC4, and allow the distortion compensating function of the distortion compensating capacitance circuit to be effectively achieved.

(Layout Configuration of Distortion Compensating Capacitance Circuit in Fourth Embodiment)

Figure 28:
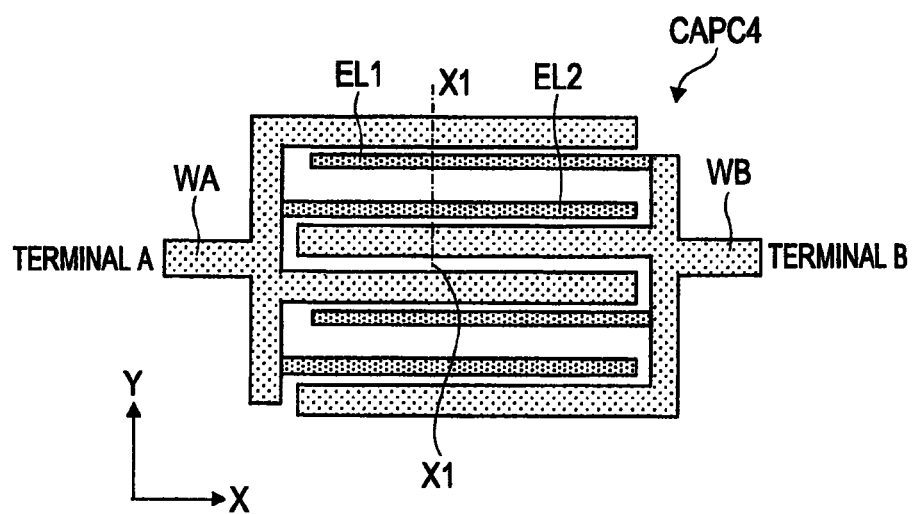
FIG. 28 is a view showing a layout configuration of the distortion compensating capacitance circuit in the fourth embodiment.

Subsequently, a description will be given to a layout configuration of the distortion compensating capacitance circuit CAPC4 in the present fourth embodiment. FIG. 28 is a view showing the layout configuration of the distortion compensating capacitance circuit CAPC4 in the present fourth embodiment. In FIG. 28, the electrodes EL1 and EL2 extend side by side in the X-direction (lateral direction) of the paper sheet with FIG. 28. Specifically, the electrodes EL1 and the electrodes EL2 are paired in one-to-one correspondence, and the plurality of pairs are arranged in the Y-direction (vertical direction), while each extending in the X-direction (lateral direction). The plurality of electrodes EL1 are bundled with the wiring line WB to be coupled to the terminal B. Likewise, the plurality of electrodes EL2 are bundled with the wiring line WA to be coupled to the terminal A. From the wiring line WA, branch lines extend in the X-direction. Likewise, from the wiring line WB also, branch lines extend in the X-direction. The branch lines branched from the wiring line WA and the branch lines branched from the wiring line WB are arranged in an interdigitating configuration. Between the branch lines branched from the wiring line WA and the branch lines branched from the wiring line WB, the electrodes EL1 and EL2 are placed. Note that the cross-sectional view along the line X1-X1 of FIG. 28 corresponds to FIG. 26(a).

Note that the layout configuration of the RX through transistor TH(RX) in the present fourth embodiment is substantially the same as the layout configuration of the RX through transistor TH(RX) in the foregoing first embodiment shown in FIG. 20. What is different is that, instead of the distortion compensating capacitance circuits CAPC2, the distortion compensating capacitance circuits CAPC4 are used.

(Effects of Fourth Embodiment)

The antenna switch ASW in the present fourth embodiment is configured as described above. By applying the distortion compensating capacitance circuit CAPC4 in the present fourth embodiment to the antenna switch ASW, effects as shown below can be obtained. That is, the capacitance value of the distortion compensating capacitance circuit CAPC4 in the present fourth embodiment has the voltage dependency represented by the upwardly protruding curve, in the same manner as in the foregoing first embodiment. Therefore, the third harmonic distortion generated from the distortion compensating capacitance circuit CAPC4 in the present fourth embodiment can cancel out the anti-phase third harmonic distortion resulting from the voltage dependency (voltage dependency represented by the upwardly protruding curve) of the OFF capacitance in each of the MISFETs $Q_{N1}$ to $Q_{N5}$ included in the antenna switch ASW. As a result, it is possible to reduce the absolute value of the third harmonic distortion generated from the antenna switch ASW.

In the present fourth embodiment, to achieve the effect described above, the capacitance value of the distortion compensating capacitance circuit CAPC4 and the voltage dependency thereof are set such that the third harmonic distortion generated from the distortion compensating capacitance circuit CAPC4 compensates for the third harmonic distortion generated from each of the MISFETs $Q_{N1}$ to $Q_{N5}$. Specifically, the impurity concentration of the semiconductor region NR1B shown in FIG. 26(a) is about $5 \times 10^{17}/cm^3$, and the width of each of the electrodes EL1 and EL2 is about $\frac{1}{20}$ of the gate width of each of the MISFETs $Q_{N1}$ to $Q_{N5}$.

Examples of an effect specific to the present fourth embodiment that can be considered include the following effect. That is, in each of the distortion compensating capacitance circuits CAPC4 in the present fourth embodiment, the MOS diode capacitance elements MDC1 and MDC2 are coupled in anti-parallel. Accordingly, compared with the distortion compensating capacitance circuit CAPC2 in the foregoing first embodiment in which the MOS diode capacitance elements MDC1 and MDC2 are coupled in anti-series, in the distortion compensating capacitance circuit CAPC4 in the present fourth embodiment, an increased RF voltage is applied to each of the MOS diode capacitance elements MDC1 and MDC2. As a result, compared with the distortion compensating capacitance circuit CAPC2 in the foregoing first embodiment, in the distortion compensating capacitance circuit CAPC4 in the present fourth embodiment, the voltage dependency can be increased. Therefore, even when the capacitance value is reduced, a desired voltage change can be obtained. Consequently, in the present fourth embodiment, it is possible to reduce the sizes of the MOS diode capacitance elements MDC1 and MDC2, and thereby reduce the size of the distortion compensating capacitance circuit CAPC4.

Fifth Embodiment

In the foregoing fourth embodiment, the description has been given to the distortion compensating capacitance circuit CAPC4 in which the MOS diode capacitance elements MDC1 and MDC2 are coupled in anti-parallel. In the present fifth embodiment, a description will be given to a distortion compensating capacitance circuit in which the MOS diode capacitance elements MDC1 and MDC2 are coupled in anti-parallel, and high resistance elements are also coupled in parallel.

(Distortion Compensating Capacitance Circuit in Fifth Embodiment)

Figure 29A:
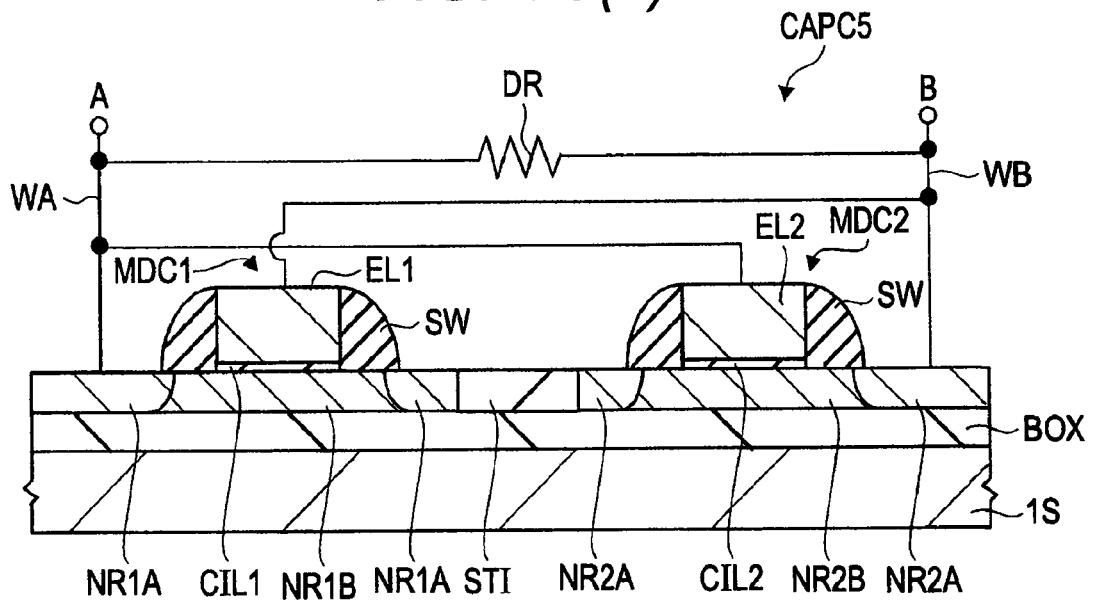
FIG. 29(a) is a view showing a structure of a distortion compensating capacitance circuit in a fifth embodiment.

FIG. 29(a) is a view showing a structure of a distortion compensating capacitance circuit CAPC5 in the present fifth embodiment. The distortion compensating capacitance circuit CAPC5 in the present fifth embodiment shown in FIG. 29(a) has substantially the same structure as that of the distortion compensating capacitance circuit CAPC4 in the foregoing fourth embodiment shown in FIG. 26(a). What is different is that, in the distortion compensating capacitance circuit CAPC5 in the present fifth embodiment, one high resistance element DR is additionally coupled between the terminals A and B.

Figure 29B:
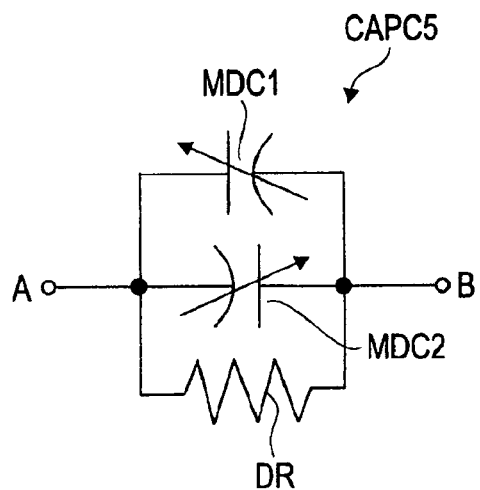
FIG. 29(b) is a view showing a circuit diagram of the distortion compensating capacitance circuit having the structure shown in FIG. 29(a)

The distortion compensating capacitance circuit CAPC5 in the present fifth embodiment is structured as described above, and a circuit diagram thereof is as shown in FIG. 29(b). FIG. 29(b) is a view showing the circuit diagram of the distortion compensating capacitance circuit CAPC5 having the structure shown in FIG. 29(a). As shown in FIG. 29(b), in the distortion compensating capacitance circuit CAPC5 in the present fifth embodiment, the MOS diode capacitance elements MDC1 and MDC2 are coupled in anti-parallel between the terminals A and B, and the high resistance element DR is coupled between the terminals A and B.

It will be understood that, since the distortion compensating capacitance circuit CAPC5 in the present fifth embodiment has substantially the same structure as that of the distortion compensating capacitance circuit CAPC4 in the foregoing fourth embodiment, the capacitance value of the distortion compensating capacitance circuit CAPC5 in the present fifth embodiment also has the voltage dependency which is symmetric, and represented by the upwardly protruding curve.

It will be understood that, thus, the voltage dependency of the distortion compensating capacitance circuit CAPC5 in the present fifth embodiment is also opposite to the voltage dependency (see FIG. 9) of the parasitic capacitance present between the source region and the drain region when the RF voltage (AC voltage) is applied. Therefore, it will be understood that, by adjusting the impurity concentrations of the semiconductor regions NR1B and NR2B serving as the lower electrodes of the MOS diode capacitance elements MDC1 and MDC2 included in the distortion compensating capacitance circuit CAPC5 as well as the widths of the electrodes EL1 and EL2 and thereby optimizing the voltage dependency of the capacitance value of the distortion compensating capacitance circuit CAPC5, it is possible to provide the distortion compensating capacitance circuit CAPC5 with the effect of cancelling out the third harmonic distortion resulting from the voltage dependency of the parasitic capacitance of the MISFET (Application of Distortion Compensating Capacitance Circuit in Fifth Embodiment to Antenna Switch)

Next, a description will be given to an example in which the distortion compensating capacitance circuit CAPC5 in the present fifth embodiment is applied to the antenna switch ASW. In the present fifth embodiment also, in terms of effectively reducing the third harmonic distortion, in the antenna switch ASW shown in FIG. 15, the distortion compensating capacitance circuit CAPC5 in the present fifth embodiment is applied to the RX through transistor TH(RX) (shown by the hatched region of FIG. 15).

Figure 30:
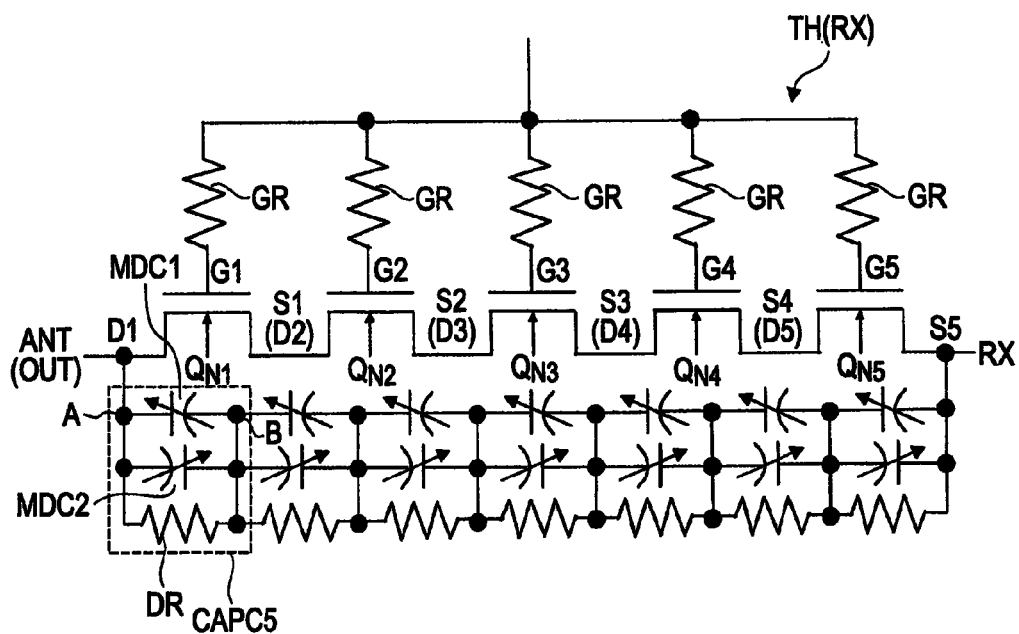
FIG. 30 is a circuit diagram showing a configuration obtained by adding the distortion compensating capacitance circuits in the fifth embodiment to the RX through transistor.

FIG. 30 is a circuit diagram showing a configuration obtained by adding the distortion compensating capacitance circuits CAPC5 in the present fifth embodiment to the RX through transistor TH(RX). As shown in FIG. 30, between the antenna terminal ANT(OUT) and the reception terminal RX, the five MISFETs $Q_{N1}$ to $Q_{N5}$ included in the RX through transistor TH(RX) are coupled in series. Specifically, the antenna terminal ANT(OUT) is coupled to the drain region D1 of the MISFET $Q_{N1}$, and the source region S1 of the MISFET $Q_{N1}$ is coupled to the drain region D2 of the MISFET $Q_{N2}$. Also, the source region S2 of the MISFET $Q_{N2}$ is coupled to the drain region D3 of the MISFET $Q_{N3}$, and the source region S3 of the MISFET $Q_{N3}$ is coupled to the drain region D4 of the MISFET $Q_{N4}$. Also, the source region S4 of the MISFET $Q_{N4}$ is coupled to the drain region D5 of the MISFET $Q_{N5}$, and the source region S5 of the MISFET $Q_{N5}$ is coupled to the reception terminal RX.

In addition, the gate electrodes G1 to G5 of the MISFETs $Q_{N1}$ to $Q_{N5}$ are coupled to each other via the gate resistances GR. Also, in the present fifth embodiment, between the antenna terminal ANT(OUT) and the reception terminal RX, the plurality of distortion compensating capacitance circuits CAPC5 are coupled in series. Specifically, in the present fifth embodiment, as shown in FIG. 30, between the antenna terminal ANT(OUT) and the reception terminal RX, the seven distortion compensating capacitance circuits CAPC5 are coupled in series. That is, in the present fifth embodiment, between the antenna terminal ANT(OUT) and the reception terminal RX, the five MISFETs $Q_{N1}$ to $Q_{N5}$ are coupled in series and, in parallel to the five MISFETs $Q_{N1}$ to $Q_{N5}$, the seven series-coupled distortion compensating capacitance circuits CAPC5 are provided.

Here, the distortion compensating capacitance circuit CAPC5 in the present fifth embodiment has the voltage dependency represented by the upwardly protruding curve. In the present fifth embodiment, between the antenna terminal ANT(OUT) and the reception terminal RX, the capacitance circuits are coupled each of which has a voltage dependency such that, in either of the cases where a positive voltage is applied to the reception terminal RX based on the potential of the antenna terminal ANT(OUT) and where a negative voltage is applied to the reception terminal RX based on the potential of the antenna terminal ANT(OUT), the capacitance decreases to a value smaller than that in a state where the potential of the antenna terminal ANT(OUT) and the potential of the reception terminal RX are at the same level. Thus, according to the present fifth embodiment, it is possible to ensure the symmetry of the voltage dependency of the distortion compensating capacitance circuit CAPC5, and allow the distortion compensating function of the distortion compensating capacitance circuit to be effectively achieved.

Also, in the RX through transistor TH(RX) of the present fifth embodiment shown in FIG. 30, between the antenna terminal ANT(OUT) and the reception terminal RX, the plurality of distortion compensating capacitance circuits CAPC5 are coupled in series. At this time, in the present fifth embodiment, to the respective distortion compensating capacitance circuits CAPC5, the high resistance elements DR are coupled. Therefore, it is possible to prevent the middle nodes located between the individual distortion compensating capacitance circuits CAPC5 from being brought into the floating state. That is, in the present fifth embodiment, it is possible to prevent charges from being accumulated in the middle nodes between the individual distortion compensating capacitance circuits CAPC5, and prevent the symmetry of the voltage dependency of the plurality of distortion compensating capacitance circuits CAPC5 as a whole inserted between the antenna terminal ANT(OUT) and the reception terminal RX from being impaired by the accumulation of the charges.

(Layout Configuration of Distortion Compensating Capacitance Circuit in Fifth Embodiment)

Figure 31:
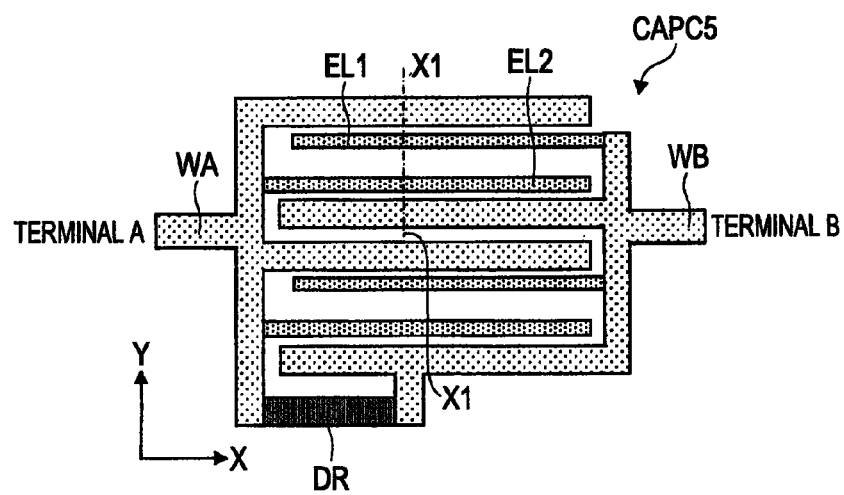
FIG. 31 is a view showing a layout configuration of the distortion compensating capacitance circuit in the fifth embodiment.

Subsequently, a description will be given to a layout configuration of the distortion compensating capacitance circuit CAPC5 in the present fifth embodiment. FIG. 31 is a view showing the layout configuration of the distortion compensating capacitance circuit CAPC5 in the present fifth embodiment. In FIG. 31, the electrodes EL1 and EL2 extend side by side in the X-direction (lateral direction) of the paper sheet with FIG. 31. Specifically, the electrodes EL1 and the electrodes EL2 are paired in one-to-one correspondence, and the plurality of pairs are arranged in the Y-direction (vertical direction), while each extending in the X-direction (lateral direction). The plurality of electrodes EL1 are bundled with the wiring line WB to be coupled to the terminal B. Likewise, the plurality of electrodes EL2 are bundled with the wiring line WA to be coupled to the terminal A. From the wiring line WA, branch lines extend in the X-direction. Likewise, from the wiring line WB also, branch lines extend in the X-direction. The branch lines branched from the wiring line WA and the branch lines branched from the wiring line WB are arranged in an interdigitating configuration. Between the branch lines branched from the wiring line WA and the branch lines branched from the wiring line WB, the electrodes EL1 and EL2 are placed. Note that the cross-sectional view along the line X1-X1 of FIG. 31 corresponds to FIG. 29(a).

Figure 32:
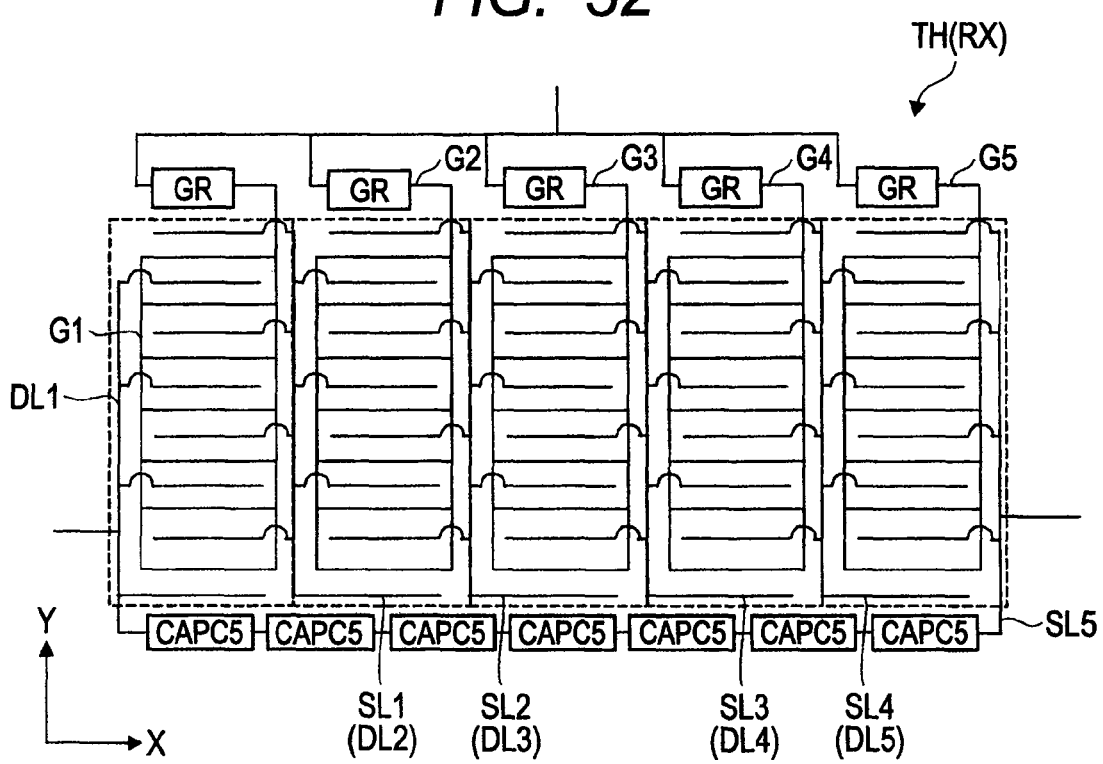
FIG. 32 is a view showing a layout configuration of the RX through transistor in the fifth embodiment.

FIG. 32 is a view showing a layout configuration of the RX through transistor TH(RX) in the present fifth embodiment. As shown in FIG. 32, the layout configuration of the RX through transistor TH(RX) in the present fifth embodiment is substantially the same as the layout configuration of the RX through transistor TH(RX) in the foregoing first embodiment shown in FIG. 20. What is different is that, in the present fifth embodiment, the seven distortion compensating capacitance circuits CAPC5 are provided in series between the drain line DL1 and the source line SL5.

(Effects of Fifth Embodiment)

The antenna switch ASW in the present fifth embodiment is configured as described above. By applying the distortion compensating capacitance circuit CAPC5 in the present fifth embodiment to the antenna switch ASW, effects as shown below can be obtained. That is, the capacitance value of the distortion compensating capacitance circuit CAPC5 in the present fifth embodiment has the voltage dependency represented by the upwardly protruding curve, in the same manner as in the foregoing first embodiment. Therefore, the third harmonic distortion generated from the distortion compensating capacitance circuit CAPC5 in the present fifth embodiment can cancel out the anti-phase third harmonic distortion resulting from the voltage dependency (voltage dependency represented by the upwardly protruding curve) of the OFF capacitance in each of the MISFETs $Q_{N1}$ to $Q_{N5}$ included in the antenna switch ASW. As a result, it is possible to reduce the absolute value of the third harmonic distortion generated from the antenna switch ASW.

In the present fifth embodiment, to achieve the effect described above, the capacitance value of the distortion compensating capacitance circuit CAPC5 and the voltage dependency thereof are set such that the third harmonic distortion generated from the distortion compensating capacitance circuit CAPC5 compensates for the third harmonic distortion generated from each of the MISFETs $Q_{N1}$ to $Q_{N5}$. Specifically, the impurity concentration of the semiconductor region NR1B shown in FIG. 29(a) is about $5 \times 10^{17}/cm^3$, and the width of each of the electrodes EL1 and EL2 is about ½0 of the gate width of each of the MISFETs $Q_{N1}$ to $Q_{N5}$.

Examples of an effect specific to the present fifth embodiment that can be considered include the following effect. That is, in the present fifth embodiment, the plurality of distortion compensating capacitance circuits CAPC5 are structured to be coupled between the antenna terminal ANT(OUT) and the reception terminal RX. This allows the number of the series-coupled stages of the distortion compensating capacitance circuits CAPC5 to be inserted between the antenna terminal ANT(OUT) and the reception terminal RX to be set independently of the number of the series-coupled stages of the MISFETs $Q_{N1}$ to $Q_{N5}$ to be provided between the antenna terminal ANT(OUT) and the reception terminal RX. As a result, the design flexibility of the antenna switch ASW to which the distortion compensating capacitance circuits CAPC5 have been added increases to allow an improvement in the accuracy of distortion compensation by each of the distortion compensating capacitance circuits CAPC5.

Sixth Embodiment

In the foregoing fourth embodiment, the description has been given to the example in which, between the respective source regions and the respective drain regions of the plurality of MISFETs $Q_{N1}$ to $Q_{N5}$ included in the RX through transistor TH(RX), the distortion compensating capacitance circuits CAPC4 are provided. In the present sixth embodiment, a description will be given to an example in which, between the respective source regions and the respective drain regions of the plurality of MISFETs $Q_{N1}$ to $Q_{N5}$, the two distortion compensating capacitance circuits CAPC5 are coupled in series.

(Application of Distortion Compensating Capacitance Circuit in Sixth Embodiment to Antenna Switch)

A description will be given to an example in which the distortion compensating capacitance circuit CAPC5 in the present sixth embodiment is applied to the antenna switch ASW. In the present sixth embodiment also, in terms of effectively reducing the third harmonic distortion, in the antenna switch ASW shown in FIG. 15, the distortion compensating capacitance circuit CAPC5 in the present sixth embodiment is applied to the RX through transistor TH(RX) (shown by the hatched region of FIG. 15).

Figure 33:
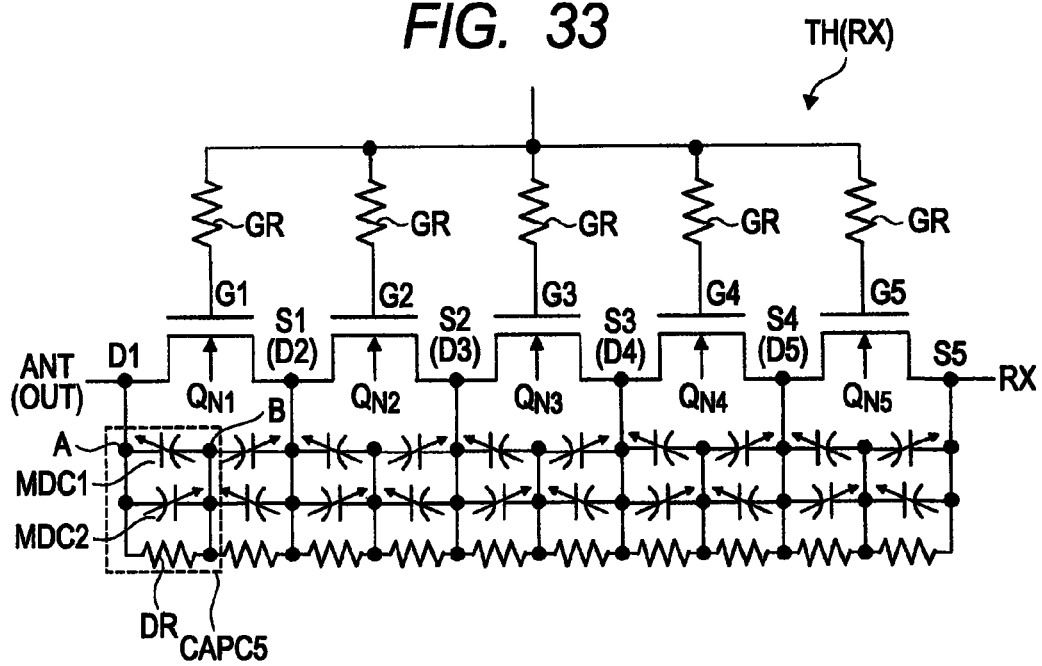
FIG. 33 is a circuit diagram showing a configuration obtained by adding the distortion compensating capacitance circuits in a sixth embodiment to the RX through transistor.

FIG. 33 is a circuit diagram showing a configuration obtained by adding the distortion compensating capacitance circuits CAPC5 in the present sixth embodiment to the RX through transistor TH(RX). As shown in FIG. 33, between the antenna terminal ANT(OUT) and the reception terminal RX, the five MISFETs $Q_{N1}$ to $Q_{N5}$ included in the RX through transistor TH(RX) are coupled in series. Specifically, the antenna terminal ANT(OUT) is coupled to the drain region D1 of the MISFET $Q_{N1}$, and the source region S1 of the MISFET $Q_{N1}$ is coupled to the drain region D2 of the MISFET $Q_{N2}$. Also, the source region S2 of the MISFET $Q_{N2}$ is coupled to the drain region D3 of the MISFET $Q_{N3}$, and the source region S3 of the MISFET $Q_{N3}$ is coupled to the drain region D4 of the MISFET Q. Also, the source region S4 of the MISFET $Q_{N4}$ is coupled to the drain region D5 of the MISFET $Q_{N5}$, and the source region S5 of the MISFET $Q_{N5}$ is coupled to the reception terminal RX.

In addition, the gate electrodes G1 to G5 of the MISFETs $Q_{N1}$ to $Q_{N5}$ are coupled to each other via the gate resistances GR. To each of the MISFETs $Q_{N1}$ to $Q_{N5}$, the two distortion compensating capacitance circuits CAPC5 are coupled in series. Specifically, between the drain region D1 and the source region S1 of the MISFET $C_{N1}$, the two distortion compensating capacitance circuits CAPC5 are coupled in series and, between the drain region D2 and the source region S2 of the MISFET $Q_{N2}$, the two distortion compensating capacitance circuits CAPC5 are coupled in series. Also, between the drain region D3 and the source region. S3 of the MISFET $Q_{N3}$, the two distortion compensating capacitance circuits CAPC5 are coupled in series and, between the drain region D4 and the source region S4 of the MISFET $Q_{N4}$, the two distortion compensating capacitance circuits CAPC5 are coupled in series. Also, between the drain region D5 and the source region S5 of the MISFET $Q_{N5}$, the two distortion compensating capacitance circuits CAPC5 are coupled in series.

(Effects of Sixth Embodiment)

The antenna switch ASW in the present sixth embodiment is configured as described above. By applying the distortion compensating capacitance circuit CAPC5 in the present sixth embodiment to the antenna switch ASW, effects as shown below can be obtained. That is, the capacitance value of the distortion compensating capacitance circuit CAPC5 in the present sixth embodiment has the voltage dependency represented by the upwardly protruding curve, in the same manner as in the foregoing first embodiment. Therefore, the third harmonic distortion generated from the distortion compensating capacitance circuit CAPC5 in the present sixth embodiment can cancel out the anti-phase third harmonic distortion resulting from the voltage dependency (voltage dependency represented by the upwardly protruding curve) of the OFF capacitance in each of the MISFETs $Q_{N1}$ to $Q_{N5}$ included in the antenna switch ASW. As a result, it is possible to reduce the absolute value of the third harmonic distortion generated from the antenna switch ASW.

In the present sixth embodiment, to achieve the effect described above, the capacitance value of the distortion compensating capacitance circuit CAPC5 and the voltage dependency thereof are set such that the third harmonic distortion generated from the distortion compensating capacitance circuit CAPC5 compensates for the third harmonic distortion generated from each of the MISFETs $Q_{N1}$ to $Q_{N5}$. Specifically, the impurity concentration of the semiconductor region NR1B shown in FIG. 29(a) is about $5 \times 10^{17}/cm^3$, and the width of each of the electrodes EL1 and EL2 is about $\frac{1}{10}$ of the gate width of each of the MISFETs $Q_{N1}$ to $Q_{N5}$.

Seventh Embodiment

In the foregoing second embodiment, the description has been given to the configuration in which, between the antenna terminal ANT(OUT) provided with the RX through transistor TH(RX) and the reception terminal RX, the plurality of distortion compensating capacitance circuits CAPC2 are coupled in series. In the present seventh embodiment, a description will be given to a configuration in which, between a part of the MISFETs included in the RX through transistor TH(RX), the plurality of distortion compensating capacitance circuits CAPC2 are coupled in series.

(Application of Distortion Compensating Capacitance Circuit in Seventh Embodiment to Antenna Switch)

Figure 34:
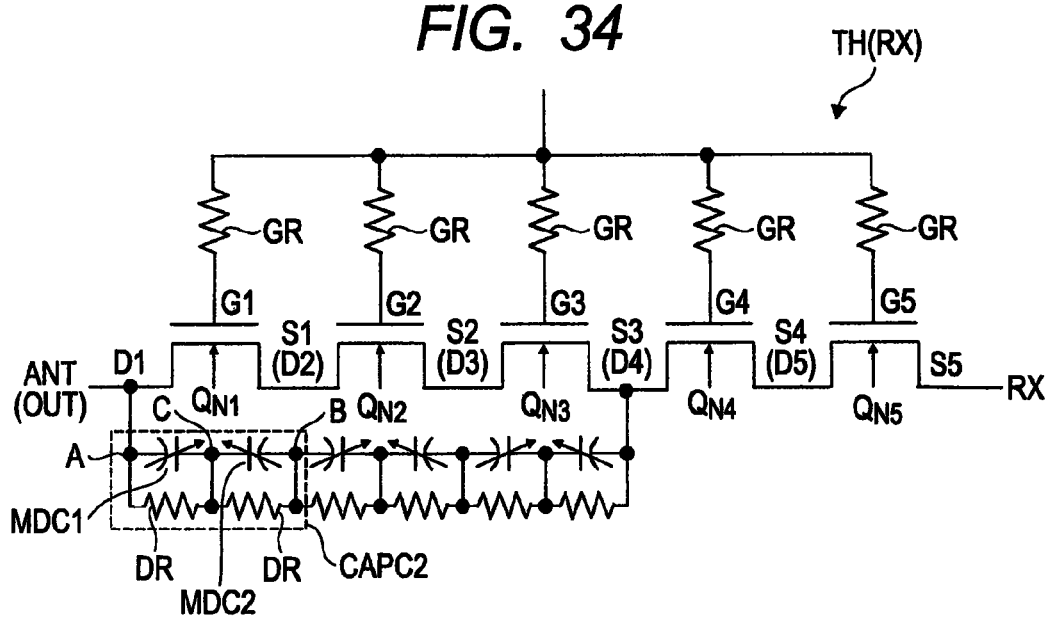
FIG. 34 is a circuit diagram showing a circuit configuration of the RX through transistor provided with the distortion compensating capacitance circuits in a seventh embodiment.

FIG. 34 is a circuit diagram showing a circuit configuration of the RX through transistor TH(RX) provided with the distortion compensating capacitance circuits CAPC2 in the present seventh embodiment. As shown in FIG. 34, between the antenna terminal ANT(OUT) and the reception terminal RX, the five MISFETs $Q_{N1}$ to $Q_{N5}$ included in the RX through transistor TH(RX) are coupled in series. Specifically, the antenna terminal ANT(OUT) is coupled to the drain region D1 of the MISFET $Q_{N1}$, and the source region S1 of the MISFET $Q_{N1}$ is coupled to the drain region D2 of the MISFET $Q_{N2}$. Also, the source region S2 of the MISFET $Q_{N2}$ is coupled to the drain region D3 of the MISFET $Q_{N3}$, and the source region S3 of the MISFET $Q_{N3}$ is coupled to the drain region D4 of the MISFET $Q_{N4}$. Also, the source region S4 of the MISFET $Q_{N4}$ is coupled to the drain region D5 of the MISFET $Q_{N5}$, and the source region S5 of the MISFET $Q_{N5}$ is coupled to the reception terminal RX.

In addition, the gate electrodes G1 to G5 of the MISFETs $Q_{N1}$ to $Q_{N5}$ are coupled to each other via the gate resistances GR. In the present seventh embodiment, between the MISFETs $Q_{N1}$ to $Q_{N3}$, the plurality of distortion compensating capacitance circuits CAPC2 are coupled in series. Specifically, in the present seventh embodiment, as shown in FIG. 34, the three distortion compensating capacitance circuits CAPC2 are coupled in series between the MISFETs $Q_{N1}$ to $Q_{N3}$. That is, in the present seventh embodiment, the five MISFETs $Q_{N1}$ to $Q_{N5}$ are coupled in series between the antenna terminal ANT(OUT) and the reception terminal RX and, in parallel to the MISFETs $Q_{N1}$ to $Q_{N3}$ of the five MISFETs $Q_{N1}$ to $Q_{N5}$, the three series-coupled distortion compensating capacitance circuits CAPC2 are provided.

Note that, in the present seventh embodiment, the description has been given to the example in which, in parallel to the MISFETs $Q_{N1}$ to $Q_{N3}$ of the five MISFETs $Q_{N1}$ to $Q_{N5}$, the plurality of series-coupled distortion compensating capacitance circuits CAPC2 are provided, but the configuration is not limited thereto. For example, it is also possible that the plurality of series-coupled distortion compensating capacitance circuits CAPC2 may be provided in parallel to the MISFETs $Q_{N1}$ and $Q_{N2}$ of the five MISFETs $Q_{N1}$ to $Q_{N5}$. Alternatively, it is also possible that the plurality of series-coupled distortion compensating capacitance circuits CAPC2 may be provided in parallel to the MISFETs $Q_{N1}$ to $Q_{N4}$ of the five MISFETs $Q_{N1}$ to $Q_{N5}$. In the present seventh embodiment, the distortion compensating capacitance circuits CAPC2 are used but, instead of the distortion compensating capacitance circuits CAPC2, the distortion compensating capacitance circuits CAPC3 to CAPC5 may also be used.

(Effects of Seventh Embodiment)

The antenna switch ASW in the present seventh embodiment is configured as described above. By applying the distortion compensating capacitance circuit CAPC2 in the present seventh embodiment to the antenna switch ASW, effects as shown below can be obtained. That is, the capacitance value of the distortion compensating capacitance circuit CAPC2 in the present seventh embodiment has the voltage dependency represented by the upwardly protruding curve, in the same manner as in the foregoing first embodiment. Therefore, the third harmonic distortion generated from the distortion compensating capacitance circuit CAPC2 in the present seventh embodiment can cancel out the anti-phase third harmonic distortion resulting from the voltage dependency (voltage dependency represented by the upwardly protruding curve) of the OFF capacitance in each of the MISFETs $Q_{N1}$ to $Q_{N5}$ included in the antenna switch ASW. As a result, it is possible to reduce the absolute value of the third harmonic distortion generated from the antenna switch ASW.

In the present seventh embodiment, to achieve the effect described above, the capacitance value of the distortion compensating capacitance circuit CAPC2 and the voltage dependency thereof are set such that the third harmonic distortion generated from the three series-coupled distortion compensating capacitance circuits CAPC2 compensates for the third harmonic distortion generated from each of the MISFETs $Q_{N1}$ to $Q_{N5}$. Specifically, the impurity concentration of the semiconductor region NR1B shown in FIG. 17(a) is about $5 \times 10^{17}/cm^3$, and the width of each of the electrodes EL1 and EL2 is about ⅛ of the gate width of each of the MISFETs $Q_{N1}$ to $Q_{N5}$.

Examples of an effect specific to the present seventh embodiment that can be considered include the following effect. That is, in the present seventh embodiment, by changing the number of the series-coupled stages of the MISFETs to be provided in parallel to the distortion compensating capacitance circuits CAPC2, it is possible to change the magnitude of the RF voltage applied to the both terminals of the distortion compensating capacitance circuits CAPC2. As a result, the design flexibility of the antenna switch ASW to which the distortion compensating capacitance circuits CAPC2 have been added increases to allow an improvement in the accuracy of distortion compensation by each of the distortion compensating capacitance circuits CAPC2.

Eighth Embodiment

In the foregoing first embodiment, the description has been given to the example in which, to the SPDT (Single Pole Double Throw) antenna switch ASW having one transmission path and one reception path, the technical idea of the present invention is applied. In the present eighth embodiment, a description will be given to an example in which the present invention is applied to a SP5T (Single Pole 5 Throw) antenna switch having two transmission paths and three reception paths. Note that, in the present eighth embodiment, the description will be given using the SD5T antenna as an example, but the technical idea of the present invention is not limited thereto, and is widely applicable to a SPnT antenna switch.

In recent years, to mobile phones, not only a verbal communication function, but also various application functions have been added. That is, functions other than the verbal communication function, such as viewing and listening of delivered music, moving image transmission, and data transfer each using a mobile phone, have been added to mobile phones. With such multi-functionalization of mobile phones, a large number of frequency bands and modulation methods are assumedly present in individual countries around the world. Accordingly, mobile phones include ones which are compatible with transmission/reception signals compatible with a plurality of different frequency bands and different modulation methods.

Figure 35:
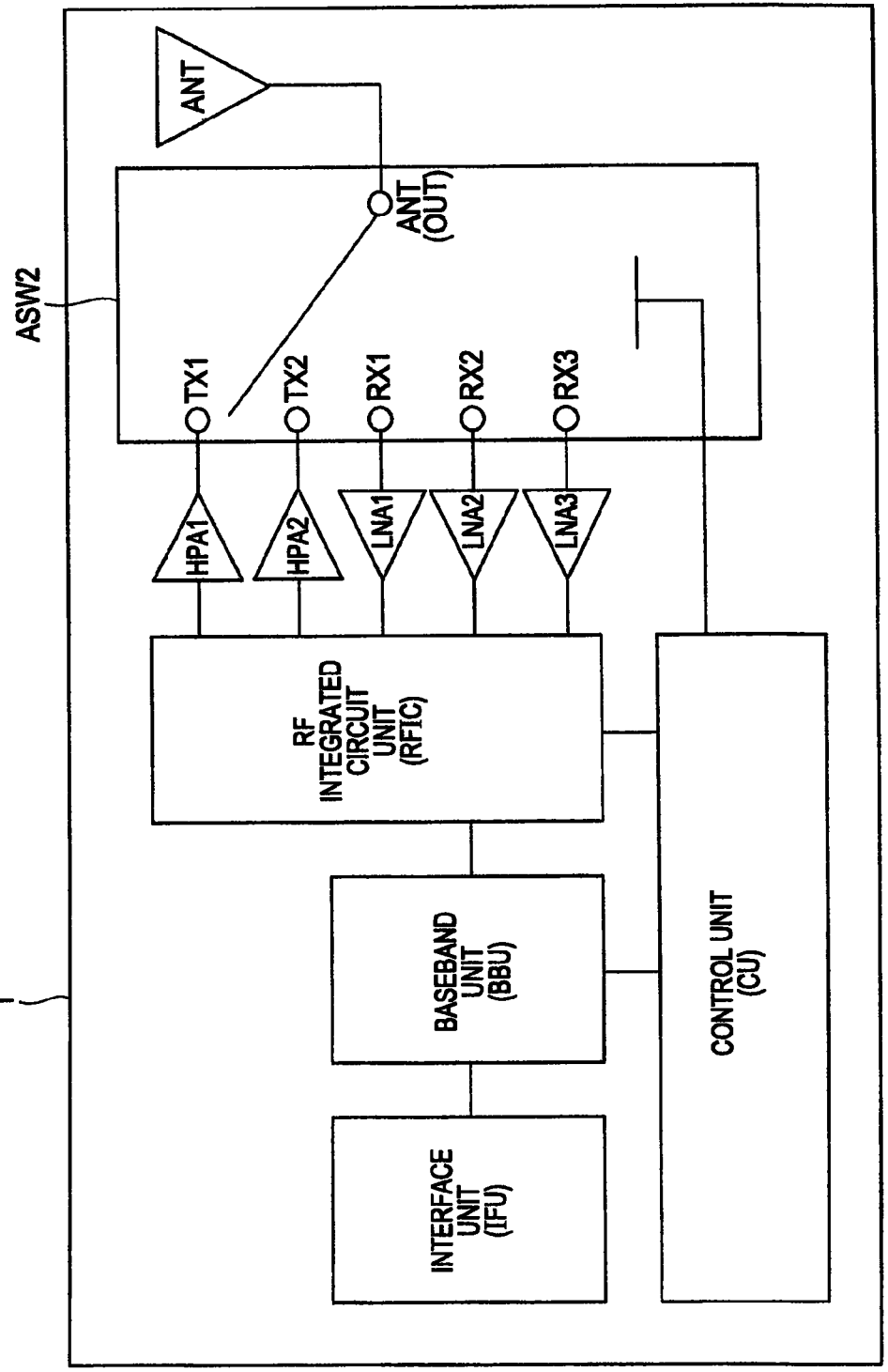
FIG. 35 is a block diagram showing a structure of a mobile phone which transmits/receives dual band signals.

FIG. 35 is a block diagram showing a structure of, e.g., a mobile phone 1 which transmits/receives dual band signals. The structure of the mobile phone 1 shown in FIG. 35 is substantially the same as the basic structure of the mobile phone 1 shown in FIG. 1. What is different is that, to transmit/receive signals in a plurality of different frequency bands, respective power amplifiers and low noise amplifiers are provided in correspondence to the signals in the individual frequency bands. Examples of the signals in the plurality of different frequency bands include a signal in a first frequency band and a signal in a second frequency band. As the signal in the first frequency band, a signal using a GSM (Global System for Mobile Communication) system can be mentioned, which uses a GSM low frequency band of 824 MHz to 915 MHz. On the other hand, as the signal in the second frequency band, a signal using the GSM (Global System for Mobile Communication) system can be mentioned, which uses a GSM high frequency band of 1710 MHz to 1910 MHz.

In the mobile phone 1 shown in FIG. 35, an interface unit IFU, a baseband unit BBU, an RF integrated circuit unit RFIC, and a control unit CU are configured to be capable of signal processing of the signal in the first frequency band and the signal in the second frequency band. In addition, in correspondence to a transmission signal in the first frequency band, a power amplifier HPA1 is provided and, in correspondence to a transmission signal in the second frequency band, a power amplifier HPA2 is provided. Moreover, in correspondence to reception signals in the plurality of different frequency bands, respective low noise amplifiers LNA1 to LNA3 are provided. That is in the dual-band mobile phone 1 shown in FIG. 35, two transmission paths and three reception paths are present in correspondence to signals in the plurality of different frequency bands.

Accordingly, in an antenna switch ASW2, five switching terminals are present. That is, in correspondence to the transmission signal in the first frequency band, a transmission terminal TX1 is provided and, in correspondence to the transmission signal in the second frequency band, a transmission terminal TX2 is provided. In addition, in correspondence to the reception signals in the plurality of different frequency bands, reception terminals RX1 to RX3 are provided. Thus, in the antenna switch ASW2, the five switching terminals are present, and the switching of the terminals is controlled by the control unit CU.

For example, the SPDT antenna switch ASW shown in FIG. 1 has the one transmission path and the one reception path. In the SPDT antenna switch ASW, when a transmission signal is transmitted, the TX through transistor TH(TX) provided in the transmission path is turned on, while the RX through transistor TH(RX) provided in the reception path is turned off. That is, when the transmission signal is transmitted, the transmission path is brought into a conductive state, while the reception path is brought into a non-conductive state. At this time, the third harmonic distortion is generated from a transistor in the OFF state which is the main generation source thereof so that, from the RX through transistor TH(RX) in the reception path which is non-conductive, the third harmonic distortion is mainly generated.

On the other hand, the SP5T antenna switch ASW2 shown in FIG. 35 has the two transmission paths and the three reception paths. Accordingly, when a transmission signal is transmitted from one of the transmission paths, the other transmission path and the three reception paths are brought into the non-conductive state. That is, in the SP5T antenna switch ASW2, when the transmission signal is transmitted from one of the transmission paths, it follows that transistors provided in the other four paths (the other transmission path and the three reception paths) are in the OFF state. This means that, in contrast to the SPDT antenna switch ASW in which the non-conductive path is one, in the SP5T antenna switch ASW2, there are the four non-conductive paths. As a result, in the SPDT antenna switch ASW, the main generation source of the third harmonic distortion is the OFF-state transistor provided in the one non-conductive path. On the other hand, in the SP5T antenna switch ASW2, the main generation sources of the third harmonic distortion are the OFF-state transistors provided in the four non-conductive paths. Therefore, it can be considered that, in the SP5T antenna switch ASW2, the third harmonic distortion is generated in a larger amount than in the SPDT antenna switch ASW. From the foregoing, it can be considered that, in the SP5T antenna switch ASW2, there is a great need to reduce the third harmonic distortion, and it is useful to apply the technical idea of the present invention to the SP5T antenna switch ASW2.

Figure 36:
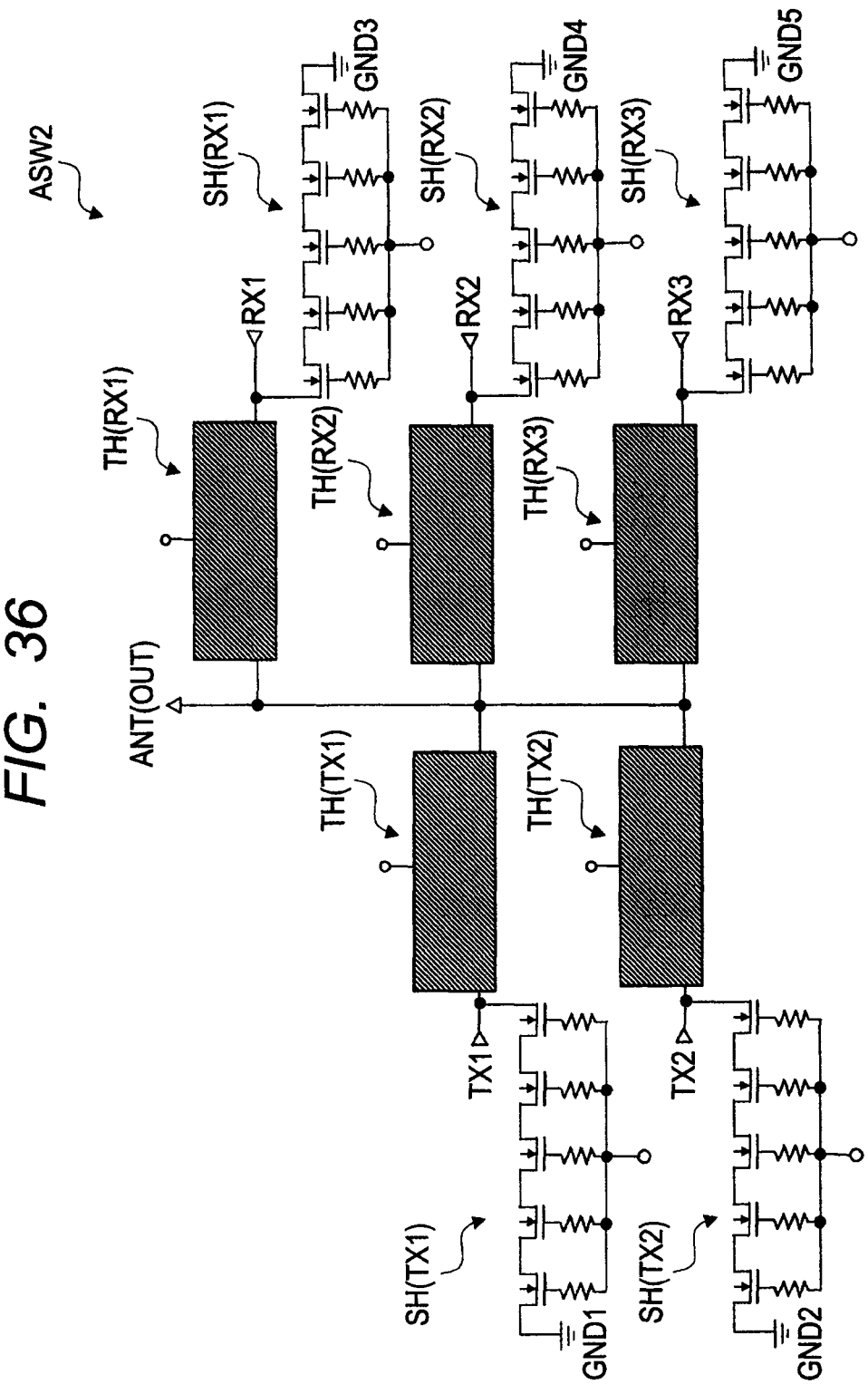
FIG. 36 is a view showing a circuit configuration of an antenna switch in an eighth embodiment.

Hereinbelow, a description will be given to an example in which the distortion compensating capacitance circuit according to the present invention is applied to the SP5T antenna switch ASW2. FIG. 36 is a view showing a circuit configuration of the antenna switch ASW2 in the present eighth embodiment. As shown in FIG. 36, the antenna switch ASW2 in the present eighth embodiment has the antenna terminal ANT(OUT), the two transmission terminals TX1 and TX2, and the three reception terminals RX1 to RX3.

Between the antenna terminal ANT(OUT) and the transmission terminal TX1, a TX through transistor TH(TX1) is provided and, between the transmission terminal TX1 and the GND terminal GND1, a TX shunt transistor SH(TX1) is provided. Also, between the antenna terminal ANT(OUT) and the transmission terminal TX2, a TX through transistor TH(TX2) is provided and, between the transmission terminal TX2 and the GND terminal GND2, a TX shunt transistor SH(TX2) is provided.

On the other hand, between the antenna terminal ANT (OUT) and the reception terminal RX1, a RX through transistor TH(RX1) is provided and, between the reception terminal RX1 and a GND terminal GND3, a RX shunt transistor SH(RX1) is provided. Likewise, between the antenna terminal ANT(OUT) and the reception terminal RX2, a RX through transistor TH(RX2) is provided and, between the reception terminal RX2 and a GND terminal GND4, a RX shunt transistor SH(RX2) is provided. Also, between the antenna terminal ANT(OUT) and the reception terminal RX3, a RX through transistor TH(RX3) is provided and, between the reception terminal RX3 and a GND terminal GND5, a RX shunt transistor SH(RX3) is provided.

In the TX through transistors TH(TX1) and TH(TX2) and the RX through transistors TH(RX1) to TH(RX3) shown by the hatched regions of FIG. 36, for example, the distortion compensating capacitance circuits CAPC2 to CAPC5 described in the foregoing first to seventh embodiments are provided. Therefore, in either of the cases where a first transmission signal is transmitted from the transmission terminal TX1 and where a second transmission signal is transmitted from the transmission terminal TX2, the third harmonic distortion generated from the OFF-state through transistors can be reduced.

In the present eighth embodiment, the SP5T antenna switch ASW2 is designed such that, when the TX through transistor TH(TX1) is brought into the ON state to transmit the first transmission signal from the transmission terminal TX1, the third harmonic distortion resulting from the voltage dependency of the parasitic capacitance of each of the TX through transistor TH(TX2) and the RX through transistors TH(RX1) to TH(RX3) which are in the OFF state is compensated for (cancelled out) by the distortion compensating capacitance circuits (distortion compensating capacitance circuits CAPC2 to CAPC5 in the foregoing first to seventh embodiments) added thereto. The SP5T antenna switch ASW2 is also designed such that, likewise, when the TX through transistor TH(TX2) is brought into the ON state to transmit the second transmission signal from the transmission terminal TX2, the third harmonic distortion resulting from the voltage dependency of the parasitic capacitance of each of the TX through transistor TH(TX1) and the RX through transistors TH(RX1) to TH(RX3) which are in the OFF state is compensated for (cancelled out) by the distortion compensating capacitance circuits (distortion compensating capacitance circuits CAPC2 to CAPC5 in the foregoing first to seventh embodiments) added thereto.

In each of these distortion compensating capacitance circuits, for example, the impurity concentration of each of the semiconductor regions NR1B and NR2B shown in FIG. 17(a) is about $5 \times 10^{17}/cm^3$, and the width of each of the electrodes EL1 and EL2 is about ⅒ of the gate width of each of the MISFETs $Q_{N1}$ to Q. Thus, in the SP5T antenna switch ASW2 in the present eighth embodiment also, in the same manner as in the SPDT antenna switch ASW described in each of the foregoing first to seventh embodiments, the effect of allowing a reduction in third harmonic distortion can be obtained.

Ninth Embodiment

In the foregoing eighth embodiment, the description has been given to the example in which the distortion compensating capacitance circuits are added to the TX through transistors TH(TX1) and TH(TX2) and the RX through transistors TH(RX1) to TH(RX3). In the present ninth embodiment, a description will be given to an example in which the distortion compensating capacitance circuits are added only to the RX through transistors TH(RX1) to TH(RX3).

Figure 37:
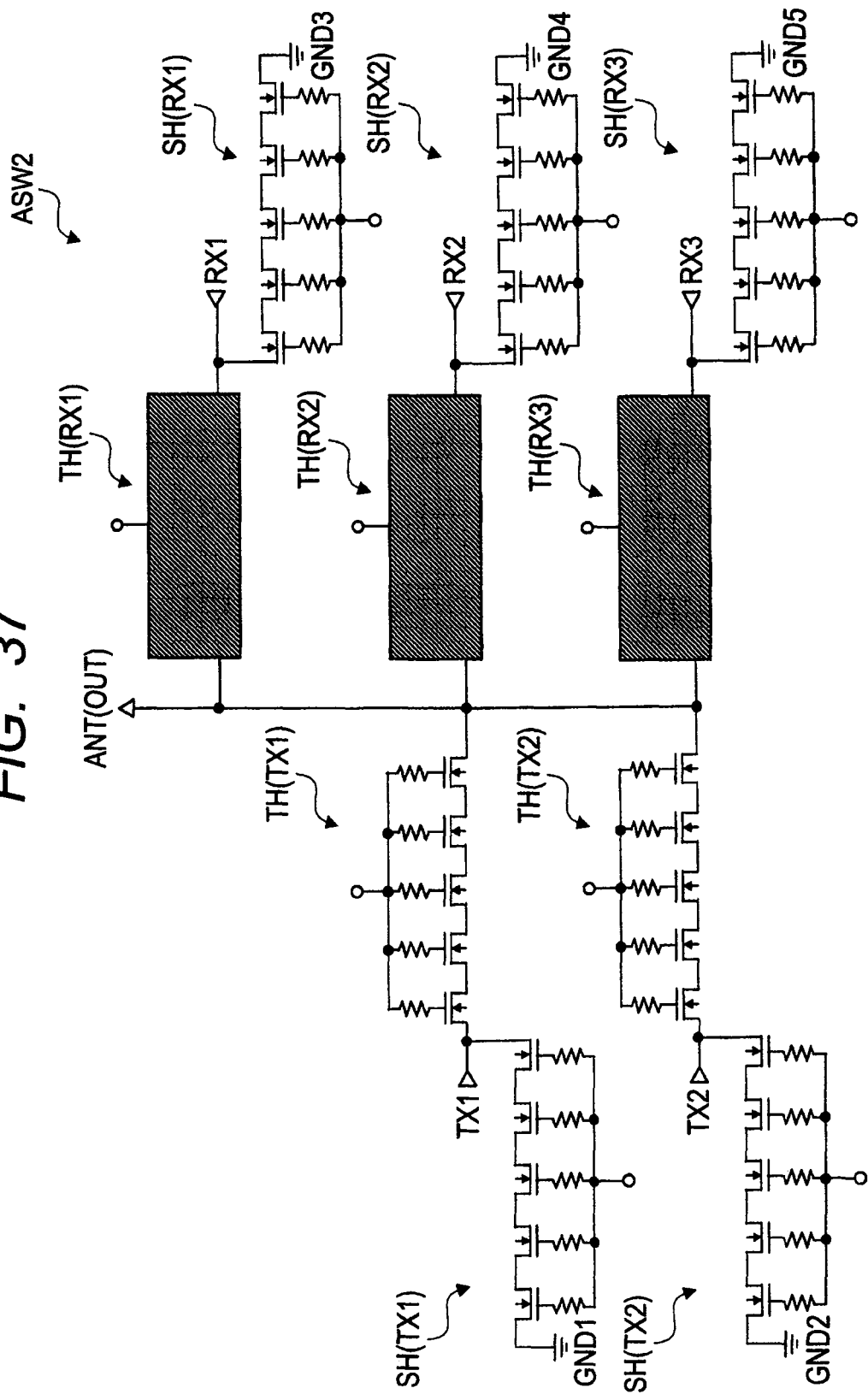
FIG. 37 is a view showing a circuit configuration of the antenna switch in a ninth embodiment.

FIG. 37 is a view showing a circuit configuration of the antenna switch ASW2 in the present ninth embodiment. As shown in FIG. 37, the antenna switch ASW2 in the present ninth embodiment has the antenna terminal ANT(OUT), the two transmission terminals TX1 and TX2, and the three reception terminals RX1 to RX3.

Between the antenna terminal ANT(OUT) and the transmission terminal TX1, the TX through transistor TH(TX1) is provided and, between the transmission terminal TX1 and the GND terminal GND1, the TX shunt transistor SH(TX1) is provided. Also, between the antenna terminal ANT(OUT) and the transmission terminal TX2, the TX through transistor TH(TX2) is provided and, between the transmission terminal TX2 and the GND terminal GND2, the TX shunt transistor SH(TX2) is provided.

On the other hand, between the antenna terminal ANT (OUT) and the reception terminal RX1, the RX through transistor TH(RX1) is provided and, between the reception terminal RX1 and the GND terminal GND3, the RX shunt transistor SH(RX1) is provided. Likewise, between the antenna terminal ANT(OUT) and the reception terminal RX2, the RX through transistor TH(RX2) is provided and, between the reception terminal RX2 and the GND terminal GND4, the RX shunt transistor SH(RX2) is provided. Also, between the antenna terminal ANT(OUT) and the reception terminal RX3, the RX through transistor TH(RX3) is provided and, between the reception terminal RX3 and the GND terminal GND5, the RX shunt transistor SH(RX3) is provided.

Only in the RX through transistors TH(RX1) to TH(RX3) shown by the hatched regions of FIG. 37, for example, the distortion compensating capacitance circuits CAPC2 to CAPC5 described in the foregoing first to seventh embodiments are provided.

In the present ninth embodiment, the SP5T antenna switch ASW2 is designed such that, when the TX through transistor TH(TX1) is brought into the ON state to transmit the first transmission signal from the transmission terminal TX1, the total third harmonic distortion resulting from the voltage dependency of the parasitic capacitance of each of the TX through transistor TH(TX2) and the RX through transistors TH(RX1) to TH(RX3) which are in the OFF state is compensated for (cancelled out) by the distortion compensating capacitance circuits (distortion compensating capacitance circuits CAPC2 to CAPC5 in the foregoing first to seventh embodiments) added to the RX through transistors TH(RX1) to TH(RX3). The SP5T antenna switch ASW2 is also designed such that, likewise, when the TX through transistor TH(TX2) is brought into the ON state to transmit the second transmission signal from the transmission terminal TX2, the total third harmonic distortion resulting from the voltage dependency of the parasitic capacitance of each of the TX through transistor TH(TX1) and the RX through transistors TH(RX1) to TH(RX3) which are in the OFF state is compensated for (cancelled out) by the distortion compensating capacitance circuits (distortion compensating capacitance circuits CAPC2 to CAPC5 in the foregoing first to seventh embodiments) added to the RX through transistors TH(RX1) to TH(RX3).

In each of these distortion compensating capacitance circuits, for example, the impurity concentration of each of the semiconductor regions NR1B and NR2B shown in FIG. 17($a$) is about $5 \times 10^{17}/cm^3$, and the width of each of the electrodes EL1 and EL2 is about ⅕ of the gate width of each of the MISFETs $Q_{N1}$ to $Q_{N5}$. Thus, in the SP5T antenna switch ASW2 in the present ninth embodiment also, in the same manner as in the SPDT antenna switch ASW described in each of the foregoing first to seventh embodiments, the effect of allowing a reduction in third harmonic distortion can be obtained.

In addition, in the present ninth embodiment, the distortion compensating capacitance circuits can be collectively provided only in the RX through transistors TH(RX1) to TH(RX3). This allows a reduction in the area occupied by the antenna switch ASW2.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

The present invention can be used widely in a manufacturing industry for manufacturing semiconductor devices.

What is claimed is:

1. A semiconductor device, comprising:
an antenna switch having a transmission terminal, an antenna terminal, and a reception terminal,
wherein the antenna switch is a semiconductor device having:
(a) a plurality of first field effect transistors coupled in series between the transmission terminal and the antenna terminal; and
(b) a plurality of second field effect transistors coupled in series between the reception terminal and the antenna terminal, and
wherein, between a source region and a drain region of each of the second field effect transistors coupled in series, a capacitance circuit is coupled which has a voltage dependency such that, in either of cases where a positive voltage is applied to the drain region based on a potential of the source region and where a negative voltage is applied to the drain region based on the potential of the source region, a capacitance decreases to a value smaller than that in a state where the potential of the source region and a potential of the drain region are at the same level,
wherein the capacitance circuit comprises a first MOS diode capacitance element and a second MOS diode capacitance element which are formed over a SOI substrate including a support substrate, a buried insulating layer formed over the support substrate, and a semiconductor layer formed over the buried insulating layer,
wherein the first MOS diode capacitance element has:
(c1) a first semiconductor region of a first conductivity type formed in the semiconductor layer;
(c2) a first capacitance insulating film formed over the first semiconductor region; and
(c3) a first electrode formed over the first capacitance insulating film,
wherein the second MOS diode capacitance element has:
(d1) a second semiconductor region of the first conductivity type formed in the semiconductor layer;
(d2) a second capacitance insulating film formed over the second semiconductor region; and
(d3) a second electrode formed over the second capacitance insulating film, and
wherein the capacitance circuit includes a first terminal electrically coupled to the first semiconductor region of the first MOS diode capacitance element, and a second terminal electrically coupled to the second semiconductor region of the second MOS diode capacitance element, and has a configuration in which the first electrode of the first MOS diode capacitance element is electrically coupled to the second electrode of the second MOS diode capacitance element.

2. The semiconductor device according to claim 1,
wherein the capacitance circuit further has a first resistance element provided between the first terminal and the first electrode, and a second resistance element provided between the second terminal and the second electrode, and
wherein a resistance value of the first resistance element is the same as a resistance value of the second resistance element.

* * * * *